(12) United States Patent
Nysen

(10) Patent No.: US 6,580,358 B1
(45) Date of Patent: Jun. 17, 2003

(54) DUAL MODE TRANSMITTER-RECEIVER AND DECODER FOR RF TRANSPONDER TAGS

(75) Inventor: Paul A. Nysen, Sunnyvale, CA (US)

(73) Assignee: X-Cyte, Inc., San Jose, CA (US)

( * ) Notice: Subject to any disclaimer, the term of this patent is extended or adjusted under 35 U.S.C. 154(b) by 0 days.

(21) Appl. No.: 10/150,849

(22) Filed: May 17, 2002

Related U.S. Application Data

(63) Continuation of application No. 09/641,649, filed on Aug. 18, 2000, now Pat. No. 6,433,671, which is a continuation of application No. 08/914,285, filed on Aug. 18, 1997, now Pat. No. 6,107,910.
(60) Provisional application No. 60/033,212, filed on Nov. 29, 1996.

(51) Int. Cl.[7] .................................................. H04Q 5/22
(52) U.S. Cl. .................. 340/10.41; 340/10.1; 340/10.3; 340/10.4; 340/10.42; 340/10.51; 342/42; 342/44; 342/51
(58) Field of Search ............................ 340/10.41, 10.1, 340/10.3, 10.4, 10.42, 10.51; 342/42, 44, 51

(56) References Cited

U.S. PATENT DOCUMENTS 5,649,295 A * 7/1997 Shober et al. ............. 340/10.1

* cited by examiner

Primary Examiner—Michael Horabik
Assistant Examiner—Yves Dalencourt
(74) Attorney, Agent, or Firm—Milde & Hoffberg LLP

(57) ABSTRACT

An enhanced backscatter RF-ID tag reader system and multiprotocol RF tag reader system is provided. In a multiprotocol mode, the system emits a non-stationary interrogation signal, and decodes a phase modulated backscatter signal by detecting a stronger phase component from quadrature phase representations or determining phase transition edges in a phase of a received signal. The RF tag reader system predicts or follows the phase of the backscatter signal, thereby avoiding interference from nulls in the received signal waveform due to the non-stationary interrogation signal, relative movement or environmental effects. An acoustic RF-ID tag detection system detects the reradiated signal corresponding to respective transformation of a signal in the tag. Detection of either type of RF-ID tags therefore is possible, and the absence of any tag or absence of any valid tag also determined.

12 Claims, 41 Drawing Sheets

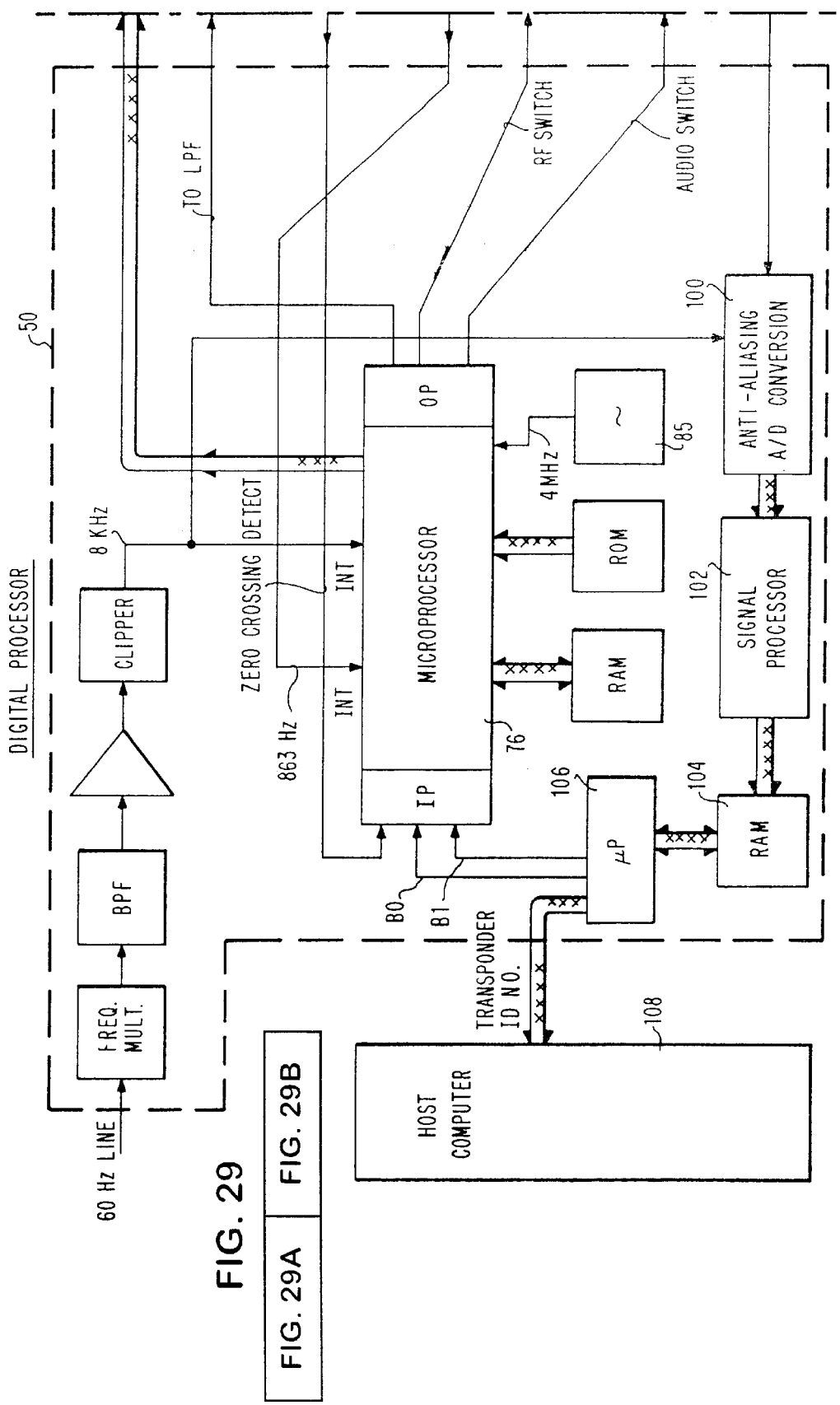

DUAL MODE TRANSMITTER-RECEIVER AND DECODER FOR RF TRANSPONDER TAGS

The present application is a Continuation of U.S. patent application Ser. No. 09/641,649 filed on Aug. 18, 2000 now U.S. Pat. No. 6,433,671, which is a Continuation of U.S. patent application Ser. No. 08/914,285 filed Aug. 18, 1997, now U.S. Pat. No. 6,017,910, which claims benefit of priority from U.S. Provisional Patent Application No. 60/033,212, filed Nov. 29, 1996.

FIELD OF THE INVENTION

The present invention relates to an RF-ID receiver system which is compatible with both surface acoustic wave and semiconductor memory based RF-ID tags, thereby allowing multiple RF-ID tag type environments to exist.

BACKGROUND OF THE INVENTION

A number of different schemes are known for encoding, transmitting and decoding identification signals from RF-ID tags. However, these schemes are generally incompatible, therefore requiring proprietary readers to accept encoded transmissions from tags of the same vendor. Even where the transmission scheme is not proprietary, there is no standardization in the various RF-ID applications.

These RF-ID tags comprise, at a minimum, an antenna and a signal transforming device, some known devices are very complex. There are two particular types of passive RE-ID tags which are used. A first type includes an electronic circuit, e.g., CMOS, to store digital ID data which is then modulated onto a received signal by means of an RF circuit, e.g., a GaAs MESFET, transistor or controlled diode. Power for the data storage and modulating circuit may be derived from an interrogating RF beam or another power source, and power for the transmission itself is also derived from the beam. In this type of system, the interrogating RF beam is generally of fixed frequency, with the resulting modulated signal at the same or a different frequency, with AM, FM, PSK, QAM or another known modulation scheme employed. In order to provide separation between the received and transmitted signals, the modulated output may be, for example, a harmonic of the interrogating RF beam. Such a system is disclosed in U.S. Pat. No. 4,739,328, expressly incorporated herein by reference.

A know RF-ID interrogation system provides an interrogation signal which incorporates phase diversity, i.e., a phase which periodically switches between 0° and 90° so that a null condition is not maintained for a period which would prevent RF-ID tag readout with a homodyne receiver. See, U.S. Pat. No. 3,984,835, incorporated herein by reference.

Likewise, a known system, described in U.S. Pat. No. 4,888,591, incorporated herein by reference, provides a semiconductor memory tag which is interrogated with a direct sequence spread spectrum signal, which allows discrimination of received signals based on signal return delay. By employing a direct sequence spread spectrum having a decreasing correlation of a return signal with the interrogation signal as delay increases, more distant signals may be selectively filtered. This system employs a homodyne detection technique with a dual balanced mixer.

A second type of RF-ID tag includes a surface acoustic wave device, in which an identification code is provided as a characteristic time-domain reflection pattern in a retransmitted signal, in a system which generally requires that the signal emitted from an exciting antenna be non-stationary with respect to a signal received from the tag. This ensures that the reflected signal pattern is distinguished from the emitted signal. In such a device, received RF energy, possibly with harmonic conversion, is emitted onto a piezoelectric substrate as an acoustic wave with a first interdigital electrode system, from whence it travels through the substrate, interacting with reflector elements in the path of the wave, and a portion of the acoustic wave is ultimately received by the interdigital electrode system and retransmitted. These devices do not require a semiconductor memory. The propagation velocity of an acoustic wave in a surface acoustic wave device is slow as compared to the free space propagation velocity of a radio wave. Thus, assuming that the time for transmission between the radio frequency interrogation system is short as compared to the acoustic delay, the interrogation frequency should change such that a return signal having a minimum delay may be distinguished, and the interrogation frequency should not return to that frequency for a period longer than the maximum acoustic delay period. Generally, such systems are interrogated with a pulse transmitter or chirp frequency system.

Systems for interrogating a passive transponder employing acoustic wave devices, carrying amplitude and/or phase-encoded information are disclosed in, for example. U.S. Pat. Nos. 4,059,831; 4,484,160; 4,604,623; 4,605,929; 4,620,191; 4,623,890; 4,625,207; 4,625,208; 4,703,327; 4,724,443; 4,725,841; 4,734,698; 4,737,789; 4,737,790; 4,951,057; 5,095,240; and 5,182,570, expressly incorporated herein by reference. The tags interact with an interrogator/receiver apparatus which transmits a first signal to, and receives a second signal from the remote transponder, generally as a radio wave signal. The transponder thus modifies the interrogation signal and emits encoded information which is received by the interrogator/receiver apparatus.

Because the encoded information normally includes an identification code which is unique or quasi-unique to each transponder, and because the transponders of this type are relatively light weight and small and may be easily attached to other objects to be identified, the transponders are sometimes referred to as "labels" or "tags". The entire system, including the interrogator/receiver apparatus and one or more transponders, which may be active or passive, is therefore often referred to as a "Passive interrogator label system" or "PILS".

Other passive interrogator label systems are disclosed in the U.S. Pat. Nos. 3,273,146; 3,706,094; 3,755,803; and 4,058,217.

In its simplest form, the systems disclosed in these patents include a radio frequency transmitter capable of transmitting RF pulses of electromagnetic energy. These pulses are received at the antenna of a passive transponder and applied to a piezoelectric "launch" transducer adapted to convert the electrical energy received from the antenna into acoustic wave energy in the piezoelectric material. Upon receipt of a pulse, an acoustic wave is generated within the piezoelectric material and transmitted along a defined acoustic path. This acoustic wave may be modified along its path, such as by reflection, attenuation, variable delay, and interaction with other transducers.

When an acoustic wave pulse is reconverted into an electrical signal it is supplied to an antenna on the transponder and transmitted as RF electromagnetic energy. This energy is received at a receiver and decoder, preferably at the same location as the interrogating transmitter, and the information contained in this response to an interrogation is decoded. The tag typically has but a single antenna, used for both receiving the interrogation pulse and emitting an information bearing signal.

In general, a passive interrogator label system includes an "interrogator" for transmitting a first radio frequency signal; at least one transponder which receives this first signal, processes it and sends back a second radio frequency signal containing encoded information; and a receiver, normally positioned proximate to or integrated with the interrogator, for receiving the second signal and decoding the transponder-encoded information.

Known technologies allow separate interrogation systems to operate in close proximity, for example by employing directional antennas and employing encoded transmissions, such as a direct sequence spread spectrum signal, which has reduced self-correlation as relative delay increases, thus differentiating more distant signals.

In known passive transponder systems, the encoded information is retrieved by a single interrogation cycle, representing the state of the tag, or obtained as an inherent temporal signature of an emitted signal due to internal time delays.

In the acoustic wave tags described above, the interrogator transmits a first signal having a first frequency that successively assumes a plurality of frequency values within a prescribed frequency range. This hist frequency may, for example, be in the range of 905–925 MHz, referred to herein as the nominal 915 Mz band, a frequency band that may be available. The response of the tag to excitation at any given frequency is distinguishable from the response at other frequencies. Further, because the frequency changes over time, the received response of the tag, delayed due to the internal structures, man be at a different frequency than the simultaneously emitted signal, thus reducing interference.

Passive transponder encoding schemes include control over interrogation signal transfer function H(s), including the delay functions f(z). These functions therefore typically generate a return signal in the same band as the interrogation signal. Since the return signal is mixed with the interrogation signal, the difference between the two will generally define the information signal, along with possible interference and noise. By controlling the rate of change of the interrogation signal frequency with respect to a maximum round trip propagation delay, including internal delay, as well as possible Doppler shift, the maximum bandwidth of the demodulated signal may be controlled.

The following references are hereby expressly incorporated by reference for their disclosure of RF modulation techniques, transponder systems, information encoding schemes, transponder antenna and transitive systems, excitation/interrogation systems, and applications of such systems: U.S. Pat. Nos. 2,193,102; 2,602,160; 2,774,060; 2,943,189; 2,986,631; 3,025,516; 3,090,042; 3,206,746; 3,270,338; 3,283,260; 3,379,992; 3,412,334; 3,480,951; 3,480,952; 3,500,399; 3,518,415; 3,566,315; 3,602,881; 3,631,484; 3,632,876; 3,699,479; 3,713,148; 3,718,899; 3,728,632; 3,754,250; 3,798,641; 3,798,642; 3,801,911; 3,839,717; 3,859,624; 3,378,528; 3,887,925; 3,914,762; 3,927,389; 3,938,146; 3,944,928; 3,964,024; 3,980,960; 3,984,835; 4,001,834; 4,019,181; 4,038,653; 4,042,906; 4,067,016; 4,068,211; 4,068,232; 4,069,472; 4,075,632; 4,086,504; 4,114,151; 4,123,754; 4,135,191; 4,169,264; 4,197,502; 4,207,518; 4,209,785; 4,218,680; 4,242,661; 4,287,596; 4,298,878; 4,303,904; 4,313,118; 4,322,686; 4,328,495; 4,333,078; 4,338,587; 4,345,253; 4,358,765; 4,360,810; 4,364,043; 4,370,653; 4,370,653; 4,388,524; 4,390,880; 4,471,216; 4,472,717; 4,473,851; 4,498,085; 4,546,241; 4,549,075; 4,550,444; 4,551,725; 4,555,618; 4,573,056; 4,599,736; 4,604,622; 4,605,012; 4,617,677; 4,627,075; 4,641,374; 4,647,849; 4,654,512; 4,658,263; 4,739,328; 4,740,792; 4,759,063; 4,782,345; 4,786,907; 4,791,283; 4,795,898; 4,798,322; 4,799,059; 4,816,839; 4,835,377; 4,849,615; 4,853,705; 4,864,158; 4,870,419; 4,870,604; 4,877,501; 4,885,591; 4,912,471; 4,926,480; 4,937,581; 4,951,049; 4,955,038; 4,999,636; 5,030,807; 5,055,659; 5,086,389; 5,109,152; 5,131,039; 5,144,553; 5,163,098; 5,193,114; 5,193,210; 5,310,999; 5,479,160; and 5,485,520. In addition, foreign patents CH346388; DE1295424; DE2926836; DE969289; EP0207020; FR2260115; GB1130050; GB1168509; GB1187130; GB2103408; GB2247096; GB774797; GB987868; JP0138447; JP0189467; JP116054; JP5927278; and NE1566716, as well as the following references: "IBM Technical Disclosure Bulletin", (vol. 20, No. 7; 12/77), pp. 2525–2526.; "IEEE Transactions on Vehicular Technology", (vol. VT-26, No. 1), 2/77; p. 35.; A. R. Koelle et al. "Short-Range Radio-Telemetry for Electronic Identification using Modulated RF Backscatter", by A. (Proc. of IEEE, 8/75; pp. 1260–1261).; Baldwin et al., "Electronic Animal . . . Monitoring", 1973.; Electronic Letters, December 1975, vol. 11, pp.642–643.; Encyclopedia. of Science and Technology; vol. 8, pp. 644–647 (1982).; Federal Information Processing Standards Publication 4A, Jan. 15, 1977, Specifications for the Data Encryption Standard.; IEEE Transactions, Henoch et al., vol. MTTT-19, No. 1, January 1971.; IEEE Transactions, Jaffe et al., pp. 371–378, May 1965.; IRE Transactions, Harrington, pp. 165–174, May 1962.; IRE Transactions, Rutz, pp. 158–161, March 1961.; J. Lenk, Handbook of Microprocessors, Microcomputers and Minicomputers; p. 51 (1979).; Koelle et al., "Electronic Identification . . . Monitoring", 7/73 to 6/74, pp. 1–5.; P. Lorrain et al., EM Fields and Waves; Appendix A, (1970).; Proceedings of IRE, March 1961, pp. 634–635.; R. Graf, Dictionary of Electronics; p. 386, (1974).; RCA Review, vol. 34, 12/73, Kensch et al., pp. 566–579.; RCA Review, Sterzer, 6/74, vol. 35, pp. 167–175.; Reports on Research September–October 1977, vol. 5, No. 2. each of which is expressly incorporated herein by reference.

SUMMARY OF OBJECTS OF THE INVENTION

The present invention provides a system providing a non-stationary radio frequency emission and a receiver system capable of resolving both delay modulation tags, e.g., surface acoustic wave tags, and state machine tags, e.g., semiconductor-based memory tags. The receiver must therefore determine a type of tag, if any, within an interrogation window, and subsequently track a reradiated signal which is received simultaneously, and which is modulated both based on the emitted non-stationary frequency sequence and the internal modulation scheme, as well as a reradiated signal which may be delayed in time.

Since the use of non-stationary radio frequency interrogation signals and subsequent analysis of time domain delay modulated return signal components is conventional, these known methods will not be explored herein in detail. It is understood, however, that the present technique may be used to combine various different RF-ID techniques either in a single hybrid tag system or in an environment with differing types of tags.

In addition, the present invention allows the use of spread spectrum technology to receive data from backscatter tags. Further, certain interactive tags which download information from the interrogation signal may also be compatible with the technique. In fact, since the non-stationary sequence of the interrogation signal is normally ignored by the tag, the sequence itself may be modulated to provide an information signal. The use of a non-stationary frequency for backscatter tags is not heretofore known.

Typically, a state machine passive backscatter RF-ID tag provides an antenna which interacts with a received radio frequency signal. A modulator alters the reflection or impedance characteristic of the antenna system, such that a backscatter signal which varies over time is emitted. The return signal is thus monitored for an information transmission protocol and a message extracted. Since these systems typically are open loop, i.e., no feedback that a message has, in fact been received by the receiver, redundant or continuous transmissions are made. In order to increase the signal to noise ratio, the return signal is typically modulated using other than simple AM modulation. Where the excitation signal is non-stationary, or the tag distant or moving with respect to the transmitter or receiver, phase locking the receiver to the transmitter may be ineffective as a demodulation scheme. Therefore, the present invention provides a system which tracks the modulation signal of the backscatter signal while effectively ignoring signal components, such as non-stationary frequency, movement induced Doppler effects, and the like, which occur outside the symbol transition rate range of the tags.

Advantageously, in one embodiment, the receiver for a PSK modulated tag need not operate in phase synchronous manner with the radio frequency carrier. At the receiver, the signal from the tag is mixed with a signal which corresponds to the interrogation signal. A dual balanced mixer generates outputs corresponding to both I and Q however, the strongest phase is analyzed, and the weaker phase is ignored or analyzed, to the extent that it is expected to contain useful information. Because of many variables, the stronger phase may change many times during receipt of a message. In the case of more complex modulation schemes, it may be necessary to analyze the return signal more rigorously. However, this may be accomplished using known signal analysis techniques.

Various advantages of spread spectrum communications may be obtained according to the present invention. First, a receive may be sensitive to the presence of interfering signals in the environment, especially frequency stationary sources, and avoid employing these frequencies, or ensuring that each tag is interrogated for each portion of a complete cycle outside an interference scope. Further, by providing a common band broader than necessary for any one transponder system, a number of interrogation systems may share the same band and environment with low risk of interference. So long as the interrogation sequences are non-overlapping, or uncorrelated, operation will be generally reliable, without need for coupling the interrogation systems. Of course, the interrogation systems may also be coupled, to ensure that there is little or no interference.

In a preferred embodiment of the invention, an excitation transmitted waveform for detecting the reradiated radio frequency signal is a chirp, i.e., a signal which repetitively monotonically changes in frequency over a range. For example, a sawtooth signal may provide an input to a voltage controlled oscillator. In this case, the phase of the chirp signal is continuous, with a change in relative phase angle over time until a limit is reached. In these systems, it is expected that the range of change in frequency is significant and the rate of frequency change is high. Therefore, approximations which rely on a slowly varying signal or small range of variation are inapplicable.

The chirp signal, derived from the excitation signal source, is remixed with a local oscillator signal for downconversion, generating I and Q intermediate frequency (IF) signals. The IF signals are, in turn, detected with an AM detector. In this case, the phase of the IF signal is not stable with respect to the local oscillator, and thus the signal power will migrate between the I and Q phases. Therefore, the preferred embodiment analyzes both the detected I and Q signal, to determine the data encoded on the received waveform. For example, the stronger signal may be presumed to have the signal with the highest signal to noise ratio, and therefore used exclusively in the signal analysis. The I and Q signals may also be analyzed together. Since the phase is presumed to be instable, and in fact may be rotating, the stronger of the I and Q signals will oscillate.

This method may also have applicability to other types of modulation schemes which do not employ quadrature phase modulation techniques, e.g., QAM, such that any one phase of the demodulated signal includes all of the modulated information of interest.

By allowing a modulated backscatter radio-frequency identification tags to coexist in an environment with surface acoustic wave identification tags, the present invention simplifies system operation with differing tag types and allows a system to be established with a future change in preferred tag type, without redundant or incompatible equipment.

In order to read a known type of SAW RF-ID tag, e.g., an acoustic transponder available from XCI, Inc, San Jose, Calif., a non-stationary frequency radio frequency interrogation signal is transmitted to the tag, where it is modified by the SAW device, such as by reflecting and/or delaying portions of the wave so that a return signal is modulated. In environments including multiple tag types, the type of tag is typically unknown until a response is received. Therefore, it is an object according to the present invention to accept and decode a return signal from a semiconductor memory RF-ID tag from irradiation with a frequency modulated radio frequency interrogation beam, while also accepting and decoding a response from a surface acoustic wave RF-ID tag, and deterring a tag type and encoding, or an absence of a valid tag. For example, the absence of tag detector includes an event detector, e.g., a car in a toll lane, in conjunction with no output from decoders for the different types of transponder supported. Optionally, the system may determine the validity of a code, so that an invalid code may be distinguished from an absent code, with possible different processing.

Of particular note in.the present invention, the "carrier" frequency is not stationary, and therefore the receiver is capable of receiving digitally modulated backscatter signals which are immediately modulated and retransmitted, without substantial delay, as well as reradiated radio frequency signals in which the encoding is presented as one or more substantial delays of a retransmitted derivative of the excitation signal, e.g., from a SAW-based RF tag. In the latter case, by rerunning the excitation signal periodically or continuously, the delayed signals may be detected, which would be difficult or impossible if the excitation signal remained at the same frequency. On the other hand, this non-stationary excitation signal requires compensation before a digitally modulated backscatter signal may be detected. Thus, the present invention provides a multiprotocol tag reader, allowing different types of tags to be reliably identified.

In acoustic RF-ID transponder systems, the information code associated with and which identifies the passive transponder is built into the transponder at the time that a layer of metallization is filly defined on the substrate of piezo-electric material. This metallization thus advantageously defines the antenna coupling, launch transducers acoustic pathways and information code elements e.g. reflectors. Thus, the information code in this case is non-volatile and permanent. The information is present in the return signal as a set of characteristic perturbations of the interrogation signal, such as delay pattern and attenuation. In the case of a tag having launch transducers and a variable pattern of reflective elements, the number of possible codes is $N \times 2^M$ where N is the number of acoustic waves launched by the transducers and M is the number of reflective element positions for each transducer. Thus, with four launch transducers each emitting two acoustic waves, and a potential set of eight variable reflective elements in each acoustic path, the number of differently coded transducers is 2048. Therefore, for a large number of potential codes, it is necessary to provide a large number of launch transducers and/or a large number of reflective elements. However, power efficiency is lost with increasing device complexity, and a large number of distinct acoustic waves reduces the signal strength of the signal encoding the information in each. The transponder tag thus includes a multiplicity of "signal conditioning elements", i.e., delay elements, reflectors, and/or amplitude modulators, are coupled to receive the first signal from a transponder antenna Each signal conditioning element provides an intermediate signal having a known delay and a known amplitude modification to the first signal. Where the signal is split into multiple portions, it is advantageous to reradiate the signal through a single antenna. Therefore, a single "signal combining element" coupled to all of the signal conditioning elements and/or signal portions is provided for combining the intermediate signals to produce the second signal. This second signal is coupled out to the same or a separate antenna for transmission as a reply. As described above, the signal delay elements and/or the signal combining element impart a known, unique informational code to the second signal.

Preferably, the passive acoustic wave transponder tag includes at least one known (control) element, which assists in synchronizing the receiver and allows for temperature compensation of the system. As the temperature rises, the piezoelectric substrate may expand and contract, altering the characteristic delays and other parameters of the tag. Although propagation distances are small, an increase in temperature of only 20° C. can produce an increase in propagation time by the period of one entire cycle at a transponder frequency of about 915 MHz. The acoustic wave is often a surface acoustic wave, although bulk acoustic wave devices may also be constructed.

The receiving and decoding apparatus associated with the system includes apparatus for receiving the second signal from the transponder and a mixer arranged to receive both the first signal and the second signal for performing four quadrant multiplication of these vivo signals. The mixer is preferably a complex mixer, generating I and Q phases 90° apart although the mixer may be polyphasic (having two, three or more phases) which may be symmetric or asymmetric. The difference frequencies (or frequencies derived from the difference frequencies) of the first and second signals, respectively are then processed by one or more signal processors, to detect the phases and amplitudes of the respective difference frequencies contained in the third signal in the case of an acoustic transponder, or a sequence of modulation states in the case of a semiconductor modulator backscatter transponder, to determine the informational code associated with the interrogated transponder. Where the code is provided as a set of time delays, the signal processor performs a time-to-frequency transform (Fourier transform) on the received signal, to assist in determination of the various delay parameters. The characteristic delays (and phase shifts) of the transducer then appear in the transformed data set at the receiver as signal energy having a time delay. Alternately, a set of matched filters may be implemented, and the outputs analyzed. Where the code is provided as a sequence of symbols, a time domain analysis will generally suffice. The preferred embodiment of the invention employs separate analyzer circuitry for differing encoding schemes, but the circuitry and analysis may also be consolidated into a single system, for example a digital signal processing scheme.

In practice, a passive interrogator label system is frequently configured such that a plurality of transponders are interrogated from a number of locations. For example, if the transponders (labels) are carried on persons who are authorized entry into a building, the transmitting and receiving antennas are normally located near several doors to the building. According to the present invention, the signal analysis of both acoustic and semiconductor based a transponders may be remote from the interrogation antenna system.

As another example, the labels may be placed on cattle which are monitored at a number of locations, such as a holding area, a feeding area and the like. The labels may also be placed on railroad cars to permit car identification at various locations throughout a switchyard or rail netswork. Other uses of such systems are known, and in fact the widespread acceptance of interrogation systems, be they passive or active, have generated the problem addressed by the present invention, namely, the presence of many competing and incompatible standards.

Thus, the processing of the transponder signal may be divided between the interrogator-transponder communication in the radio frequency range, and the decoding of the received information, with the two functions potentially separated. The decoding system electronics may be multiplexed to effectively service a number of locations efficiently through a network.

OBJECTS OF THE INVENTION

It is also an object of the invention to provide a versatile receiver which can extract additional information from a return signal and selectively communicate with a plurality of RF-ID tags simultaneously, e.g., a first semiconductor memory tag and a second SAW reflector pattern memory tag.

It is a further object according to the present invention to provide a tag which includes both semiconductor memory and electrode pattern memory.

It is also an object of the invention to provide a method for interrogating a backscatter generating tag, comprising the steps of (a) generating an interrogation signal having a frequency within an interrogation band; (b) emitting the interrogation signal as a radio wave signal; (c) interacting the emitted radio wave signal with a backscatter generating tag; (d) receiving a radio frequency backscatter signal from the tag; (e) mixing the received backscatter signal with a plurality of representations of the interrogation signal, each of said plurality of representations differing in phase, to produce a plurality of mixed signals; (f) comparing a respective signal strength of said plurality of mixed signals; and (h) analyzing said difference signals over time to determine a significant information sequence of the backscatter signal, while discounting an importance of at least one of the plurality of mixed signals at any given time based on said compared respective signal strengths.

It is a further object of the invention to provide a dual mode tag identification system, in which a reradiated representation of an interrogation signal is analyzed in a first mode to determine a transfer function for said interrogation signal and in a second mode to determine a time sequence of modulation states imposed on said interrogation signal.

It is still another object of the invention to provide a transponder interrogation system for interrogating a transponder which receives a radio frequency wave and emits a modified radio frequency wave, comprising an interrogation radio frequency wave generator, generating a radio frequency excitation pulse adapted for probing a plurality of characteristic time-constants of a transponder and for communicating with the transponder; an antenna, for receiving the modified radio frequency wave; a first decoder, for determining the plurality of characteristic time-constants from the modified radio frequency wave; and a second decoder for determining a sequence of modulation states from the modified radio frequency wave.

It is also an object of the present invention to provide a backscatter transponder interrogation system, comprising: (a) an input for receiving a backscatter signal from a backscatter transponder due to an interrogation signal; (b) a multiphase mixer for mixing said received backscatter signal and a representation of said interrogation signal to produce multiphasic outputs; (c) means for selecting a mixer multiphasic output having substantial signal strength; and (d) a decoder for decoding a sequence of symbols from the selected mixer multiphasic output.

It is another object of the present invention to provide an RF-ID tag interrogator, responsive to a return signal from an RF-ID tag having a semiconductor device outputting symbols which are accessed serially over time to sequentially modulate an interrogation signal at a modulation rate, comprising: a transmitter, transmitting a radio frequency interrogation signal, said interrogation signal having a frequency which substantially varies over time; a receiver, receiving a signal from the RF-ID tag which corresponds to said radio frequency interrogation signal, sequentially modulated over time based on the symbols; a decoder, having: a phase-sensitive demodulator, for extracting a complex modulation pattern from said received signal, with respect to a representation of said interrogation signal; a symbol detector receiving said complex modulation pattern, extracting a data clock from one of said complex modulation pattern, said interrogation signal, or a reference clock, compensating for a phase rotation in the complex modulation pattern due to frequency variation of said interrogation signal at a rate faster than the modulation rate, and extracting said symbols from said compensated complex modulation pattern and said data clock.

The present invention also provides as an object a radio frequency receiving device, operating in an environment including an RF generator, generating a time-variant RF signal which propagates through space, and an RF signal modulator having a frequency modulation pattern based on data symbols stored in said device, comprising: an input, receiving a frequency modulated signal corresponding to said time-variant RF signal modulated by the data symbols; a demodulator, producing a demodulated signal by mixing a signal corresponding to said time-variant RF signal with said received signal, while preserving a phase pattern; a comparator, selecting a phase component having a greatest magnitude from at least two phase components having differing phase axes of said demodulated signal, said comparator having a magnitude selectivity pattern excluding selection of a component based primarily on a pattern of said data symbols; a detector, detecting said selected phase component to extract said data symbols; and an output, for outputting information relating to said data symbols.

It is a further object of the invention to provide a device for receiving information from a remote tag, the tag having information stored in a memory and a modulator for frequency modulating an incident signal based on the stored information, comprising: a transmitter for transmitting a radio frequency carrier having a time varying center frequency in proximity to the tag; a receiver for receiving a frequency modulated, time varying center frequency carrier signal from the tag; a balanced mixer, receiving said frequency modulated, time varing center frequency carrier signal and said radio frequency carrier to produce at least a difference signal with at least two outputs each representing a different phase axis; a detector circuit receiving said at least two outputs and extracting the information from at least one of said outputs.

It is a still further object of the invention to provide a radio frequency receiving device, operating in an environment including an RF generator, generating a phase-continuous, time-variant RF signal which propagates through space, and an RF signal modulator having a frequency modulation based on data symbols, comprising: an input, receiving a frequency modulated signal corresponding to said time-variant RF signal modulated by the data symbols; a demodulator, producing a demodulated signal by mixing a signal corresponding to said time-variant RF signal with said received signal, while preserving a phase pattern; a comparator, selecting a phase component having a greatest magnitude from at least two phase components having differing phase axes of said demodulated signal, said comparator having a magnitude selectivity pattern excluding selection of a component based primarily on a pattern of said data symbols; a detector, detecting said selected phase component to extract said data symbols; and an output, for outputting information relating to said data symbols.

It is also an object of the present invention to provide an RF-ID tag reader, responsive to a return signal from an RF-ID tag having an RF output modulating an interrogation signal over time in a pattern corresponding to a sequence of symbols, comprising: a receiver, receiving a modulated signal from the RF-ID tag which corresponds to said radio frequency interrogation signal, modulated over time based on the symbols; a complex demodulator, for demodulating in complex space a modulated signal pattern of the received modulated signal to produce at least two phases and preferentially producing an output based on a phase having a greater signal strength, to extract a modulation pattern from said demodulated signal; an analyzer for reconstructing the symbols from the detected modulation pattern; an output for producing information corresponding to said sequence of symbols.

It is a stiff further object of the invention to provide a RF-ID tag backscatter demodulator having a signal relative phase change detector for determining a relative phase change in a received signal. Preferably, quadrature phase representations of the signal are compared with respective delayed quadrature representations to detect a relative phase reversal edge, with analysis of the quadrature phase edge signals based on a quadrature phase received signal strength.

These and other objects will become apparent from a review of the detailed description of the preferred embodiments.

BRIEF DESCRIPTION OF THE DRAWINGS AND APPENDICES

Figure 30:
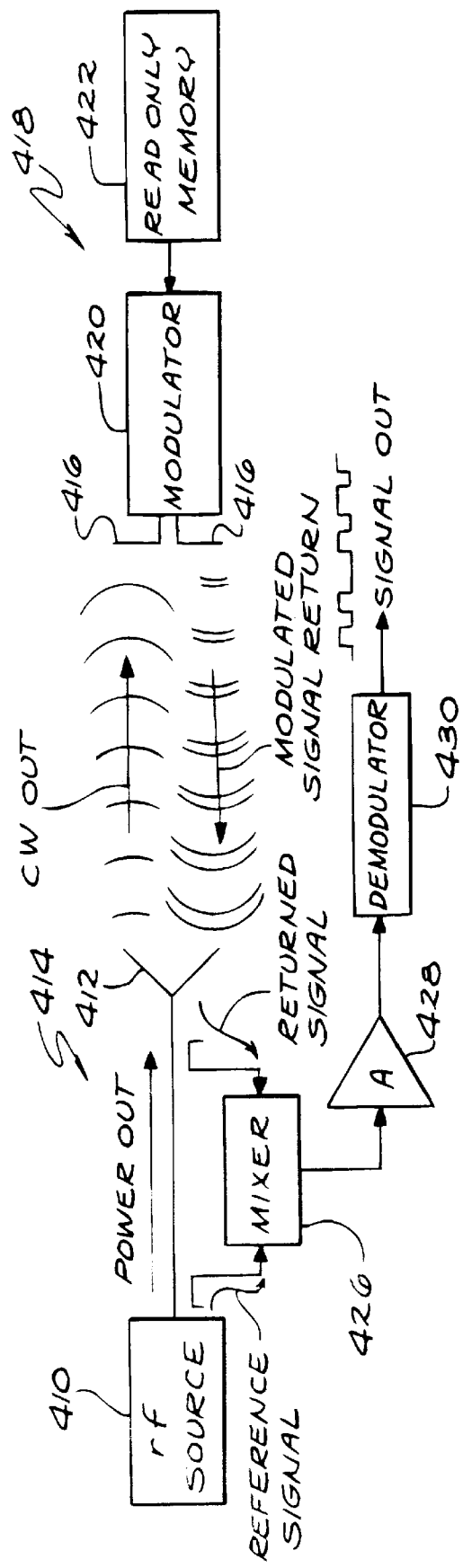
FIGS. 30, 31 and 34 are simplified block diagrams of a reader and an active transponder for identifying at the reader an object associated with the transponder.

FIGS. 39a, 39b, 39c and 39d constitute complementary block diagrams illustrating on a somewhat detailed basis the construction of the reader shown in FIG. 30.

Figure 40:
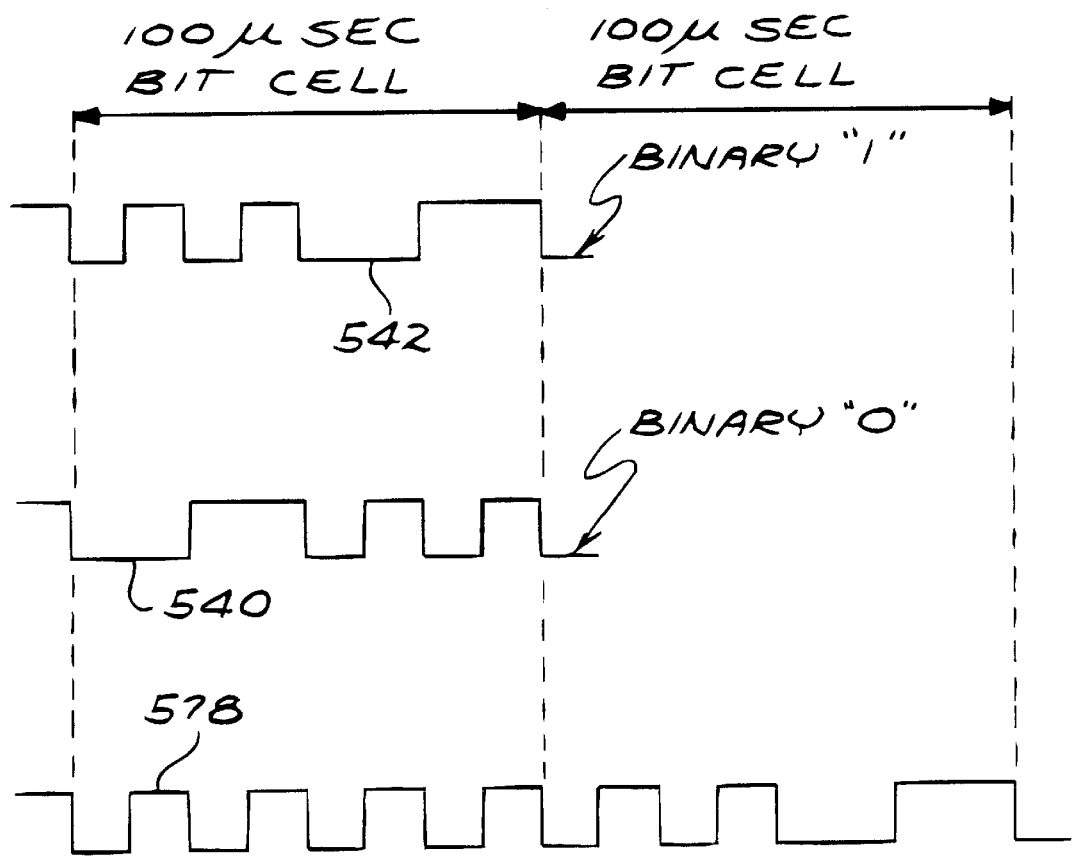

FIG. 40 illustrates waveforms produced in the transponder and detected at the reader to identify a binary "1" a binary "0" and a code indicating the end of the generation at the transponder of sequences of signal cycles in the pattern of binary 1's and binary 0's identified the object.

Figure 41:
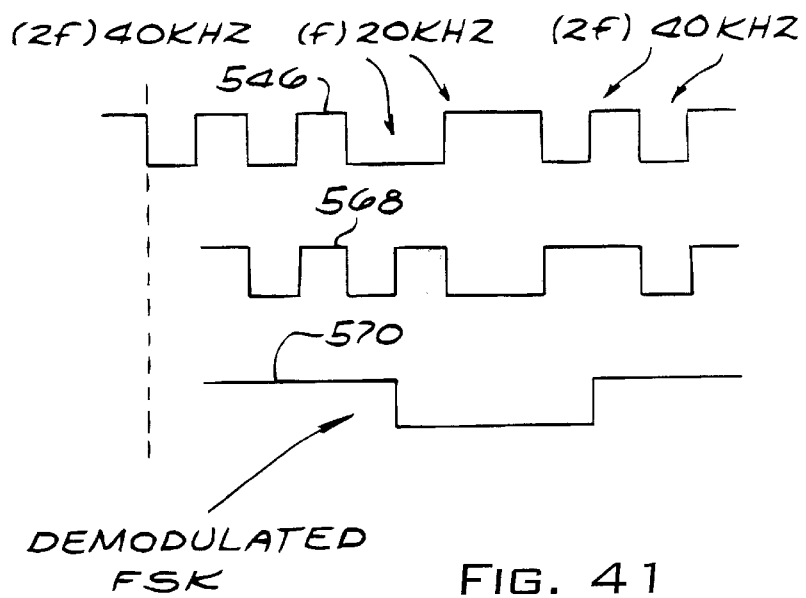

FIG. 41 illustrates waveforms of signal cycles generated at the reader to detect the sequence of binary 1's and binary 0's identifying the object.

Figure 42:
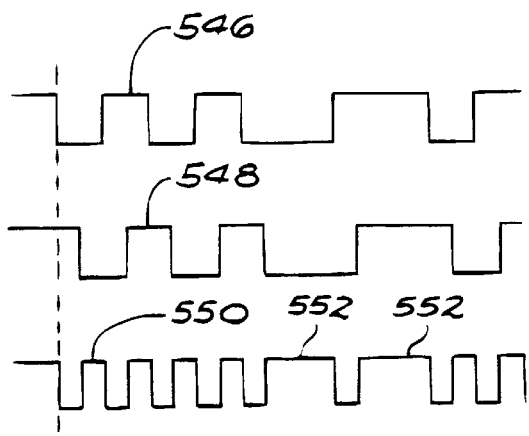

FIG. 42 illustrates waveforms of signal cycles generated at the reader to produce phase-locked signals used at the reader to provide clock signals for synchronizing the operation of the reader shown in FIGS. 39a, 39b, 39c, and 39d.

Figure 43:
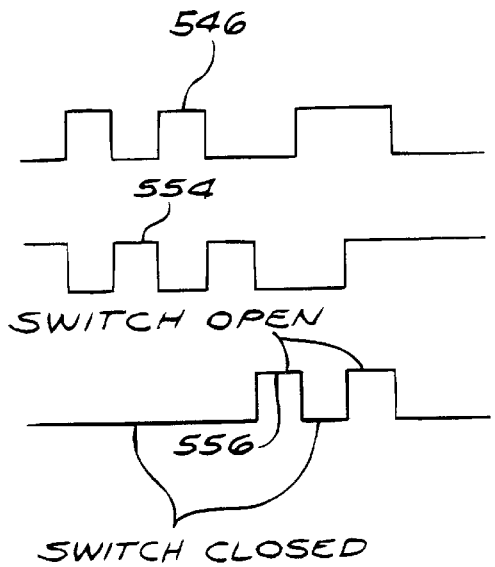

FIG. 43 illustrates waveforms of additional signals generated at the reader to produce additional phase-locked signals for providing the clock signals.

FIGS. 44A–E show a schematic drawing of an active transponder integration system, having an edge sensitive transition detector, and respective signals during operation of the circuit.

Figure 45:
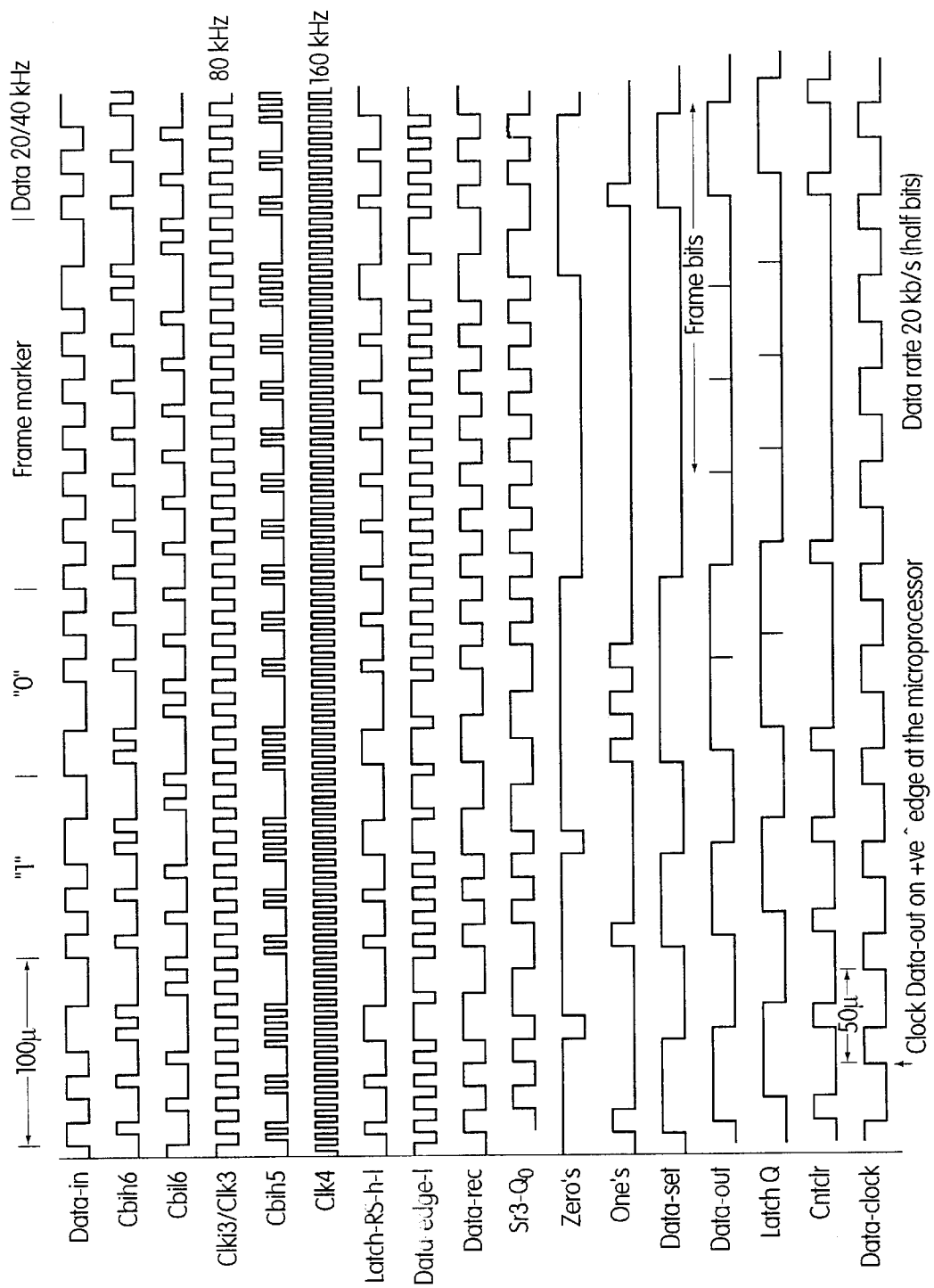
Figure 48A:
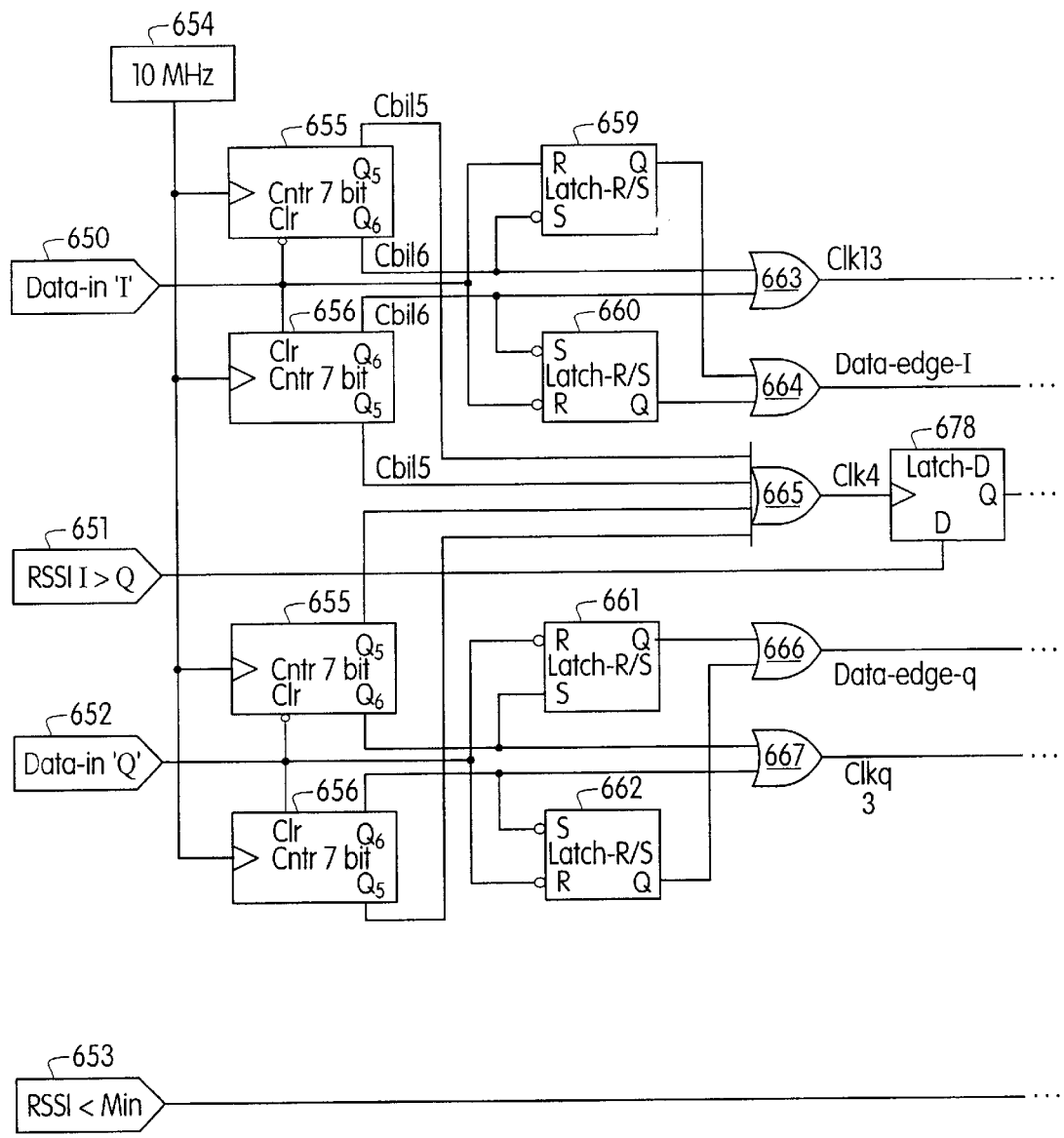
Figure 48B:
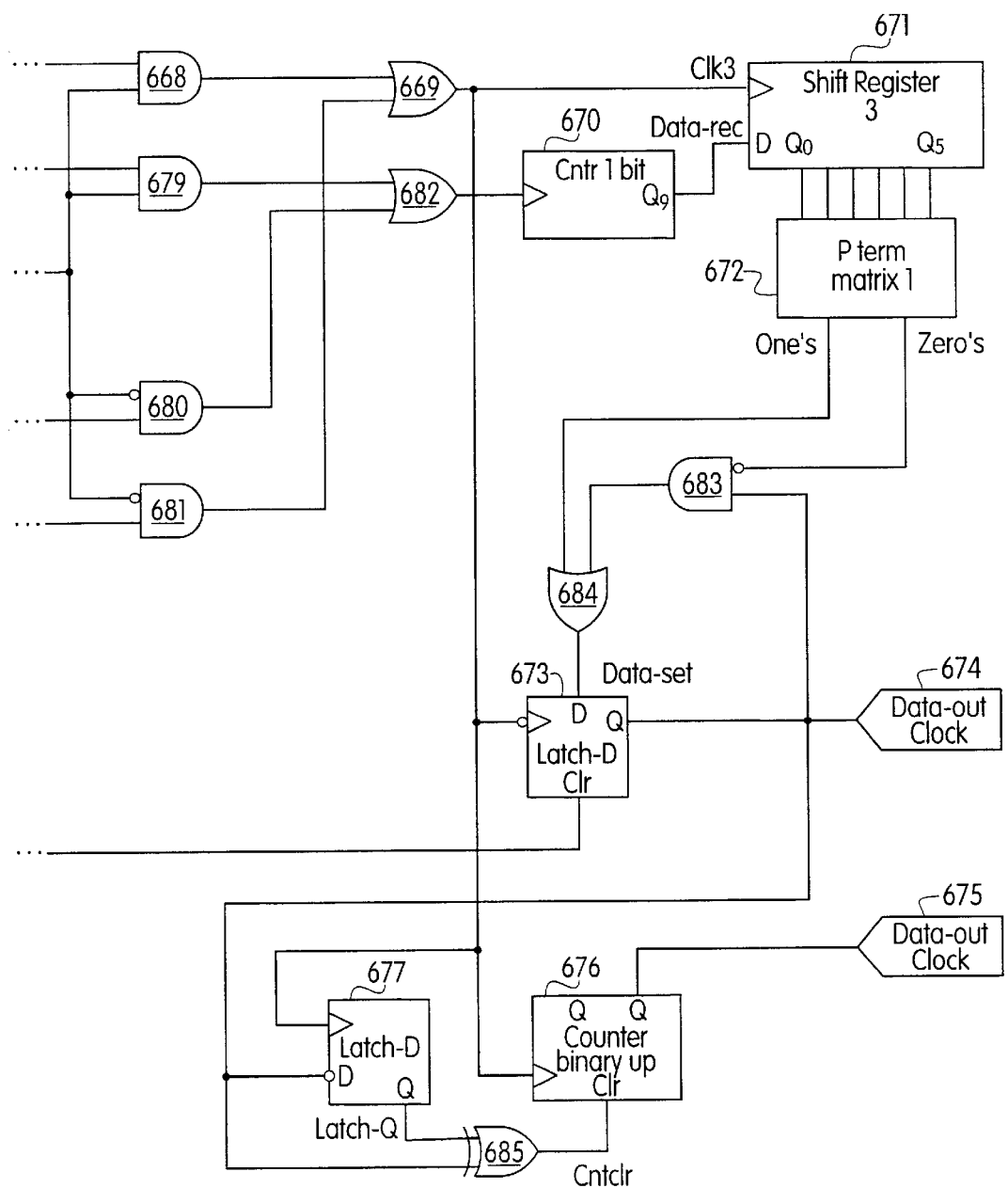

FIG. 45 is a waveform and timing diagram for the various signals received and generated by the EPLD according to FIG. 48;

FIGS. 46–49 show schematic drawings of portions of a multimode active transponder interrogation system; and Appendix A provides a source code listing according to the present invention for a decoding program for a backscatter transponder as disclosed in U.S. Pat. No. 4,739,328.

DETAILED DESCRIPTION OF THE PREFERRED EMBODIMENTS

The preferred embodiments of the present invention will now be described with reference to FIGS. 1–49 of the drawings. Identical elements in the various figures are designated with the same reference numerals.

ACOUSTIC WAVE TRANSPONDER TAG

A surface acoustic wave passive interrogator label system, as described, for example, in U.S. Pat. Nos. 4,734,698; 4,737,790; 4,703,327; and 4,951,057, includes an interrogator comprising, a voltage controlled oscillator 10 which produces a first signal S1 at a radio frequency determined by a control voltage V supplied by a control unit 12. This signal S1 is amplified by, a power amplifier 14 and applied to an antenna 16 for transmission to a transponder 20. The voltage controlled oscillator 10 may be replaced with other oscillator types.

The signal S1 is received at the antenna 18 of the transponder 20 and passed to a signal transforming element 22. This signal transformer converts die first (interrogation) signal S1 into a second (reply) signal S2, encodead with an information pattern. The information pattern is encoded as a series of elements having characteristic delay periods $T_0$ and $\Delta T_1, \Delta T_2, \ldots \Delta T_N$. Two common types of system exist. In a first, the delay periods correspond to physical delays in the propagation of the acoustic signal. After passing each successive delay, a portion of the signal $I_0, I_1, I_2 \ldots I_N$ is tapped outward supplied to a summing element. The resulting signal S2, which is the sum of the intermediate signals $I_0 \ldots I_N$, is fed back to a transponder tag antenna, which may be the same or different than the antenna which received the interrogation signal, for transmission to the interrogator/receiver antenna. In a second system the delay periods correspond to the positions of reflective elements, which reflect portions of the acoustic wave back to the launch transducer, where they are converted back to an electrical signal and emitted by the transponder tag antenna.

The signal S2 is passed either to the same antenna 18 or to a different antenna 24 for transmission back to the interrogator/receiver apparats. This second signal S2 carries encoded immolation which, at a minimum, identifies the particular transponder 20.

The signal S2 is picked up by a receiving antenna 26. Both this second signal S2 and the first signal S1 (or respective signals derived from these two signals) are applied to a mixer (four quadrant multiplier) 30 to produce a third signal S3 containing frequencies which include both the sums and the differences of the fluencies contained in the signals S1 and S2. The signal S3 is passed to a signal processor 32 which determines the amplitude $a_i$ and the respective phase $\phi_i$ of each frequency component $\phi_i$ among a set of frequency components ($\phi_0, \phi_1, \phi_2 \ldots$) in the signal S3. Each phase $\phi_i$ is determined with respect to the phase $\phi_0=0$ of the lowest frequency component $\phi_0$. The signal S3 may be intermittently supplied to the mixer by means of a switch, and indeed the signal processor may be time-division multiplexed to handle a plurality of S3 signals from different antennas.

The information determined by the signal processor 32 is passed to a computer system comprising, among other elements, a random access memory (RAM) 34 and a microprocessor 36. This computer system analyzes the frequency, amplitude and phase information and makes decisions based upon this information. For example, the computer system may determine the identification number of the interrogated transponder 20. This I.D number and/or other decoded information is made available at an output 38.

The transponder may be an entirely passive device, or it may contain a power source and one or more active elements.

The transponder serves as a signal transforming element 22, which comprises N+1 signal conditioning elements 40 and a signal combining element 42. The signal conditioning elements 40 are selectively provided to impart a different response code for different transponders, and which may involve separate intermediate signals $I_0, I_1, \ldots I_N$ within the transponder. Each signal conditioning element 40 comprises a known delay $T_i$ and a known amplitude modification $A_i$ (either attenuation or amplification). The respective delay $T_i$ and amplitude modification $A_i$ may be functions of the frequency of the received signal S1, or they may provide a constant delay and constant amplitude modification, respectively, independent of frequency. The time delay and amplitude modification may also have differing dependency on frequency. The order of the delay and amplitude modification elements may be reversed; that is, the amplitude modification elements $A_i$ may precede the delay elements $T_i$. Amplitude modification $A_i$ can also occur within the path $T_i$.

The signals are combined in combining element 42 which combines these intermediate signals (e.g., by addition, multiplication or the like) to form the reply signal S2 and the combined signal emitted by the antenna 18.

Figure 1:
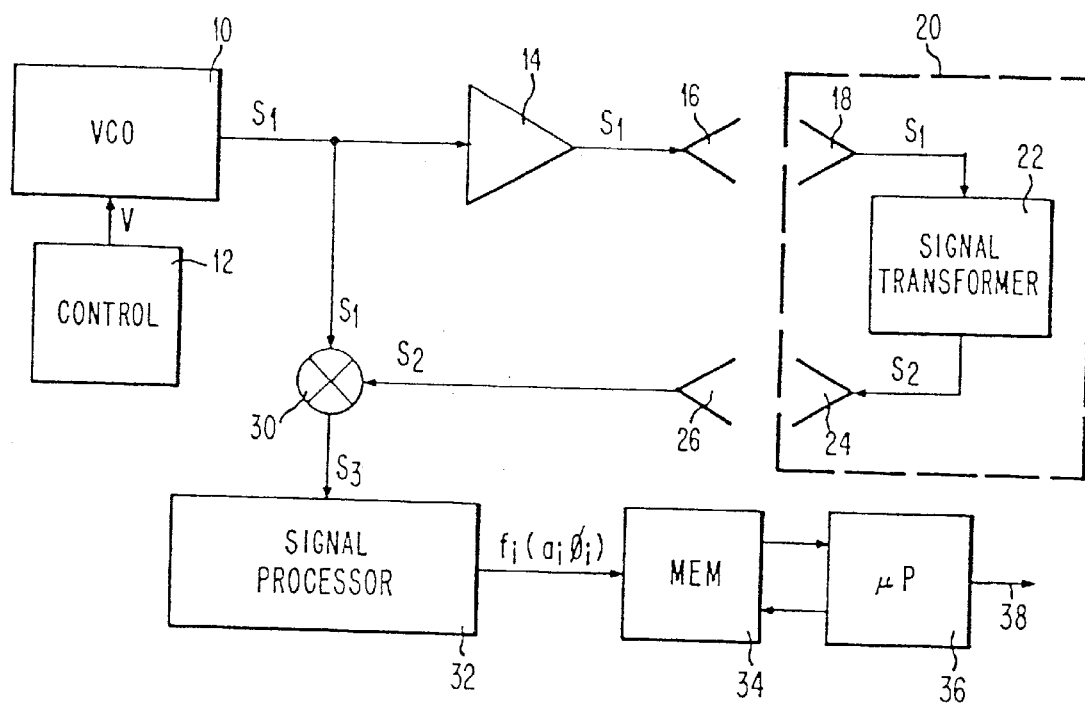
FIG. 1 is a block diagram of a known passive interrogator label system.
Figure 2:
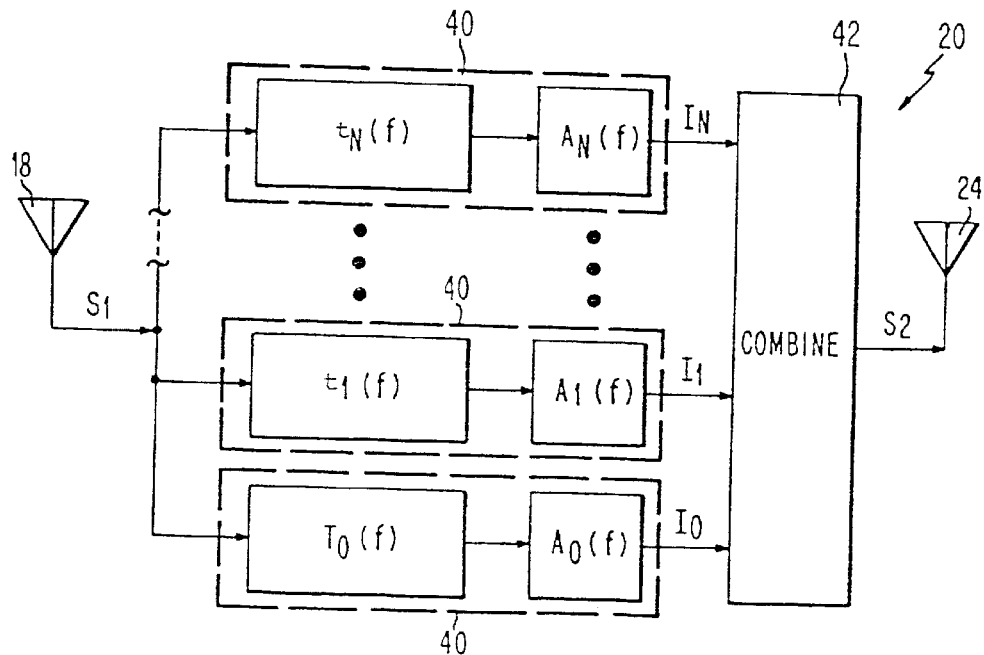
FIG. 2 is a block diagram of a transponder or "label" which is used in the system of FIG. 1.
Figure 3A:
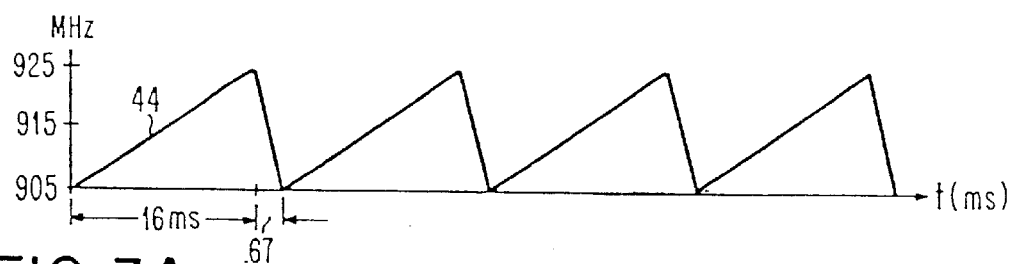
FIGS. 3A and 3B are time diagrams, drawn to different scales, of the radio frequencies contained in the interrogation and reply signals transmitted with the system of FIG. 1.
Figure 3B:
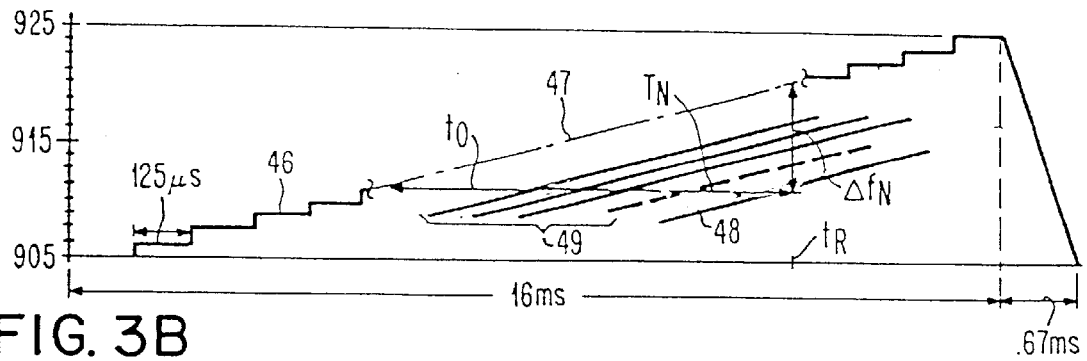
Figure 4:
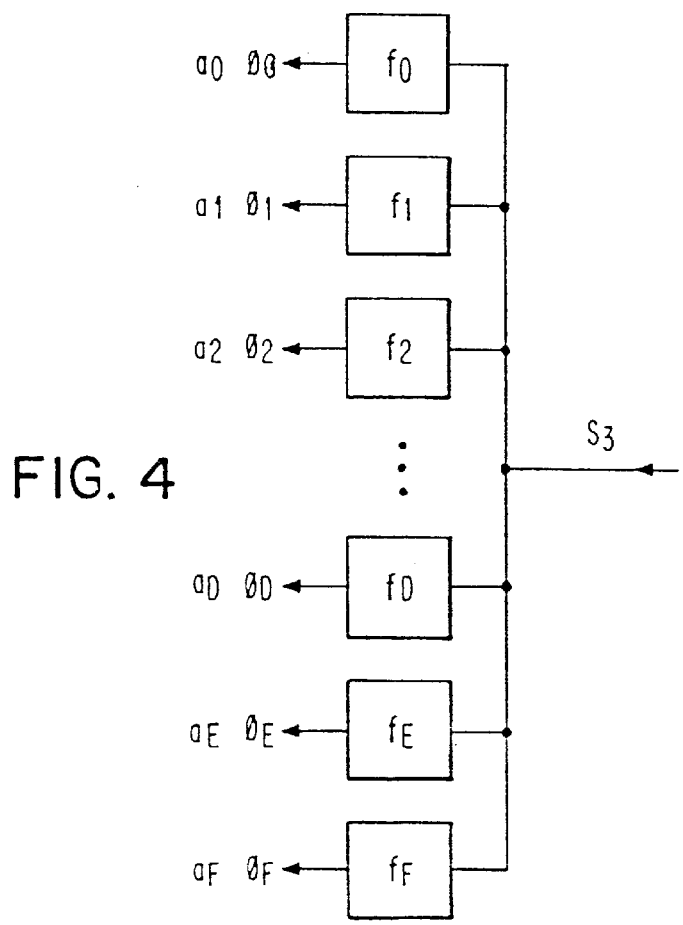
FIG. 4 is a block diagram illustrating the decoding process carried out by the signal processor in the system of FIG. 1.
Figure 5:
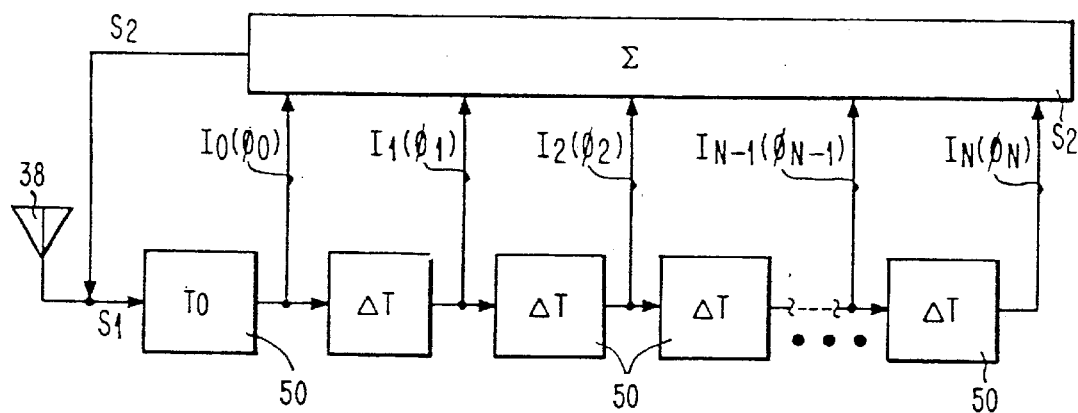
FIG. 5 is a block signal diagram of a passive transponder which may be used with the system of FIG. 1.

In one embodiment the voltage controlled oscillator 10 is controlled to produce a sinusoidal RF signal with a frequency that is swept in 128 equal discrete steps from 905 MHz to 925 MHz. Each frequency step is maintained for a period of 125 microseconds so that the entire frequency sweep is carried out in 16 milliseconds. Thereafter, the frequency is dropped back to 905 MHz in a relaxation period of 0.67 milliseconds. The stepwise frequency sweep 46 shown in FIG. 3B thus approximates the linear sweep 44 shown in FIG. 3A Assuming that the stepwise frequency sweep 44 approximates an average, linear frequency sweep or "chirp" 47, FIG. 3B illustrates how the transponder 20, with its known, discrete time delays $T_0, T_1 \ldots T_N$ produces the second (reply) signal 52 with distinct differences in frequency from the first (interrogation) signal 51. Assuming a round-trip, radiation transmission time of to, the total round-trip times between the moment of transmission of the first signal and the moments of reply of the second signal will be $t_0+T_0$, $t_0+T_1, \ldots t_0+T_N$, for the delays $T_{ON}, T \ldots, T_1$ respectively. Considering only the transponder delay $T_N$, at the time $t_R$ when the second (reply) signal is received at the antenna 26, the frequency 48 of this second signal will be $\Delta f_N$ less than the instantaneous frequency 47 of the first signal S1 transmitted by the antenna 16. Thus, if the first and second signals are mixed or "heterodyned", this frequency difference $\Delta f_N$ will appear in the third signal as a beat frequency. Understandably, other beat frequencies will also result from the other delayed frequency spectra 49 resulting from the time delays $T_0, T_1 \ldots T_{N-1}$. Thus, in the case of a "chirp" waveform, the difference between the emitted and received waveform will generally be constant.

In mathematical terms, we assume that the phase of a transmitted interrogation signal is $\phi=2\pi f\tau$, where $\tau$ is the round-trip transmission time delay. For a ramped frequency $df/dt$ or f, we have: $2\pi f\tau=d\phi/dt=\omega$. $\omega$, the beat frequency, is thus determined by $\tau$ for a given ramped frequency or chirp f.

In this case, the signal S3 may be analyzed by determining a frequency content of the S3 signal, for example by applying it to sixteen bandpass filters, each tuned to a different frequency, $f_0, f_1 \ldots f_E, f_F$. The signal processor determines the amplitude and phase of the signals that pass through these respective filters. These amplitudes and phases contain the code or "signature" of the particular signal transformer 22 of the interrogated transponder 20. This signature may be analyzed and decoded in known manner.

The transponder system typically operates in the band 905–925 MHz, with 123 frequency steps. In a swept frequency embodiment, the sequence of frequencies are determined by noting successive constant frequency increments ($\Delta f$) above 905 MHz. Frequency changes are determined by a delay line detector comprising a delay element 86, a mixer 88, lowpass filter 90 and a zero-crossing detector 92. The signal S1 is passed through the delay element 86 to one input of the mixer 88, and passed directly to the other input of the mixer 88. This mixer produces an output signal containing both the sum and difference frequencies of the two signals applied thereto. This output is supplied to the lowpass filter 90 which passes only the portion of the signal containing the difference frequencies. The output of the lowpass filter is supplied to the zero-crossing detector 92 which produces a pulse at each positive (or negative) going zero-crossing. These pulses are passed to the microprocessor 76 to inform the microprocessor when the frequency of the signal S1 has changed by a fixed increment ($\Delta f$) of 156.25 KHz.

During normal operation of the interrogator apparatus, the microprocessor 76 controls the frequency of the VCO 72 by successively retrieving the digital numbers from storage and supplying a different number to the D/A converter 78 every 125 microseconds (i.e., at an 8 kHz rate). In actual operation the microprocessor inserts two additional, uniformly placed steps (in frequency and time) between the steps calculated from the delay line. This is done to help eliminate "spectral aliasing" of the difference frequencies.

A clock 32 is provided having a 100 KHz output. As may be seen, the signal 68 is received during the interval between transmissions of the signal 66. These intervals are chosen to equal, approximately, the round trip delay time between the transmission of a signal to the transponder and the receipt of the transponder reply. The transponder reply will contain a number of frequencies at any given instant of time as a result of the combined (i.e., summed) intermediate signals having different delay times ($T_0$, $T_0+\Delta T$, $T_0+2\Delta T$, ... $T_0+N\Delta T$).

Figure 6:
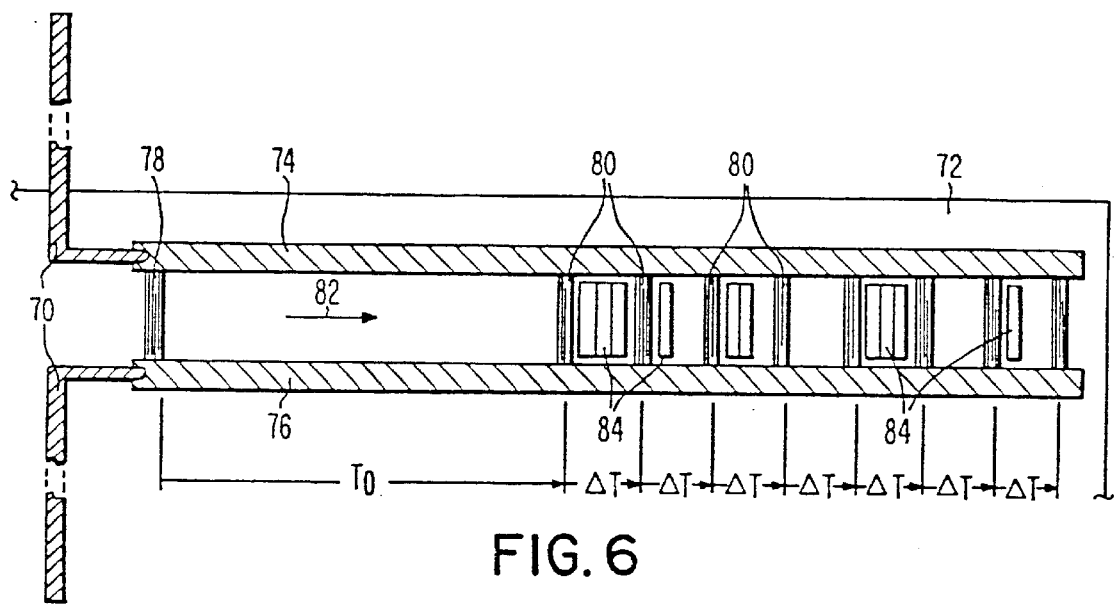
FIG. 6 is a plan view, in enlarged scale, of a first configuration of the transponder of FIG. 5.
Figure 7:
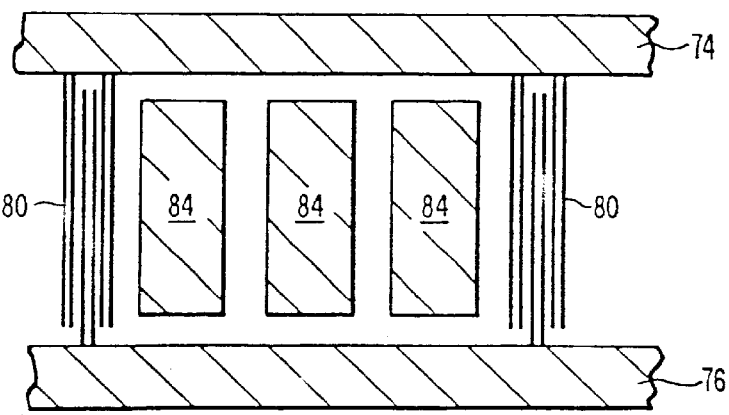
FIG. 7 is a plan view, in greatly enlarged scale, of a portion of the transponder configuration shown in FIG. 6.

In one embodiment of a passive transponder, shown in FIGS. 6 and 7, the internal circuit operates to convert the received signal S1 into an acoustic wave and then to reconvert the acoustic energy back into an electrical signal S2 for transmission via a dipole antenna 70, connected to, and arranged adjacent a SAW device made of a substrate 72 of piezoelectric material such as lithium niobate fore particularly, the signal transforming element of the transponder includes a substrate 72 of piezoelectric material such as a Lithium niobate ($LiNbO_3$) crystal, which has a free surface acoustic wave propagation velocity of about 3488 meters/second. On the surface of this substrate is deposited a layer of metal, such as aluminum, forming a pattern which includes transducers and delay/reflective elements.

One transducer embodiment includes a pattern consisting of two bus bars 74 and 76 connected to the dipole antenna 70, a "launch" transducer 78 and a plurality of "tap" transducers 80. The bars 74 and 76 thus define a path of travel 82 for a surface acoustic wave which is generated by the launch transducer and propagates substantially linearly, reaching the tap transducers each in turn. The tap transducers convert the surface acoustic wave back into electrical energy which is collected and therefore summed by the bus bars 74 and 76. This electrical energy then activates the dipole antenna 70 and is converted into electromagnetic radiation for transmission as the signal S2.

The tap transducers 80 are provided at equally spaced intervals along the surface acoustic wave path 82, as shown in FIG. 6, and an informational code associated with the transponder is imparted by providing a selected number of "delay pads" 84 between the tap transducers. These delay pads, which are shown in detail in FIG. 7, are preferably made of the same material as, and deposited with, the bus bars 74, 76 and the transducers 78, 80. Each delay pad has a width sufficient to delay the propagation of the surface acoustic wave from one tap transducer 80 to the next by one quarter cycle or 90° with respect to an undelayed wave at the frequency of operation (in the 915 MHz band). By providing locations for three delay pads between successive tap transducers, the phase f of the surface acoustic wave received by a tap transducer may be controlled-to provide four phase possibilities, zero pads=0°; one pad=90°; two pads=180°; and three pads=270°.

The phase information $\phi_0$ (the phase of the signal picked up by the first tap transducer in line), and $\phi_1, \phi_2 \ldots \phi_N$ (the phases of the signals picked up by the successive tap transducers) is supplied to the combiner (summer) which, for example, comprises the bus bars 74 and 76. This phase information, which is transmitted as the signal S2 by the antenna 70, contains the informational code of the transponder.

As shown in FIG. 7, the three delay pads 84 between two tap transducers 80 are each of such a width L as to each provide a phase delay of 90° in the propagation of an acoustic wave from one tap transducer to the next as compared to the phase in the absence of such a delay pad. This width L is dependent upon the material of both the substrate and the delay pad itself as well as upon the thickness of the delay pad and the wavelength of the surface acoustic wave. As noted above, the substrate material is preferably lithium niobate ($TiNbO_3$) and, the delay pad material is preferably aluminum.

The transducers are typically fabricated by an initial metallization of the substrate with a generic encoding, i.e., a set of reflectors or delay elements which may be further modified by removal of metal to yield the customized transponders. Thus, in the case of delay pads, three pads are provided between each set of transducers or taps, some of which may be later removed. Where the code space is large, the substrates may be partially encoded, for example with higher order code elements, so that only the lower order code elements need by modified in a second operation.

While a system of the type described above operates satisfactorily when the number of tap transducers does not exceed eight, the signal to noise ratio in the transponder reply signal is severely degraded as the number of tap transducers increases. This is because the tap transducers additionally act as launch transducers as well as partial reflectors of the surface acoustic wave so that an increase in the number of tap transducers results in a corresponding increase in spurious signals in the transponder replies. This limitation on the number of tap transducers places a limitation on the length of the informational code imparted in the transponder replies.

Spurious signals as well as insertion losses may be reduced in a passive transponder so that the informational code may be increased in size to any desired length, by providing one or more surface acoustic wave reflectors on the piezoelectric substrate in the path of travel of the surface acoustic wave, to reflect the acoustic waves back toward a transducer for reconversion into an electric signal.

A transducer 86 may thus be employed in conjunction with reflectors 88 and 90 in a unique configuration which replaces the aforementioned arrangement having a launch transducer 78 and tap transducers 80. In particular, the transducer 86 is constructed to convert electrical energy received at the terminals 92 and 94 into surface acoustic wave energy which propagates outward in opposite directions indicated by the arrows 96 and 98. The launch transducer is constructed in a well known manner with an inter-digital electrode assembly formed of individual electrode fingers arranged between and connected to the two bus bars 100 and 102. In the illustrated pattern, half the fingers are connected to the bus bar 100 and the other half are connected to the bus bar 102. Each electrode is connected to one or the other bus bar and extends toward a free end its the direction of the other bus bar.

The distance between the centers of successive fingers is equal to $3\lambda/4$ where $\lambda$ is the center wavelength of the surface acoustic wave. Furthermore, as may be seen, the length of the active region between the ends of the electrodes connected to the bus bar 100 and the ends of the electrodes connected to the bus bar 102 is $K\lambda$, where K is a proportionality constant.

Surface acoustic waves which travel outward from the transducer 86 in the directions 96 and 98 encounter and are reflected back by the reflectors 88 and 90. These reflectors comprise individual electrode fingers which extend between the bus bars 104 and 106 on opposite sides. These electrodes are spaced.from center to center, a distance λ/2 apart.

The reflectors 88 and 90 serve to reflect nearly 100% of the surface acoustic wave energy back toward the transducer 86; that is, in the directions 108 and 110, respectively. Thus, after a pulse of surface acoustic wave energy is generated by the transducer 86, it is reflected back by the reflectors 88 and 90 and reconverted into an electrical signal by the transducer 86.

The configuration may also include one or more delay pads 112 which control the phase of the surface acoustic wave received back by the transducer 86. For a 90° phase delay (as compared to the phase of the received surface acoustic wave without a delay pad present) the delay pad should have a width equal to ½ the width of the typical delay pads because the surface acoustic wave will traverse the delay pads twice (i.e., in both directions).

A plurality of transducers 114 may be connected to common bus bars 116 and 118 which, in turn, are connected to the dipole antenna of the transponder. On opposite sides of this configuration arid reflectors 120 and 122 which reflect surface acoustic waves back toward the transducers which launched them.

Since the transducers 114 are connected in parallel, an interrogation pulse at radio frequency is received by all the transducers essentially simultaneously. Consequently, these transducers simultaneously generate surface acoustic waves which are transmitted outward in both directions. Due to the particular configuration shown, the reflected surface acoustic waves are received at staggered intervals so that a single interrogation pulse produces a series of reply pulses after respective periods of delay.

Another embodiment of a passive transponder includes four transducers 124 which are connected electrically in series between bus bars 126. These transducers are interconnected by means of intermediate electrodes 128, the electrical circuit through each transducer being effected by capacitive coupling. When energized by an RF electrical signal, the transducers simultaneously produce surface acoustic waves which travel in four parallel paths 130.

To the right of the transducers 124 are four sets 132, 134, 136 and 138 of reflectors 140 arranged in the paths of travel 130 of the surface acoustic waves. In the example shown, three reflectors 140 are arranged in each set; however, the number of reflectors may be varied. If only a single reflector is provided in each of the positions 132, 134, 136 and 138, this reflector should be designed to reflect nearly 100% of the surface acoustic waves at the wavelength of these waves. If more than one reflector is provided, these reflectors should be designed to reflect only a portion of the acoustic wave energy.

Where three reflectors are provided in each set, the first and second reflectors should allow some of the acoustic wave energy to pass beneath them to the third and last reflector in line. In this way, if a pulse of surface acoustic wave energy is generated by a transducer 124, some of it will be reflected by the first transducer, some by the second and some by the third reflector in line.

Another transponder system provides separate launch and receiving transducers. As may be seen, surface acoustic waves are generated by a launch transducer 166 and propagated in the direction indicated by the arrow 168. These surface acoustic waves pass beneath the receiving transducer 170 and continue on toward one or more reflectors 172 in the direction indicated by the arrow 174. This acoustic wave energy is reflected by the reflectors 172 and directed back toward the receiving transducer 170 in the direction indicated by the arrow 176.

The launch and receiving transducers may be connected to separate dipole antennas. This may be advantageous in certain applications since the different antennas may receive and radiate energy in different directions, and this allows separate signal processing for received and transmitted RF energy.

Figure 8:
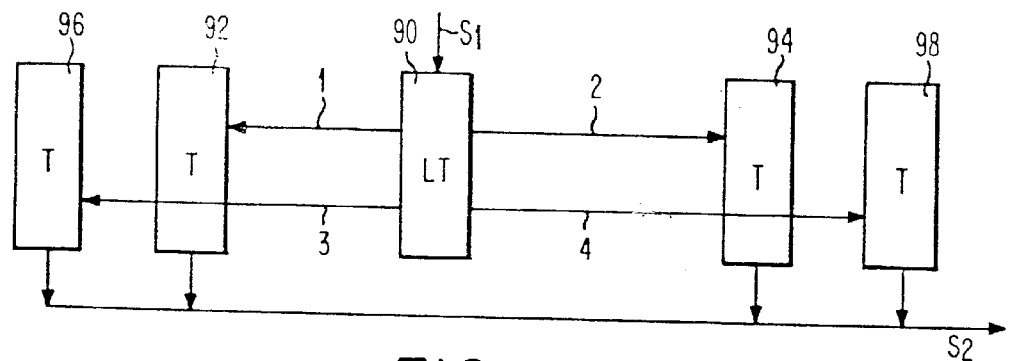
FIGS. 8–12 are representational diagrams, in plan view, of a various conflagrations of the transponder of FIG. 5.

In FIG. 8, a single launch transducer (LT) 90 transmits surface acoustic waves in both directions to tap transducers (T) 92, 94, 96 and 98. As may be seen, the launch transducer 90 is slightly offset (to the left as illustrated in FIG. 8) so that the length )f the transmission path 1 to the tap transducer 92 is shorter than the path 2 to the tap transducer 94. Similarly, the path 3 to the tap transducer 96 is shorter than the path 4 to the tap transducer 98. In particular, the various transducers are positioned such that the differences in propagation times between the pathways 1 and 2, 2 and 3, and 3 and 4 are all equal (ΔT). The outputs of the tap transducers 92, 94, 96 and 98 may thus be summed to produce a second signal S2 of the type represented in FIG. 5.

Figure 9:
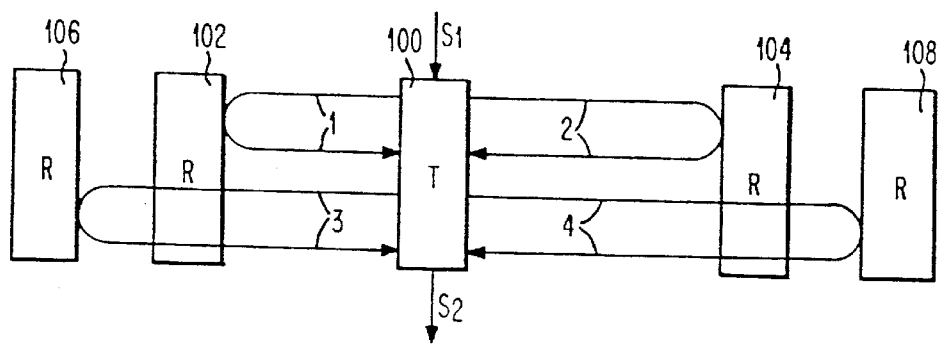

FIG. 9 illustrates the same basic configuration as in FIG. 8 except that the launch transducer 100 operates also to reconvert the SAW energy into electrical energy to form the signal S2. Reflectors 102, 104, 106 and 108 serve to reflect the acoustic wave energy proceeding paths 1, 2, 3 and 4, respectively, back toward the transducer 100. As in the configuration of FIG. 8, the differences in propagation times between successive pathways (i.e., between pathways 1 and 2, 2 and 3, and 3 and 4) are all equal (ΔT).

In the embodiments of FIG. 8 and FIG. 9, surface acoustic waves traveling along pathways 3 and 4 must pass beneath transducers 92, 94 (FIG. 8) or reflectors 102, 104 (FIG. 9). Such an arrangement of successive, multiple tap transducers or reflectors in a pathway introduces unwanted reflections and spurious signals into the output signal S2, making subsequent signal processing more difficult.

Figure 10:
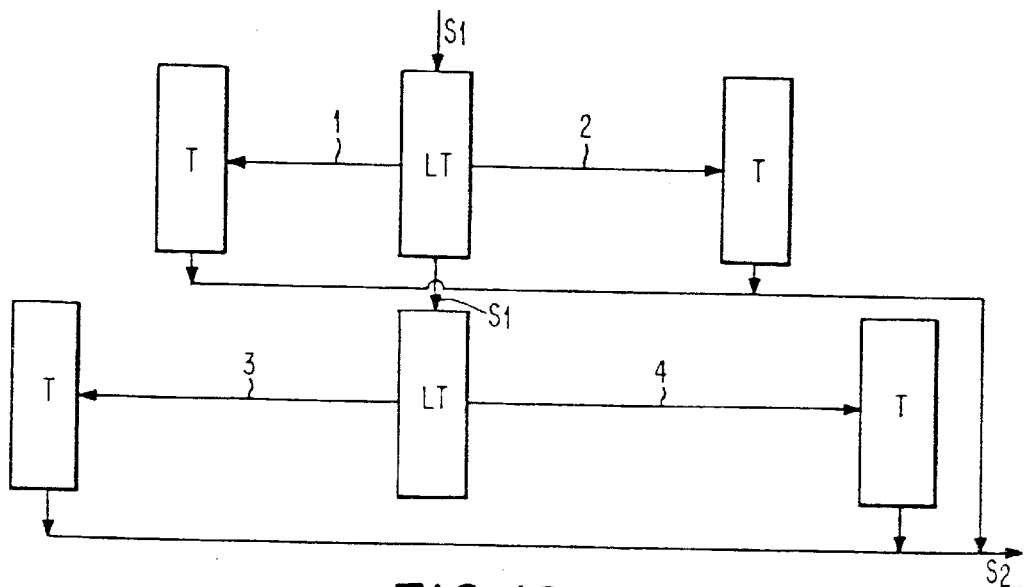
Figure 11:
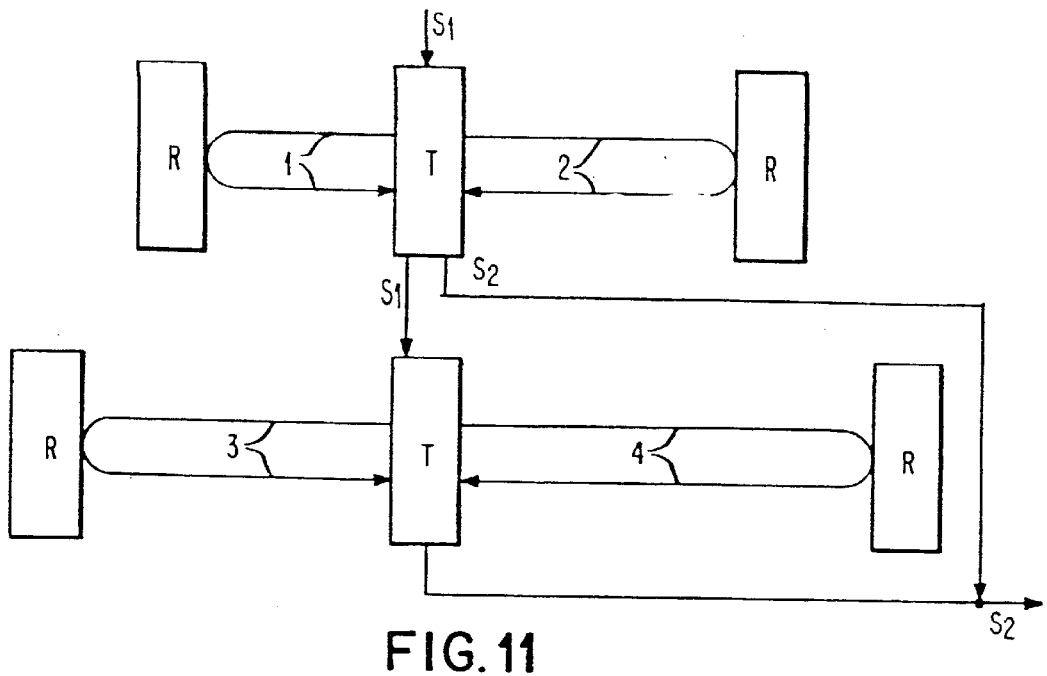

FIGS. 10 and 11 illustrate SAW device configurations, corresponding to FIGS. 8 and 9, respectively, in which plural launch transducers simultaneously receive and convert the signal S1 into SAW energy. With this arrangement the pathways 1, 2, 3 and 4 are spatially separated so that the surface acoustic waves can travel on the surface of the substrate without passing beneath a reflector or transducer.

Figure 12:
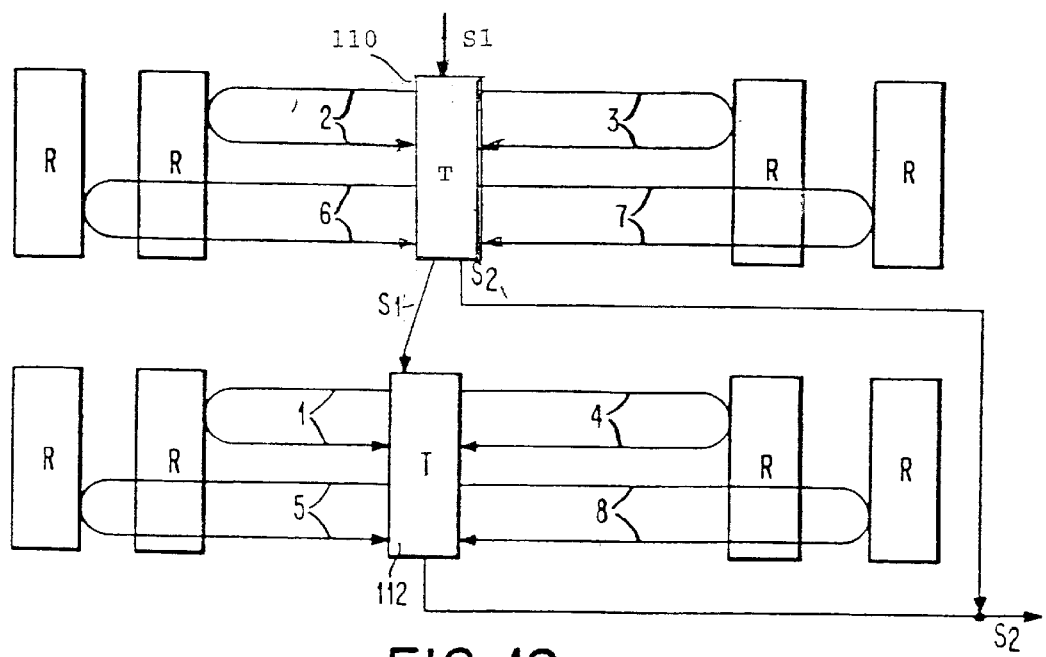

It is, of course, possible to combine the configurations of FIGS. 8–11 in various ways. FIG. 12 shows an embodiment which combines the principles illustrated in FIGS. 9 and 11. In this embodiment, two launch/receive transducers 110 and 112 simultaneously convert the interrogation signal S1 into surface acoustic waves which travel along pathways 1, 2, 3, 4, 5, 6, 7 and 8. The transducers 110 and 112 are positioned so that the propagation times along these pathways are staggered, from one pathway to the next, by a fixed amount ΔT; that is, the propagation time along pathway 2 is ΔT longer than along pathway 1, the propagation time along pathway 3 is ΔT longer than along pathway 2, etc.

It will be appreciated that an information code can be imparted to the second (reply) signal S2 by means of "delay pads" of the type illustrated in FIGS. 6 and 7. These delay pads may be inserted at appropriate places along the respective propagation pathways illustrated in FIGS. 8–12.

Figure 13:
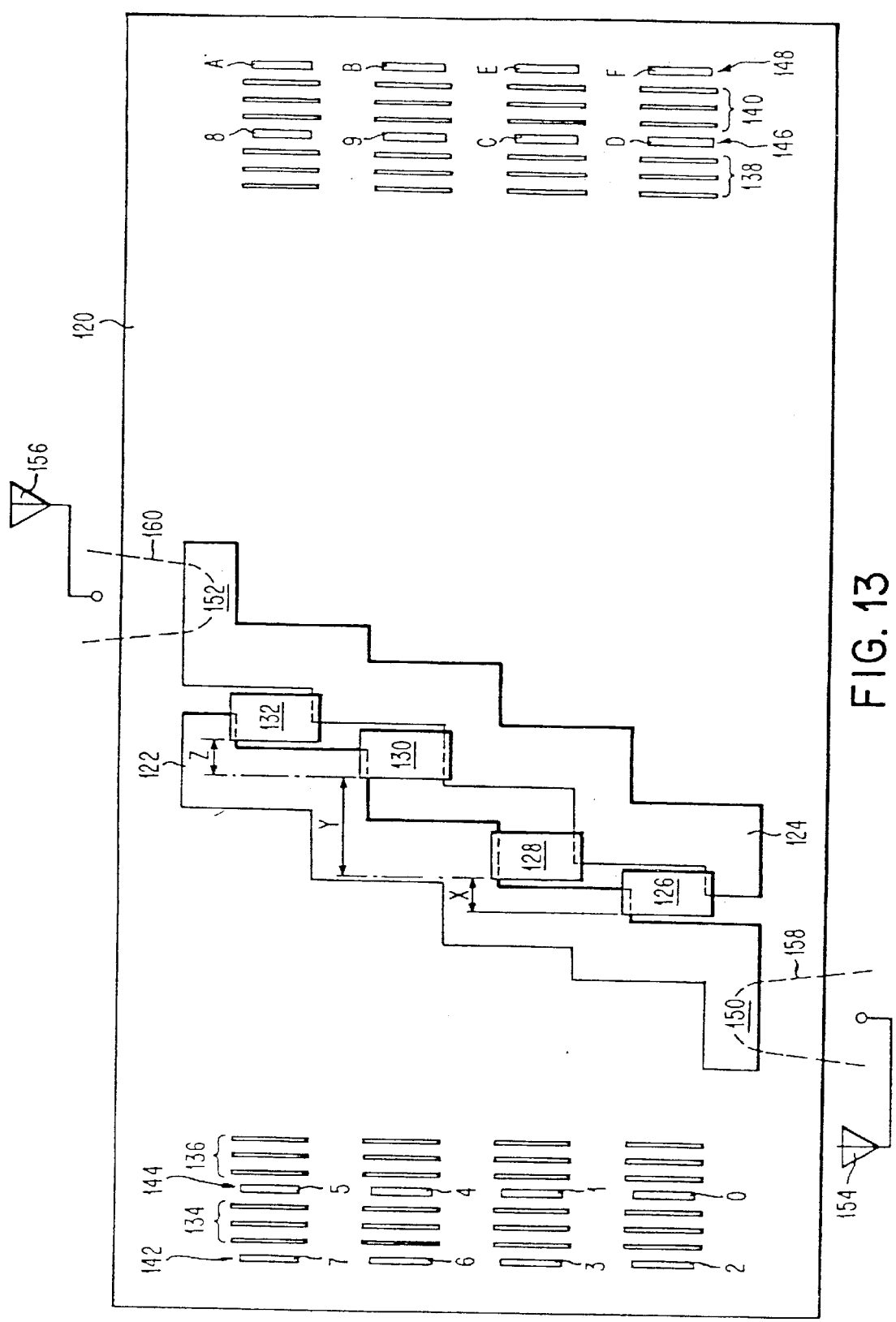
FIG. 13 is a plan view, in enlarged scale, of a seventh configuration of the transponder of FIG. 5.

The embodiment of FIG. 13 comprises a substrate 120 of piezoelectric material, such as lithium niobate, on which is deposited a pattern of metallization essentially as shown. The metallization includes two bus bars 122 and 124 for the transmission of electrical energy to four launch transducers 126, 128, 130 and 132. These launch transducers are staggered, with respect to each other, with their leading edges separated by distances X, Y and Z, respectively, as shown. The distances X and Z are identical; however, the distance Y is larger than X and Z for reasons which will become clear below.

Further metallization includes four parallel rows of delay pads 134, 136, 138 and 140 and four parallel rows of reflectors 142, 144, 146 and 148. The two rows of reflectors 144 and 146 which are closest to the transducers are called the "front rows" whereas the more distant rows 142 and 148 are called the "back rows" of the transponder.

The bus bars 122 and 124 include contact pads 150 and 152, respectively, to which are connected the associated poles 154 and 156 of a dipole antenna. These two poles are connected to the contact pads by contact elements or wires 158 and 160, represented in dashed lines.

The embodiment of FIG. 13 is similar, in principle, to the embodiment of FIG. 12. The provision of four transducers 126, 128, 130 and 132 and two rows of reflectors 142, 144, 146, and 148 on each side of the transducers results in a total of sixteen SAW pathways of different lengths and, therefore, sixteen "taps". These sixteen pathways (taps) are numbered 0, 1, 2 . . . D, E, F, as indicated by the reference number (letter) associated with the individual reflectors. Thus, pathway 0 extends from transducer 126 to reflector 0 and back again to transducer 126 as shown in FIG. 9. Pathway 1 extends from transducer 128 to reflector 1 and back again to transducer 128. The spatial difference in length between pathway 0 and pathway 1 is twice the distance X (the offset distance between transducers 126 and 128). This results in a temporal difference of ΔT in the propagation time of surface acoustic waves.

Similarly, pathway 2 extends from transducer 126 to reflector 2 and back again to transducer 126. Pathway 3 extends from transducer 128 to reflector 3 and back to transducer 128. The distance X is chosen such that the temporal differences in the length of the pathway 2 with respect to that of pathway 1, and the length of the pathway 3 with respect to that of pathway 2 are also both equal to ΔT. The remaining pathways 4, 5, 6, 7 . . . E, D, F are defined by the distances from the respective transducers launching the surface acoustic waves to the associated reflectors and back again. The distance Y is equal to substantially three times the distance X so that the differences in propagation times between pathway 3 and pathway 4 on one side of the device, and pathway B and pathway C on the opposite side are both equal to ΔT. With one exception, all of the temporal differences, from one pathway to the next successive pathway are equal to the same ΔT. The SAW device is dimensioned so that ΔT nominally equals 100 nanoseconds.

In order to avoid the possibility that multiple back and forth propagations along a shorter pathway (one of the pathways on the left side of the SAW device as seen in FIG. 13) appear as a single back and forth propagation along a longer pathway (on the right side of the device), the difference in propagation times along pathways 7 and 8 is made nominally equal to 150 nanoseconds. Specifically, the nominal periods of propagation (tap delays) along each of the sixteen pathways, and the third signal (mixer) difference frequency resulting from each of these tap delays, are as follows:

| Pathway (Tap) | Tap Delay (nS) | Corresponding Frequency |
| --- | --- | --- |
| 0 | 900 | 1000 |
| 1 | 1000 | 1281 |
| 2 | 1100 | 1407 |
| 3 | 1200 | 1533 |
| 4 | 1300 | 1659 |
| 5 | 1400 | 1785 |
| 6 | 1500 | 1911 |
| 7 | 1600 | 2037 |
| 8 | 1750 | 2232 |
| 9 | 1850 | 2358 |
| A | 1950 | 2484 |
| B | 2050 | 2610 |
| C | 2150 | 2736 |
| D | 2250 | 2862 |
| E | 2350 | 2988 |
| F | 2450 | 3114 |

As shown in FIG. 11, a wavefront produced by reflections from the leading and trailing edges of these fingers will be formed by the superposition of a first wave reflected from the first leading edge and successive waves reflected from successive edges and having differences in phase, with respect to the first wave, of $-\lambda/4$, $\lambda/2$, $-3\lambda/4$, $\lambda$, etc. As may be seen, the wave components having a phase $-\lambda/4$, $\lambda/2$ and $-3\lambda/4$ effect a cancellation, or at least an attenuation of the wave component reflected from the leading edge.

The interdigital fingers of the transducers may be split in the manner illustrated in FIG. 11 to reduce reflections.

Conventional interdigital finger transducers of the type shown in FIG. 10, which are constructed to operate at a fundamental, resonant frequency of 915 MHz, have a finger width ($\lambda/4$) of approximately 1 micron: a size which approaches the resolution limit of certain photolithographic fabrication techniques (the selective removal of metallization by (1) exposure of photoresist through a mask and (2) subsequent etching of the metallized surface to selectively remove the metal between and outside the transducer fingers). If the fingers are split, as shown in FIG. 11, the width of each finger ($\lambda/8$) for a fundamental frequency of 915 MHz would be approximately ½ micron. The size would require sophisticated photolithographic fabrication techniques.

In order to increase the feature sizes, the transducers in the transponder are constructed with a resonant frequency f(0) of 305 MHz. In this case, the width of each finger is three times larger than transducer fingers designed to operate at 915 MHz, so that the width ($\lambda/8$) of the split fingers shown in FIG. 11 is approximately 1½ microns. This is well within the capability of typical photolithographic fabrication techniques.

Although the transducers are constructed with a resonant frequency of 305 MHz, they are nevertheless driven at the interrogation frequency of approximately 915 MHz; i.e., a frequency 3f(0) which is the third harmonic of 305 MHz.

FIG. 12 is a diagram showing the energy converted (electrical energy to SAW energy and vice versa) by the transducers employed in the passive SAW transponder of FIGS. 8 and 9. As may be seen, the transducer energy has a sin x/x characteristic 170 centered about the fundamental frequency $f_0$ and the odd harmonics: $3f_0$, $5f_0$, etc. The peak of the sin x/x function falls off abruptly with higher harmonics as indicated by the dashed line 172. The transducers do not couple any energy into or out of the piezoelectric crystal at the even harmonics ($2f_0$, $4f_0$ . . . ).

The energy converted by a transducer, when driven in its third harmonic $3f_0$ (915 MHz), is about ⅓ of the energy that would be converted if the transducer were driven at its fundamental frequency $f_0$ (305 MHz). Accordingly, it is necessary to construct the transducers to be as efficient as possible within the constraints imposed by the system. As is well known, it is possible to increase the percentage of energy converted, from electrical energy to SAW energy and vice versa, by increasing the number of fingers in a transducer. In particular, the converted signal amplitude is increased by about 2% for each pair of transducer fingers (either conventional fingers or split fingers) so that, for 20 finger pairs for example, the amplitude of the converted signal will be about 40% of the original signal amplitude. Such an amplitude percentage would, be equivalent to an energy conversion of about 16%. In other words, the energy converted will be about 8 db down from the supplied energy.

The addition of finger pairs to the transducers therefore advantageously increases the energy coupling between electrical energy and SAW energy. However, as explained above in connection with FIGS. 1 and 3, the system according to the invention operates to excite the transducers over a range of frequencies between 905 MHz and 925 MHz. This requires the transducers to operate over a 20–25 MHz bandwidth: a requirement which imposes a constraint upon the number of transducer finger pairs because the bandwidth of a transducer is inversely proportional to its physical width. This relationship arises from the fact that the bandwidth is proportional to $1/\tau$, where $\tau$ is the SAW propagation time from one side of the transducer to the other (the delay time across the transducer).

For a transducer driven at its third harmonic of 915 MHz, the spacing between successive fingers (single fingers or split fingers) is $3\lambda/2$, where $\lambda$ is the SAW wavelength at 915 MHz. Such a transducer will therefore be three times as wide as a transducer having the same number of finger pairs but which is designed with a finger pair spacing of $\lambda/2$ for a fundamental of 915 MHz.

Therefore, a transducer driven at its third harmonic will have ⅓ the number of finger pairs for a given bandwidth than a transducer, also driven at that same frequency, which operates at its fundamental or resonant frequency.

FIG. 13 illustrates the transducer structure according to the invention which is designed to maximize energy coupling while providing a frequency bandwidth of approximately 25 MHz at around 915 MHz. This diagram is representational, insofar as the individual fingers of the transducer are drawn as single lines. It will be understood, however, that these fingers are formed of metallization with a prescribed width as illustrated in FIG. 11.

The entire transducer is constructed with split fingers as shown in the lefthand section "A" of FIG. 13. For clarity, however, the split fingers in the righthand section "B" have been represented as single lines. As indicated above, each half finger in the transducer of FIG. 13 has a width of $\lambda_0/8$, where $\lambda_0$ is the SAW wavelength at the transducer fundamental frequency of 305 MHz. Stated another way, the width of each half finger in a split finger pair is $3\lambda/8$, where $\lambda$ is the wavelength of the third harmonic at 915 MHz.

As shown at the top of FIG. 13, the transducer is divided into several separate sections: a central section 180, two flanking sections 182 and two outer sections 184. The central section 180 is comprised of interdigital transducer fingers which are alternately connected to two outer bus bars 186 and to a central electrical conductor 188. This central section comprises a sufficient number of finger pairs to convert a substantial percentage of electrical energy into SAW energy and vice versa. By way of example and not limitation, there may be 12 finger pairs so that the converted amplitude is approximately 24% of the incoming signal amplitude.

Flanking the central section, on both sides, are sections 182 containing "dummy" fingers; that is, fingers which are connected to one electrode only and therefore serve neither as transducers nor reflectors. The purpose of these fingers is to increase the width of the transducer so that the outer sections 184 will be spaced a prescribed distance, or SAW delay time, from the central section 180. For example, there may be 7 dummy fingers (or, more particularly, split fingers) in each of the sections 182.

Figure 22:
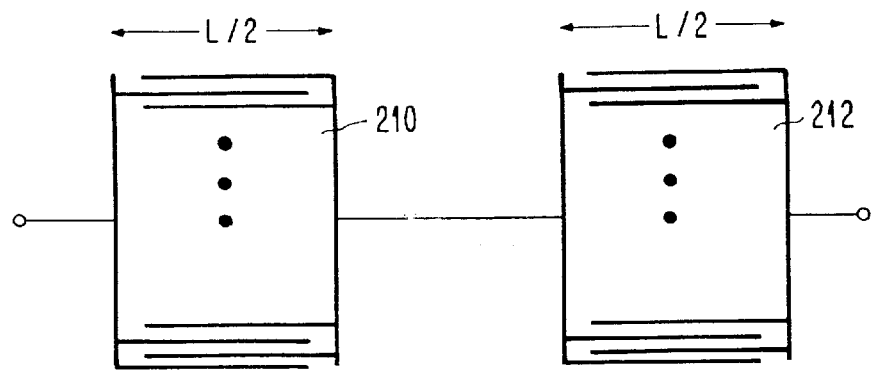
FIG. 22 is a representational diagram of two transducers connected in series.

Finally, each of the outer sections 184 of the transducer contains a single transducer finger pair which is used to shape the bandwidth of the transducer of FIG. 13. Referring to FIG. 22 illustrating the coupling response of the transducer of FIG. 13, there is shown the usual sin x/x function 190 that corresponds to the center section 180 and two sin x/x functions 194 that correspond to the outer transducer sections 184. When superimposed, the functions 190 and 194 produce a combined frequency characteristic 200 having a widened, and substantially flat upper portion 202 and steeply sloping sides 204. As a consequence, the bandwidth of the transducer of FIG. 13 is increased to the required 25 MHz.

According to still another feature of the present invention, the transducer of FIG. 13 is constructed to closely match the impedance of the dipole antenna 154, 156 to which it is connected. This impedance match maximizes the transfer of energy between the radiation transmitted to and from the antenna and the acoustic energy within the SAW device.

The impedance of a SAW transducer comprises a relatively large capacitance created by its interdigital fingers plus a small ohmic resistance. With a conventional transducer, this capacitance is several times greater than the reactive impedance (inductance and capacitance) of a microwave dipole antenna designed to operate a 915 MHz. In order to overcome this mismatch, "complex conjugate" matching is employed so that the reactive components in the impedance of both the antenna and the transducers substantially cancel each other. This is accomplished by constructing each transducer as two serially connected partial transducers.

FIG. 22 shows two partial transducers 210 and 212 connected in series. If we assume that a conventional transducer having interdigital fingers of total width length L has a capacitance of $C_0$, then the capacitance of each of the transducers 210 and 212, which have total finger widths of L/2, will be $C_0/2$. The capacitance, X, of the series connected transducer circuit is therefore:

$$2/C_0 + 2/C_0 = 1/X$$

$$X = C_0/4$$

By dividing a conventional transducer into two, serially connected partial transducers, the capacitance of the circuit is reduced by ¼.

Figure 23:
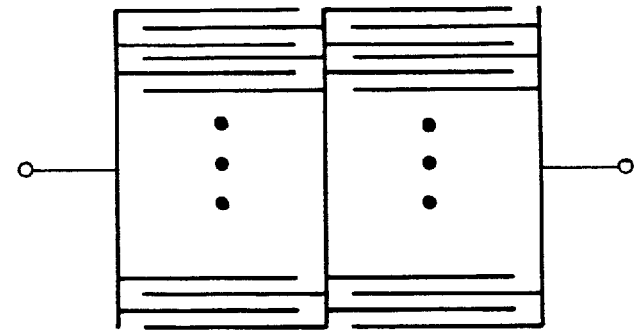
FIG. 23 is a representational diagram of a single transducer formed of two separate transducers connected in series.
Figure 24:
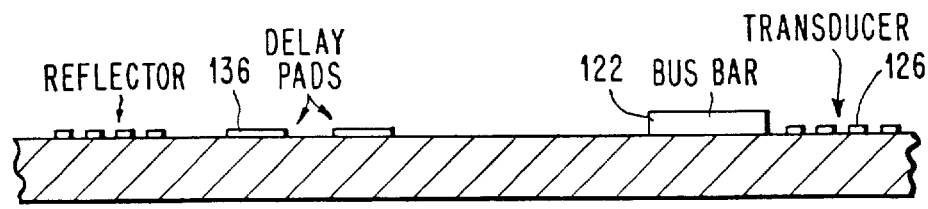
FIG. 24 is a cross-sectional view, greatly enlarged, of a section of the transducer illustrated in FIGS. 6 and 7.

FIG. 23 illustrates how the two partial transducers 210 and 212 are combined, in the manner also shown in FIG. 13, to form a single transducer.

Since, according to the invention, the reactive components of the antenna 154, 156 and the four, parallel connected transducers 126, 128, 130 and 132 are closely matched, the power loss within the transponder is limited to the non-reactive (i.e., heat) losses within the antenna, the four transducers and the two bus bars 122 and 124. In this case, the power coupled into the SAW device is directly proportional to the total resistance according to the formula:

$$P = r_{total} i^2$$

where the current i remains constant from a "complex conjugate" matched circuit and $r_{total}$ is given by:

$$r_{total} = r_\Omega + r_a$$

$r_\Omega$ in this formula is the total ohmic electrical resistance in the antenna, bus bars and transducers and $r_a$ is the equivalent resistance (heat loss) due to the energy coupled into the SAW device substrate.

In order to maximize the energy coupled into the SAW device, it is desirable to decrease the ohmic resistance r$\Omega$ so as to reduce the loss ratio:

$$r_a/r_t = 1/(r_\Omega/r_a + 1)$$

Particularly when $r_\Omega$ is approximately the same order of magnitude as $r_a$ so that the loss ratio is as low as ½, the value of $r_\Omega$ is a significant factor in the power response of the transponder.

Therefore, the bus bars 122 and 124 are made considerably thicker than the other metallized elements on the SAW device substrate in order to reduce their ohmic resistance. These bus bars are also made as wide as possible for the same reason, although the width is not nearly as critical as the thickness in determining resistance.

The thickness of the bus bars is limited by the effect that non-uniformities in thickness may have on the respective phases of the surface acoustic waves which travel back and forth beneath these bus bars. As the buts bar thickness increases, it becomes more difficult to maintain uniformity so that variations in phase, due to differences in mass loading between the various paths of travel, may occur.

Figure 16:
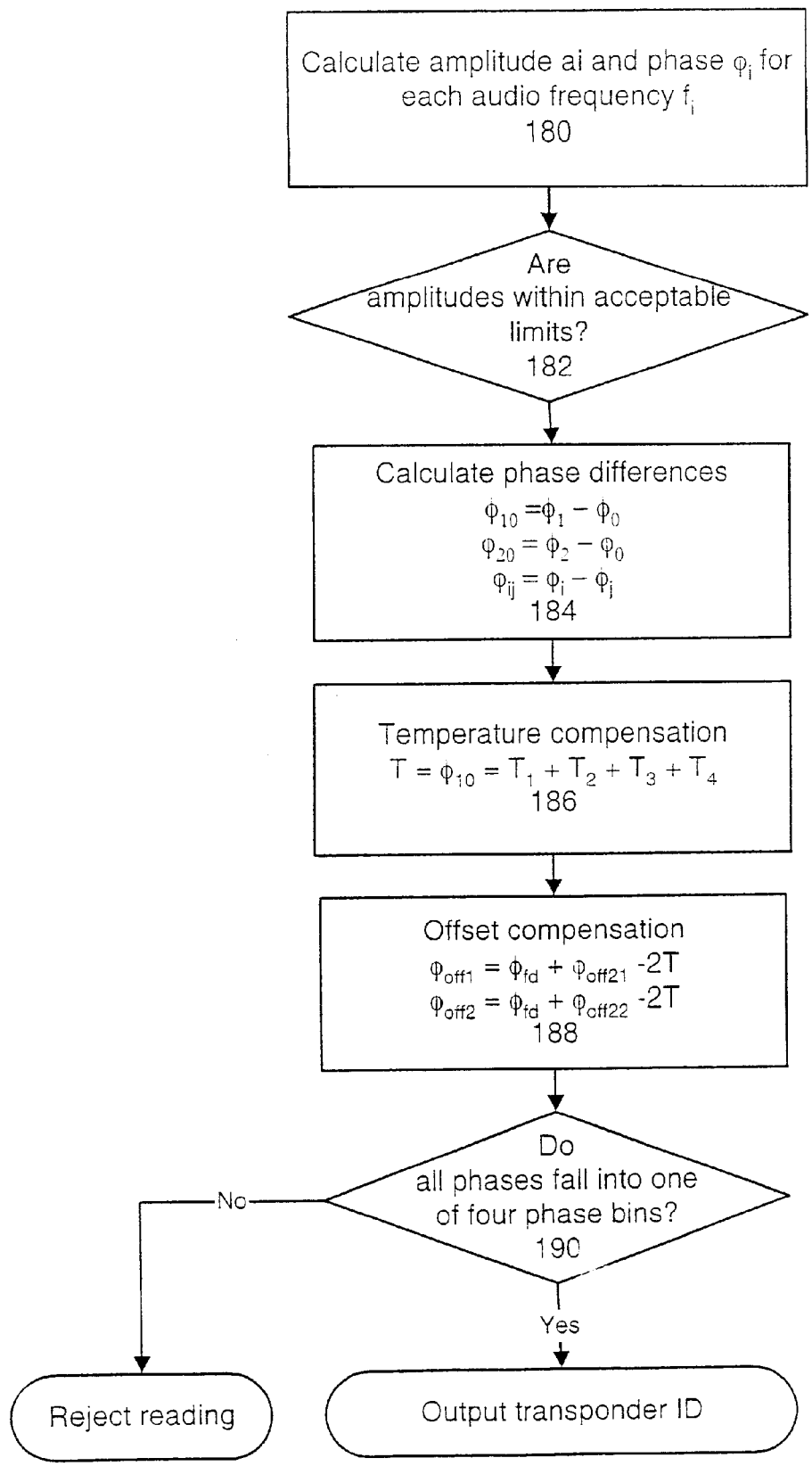
FIG. 16 is a flow diagram showing the order of calculations carried out by the signal processor and microprocessor in the system of FIG. 1.
Figure 17:
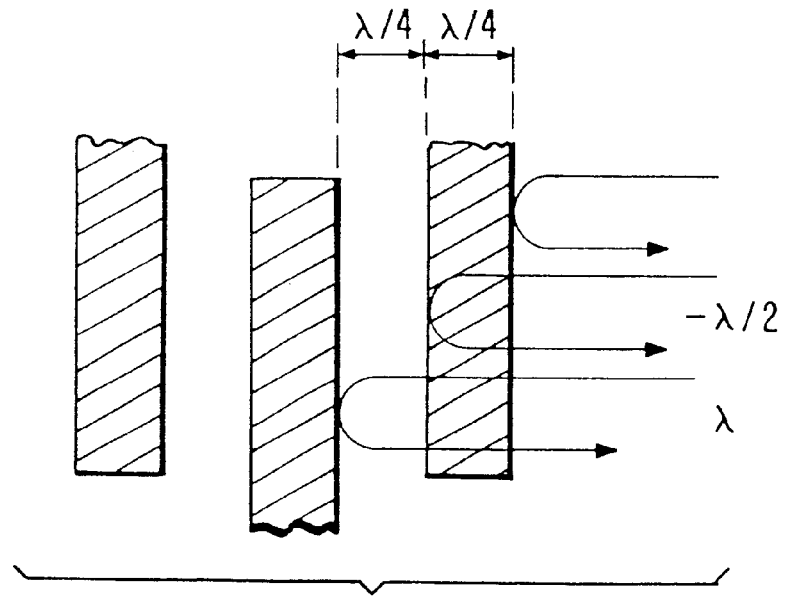
FIG. 17 is a diagram illustrating SAW reflections from conventional transducer fingers.
Figure 18:
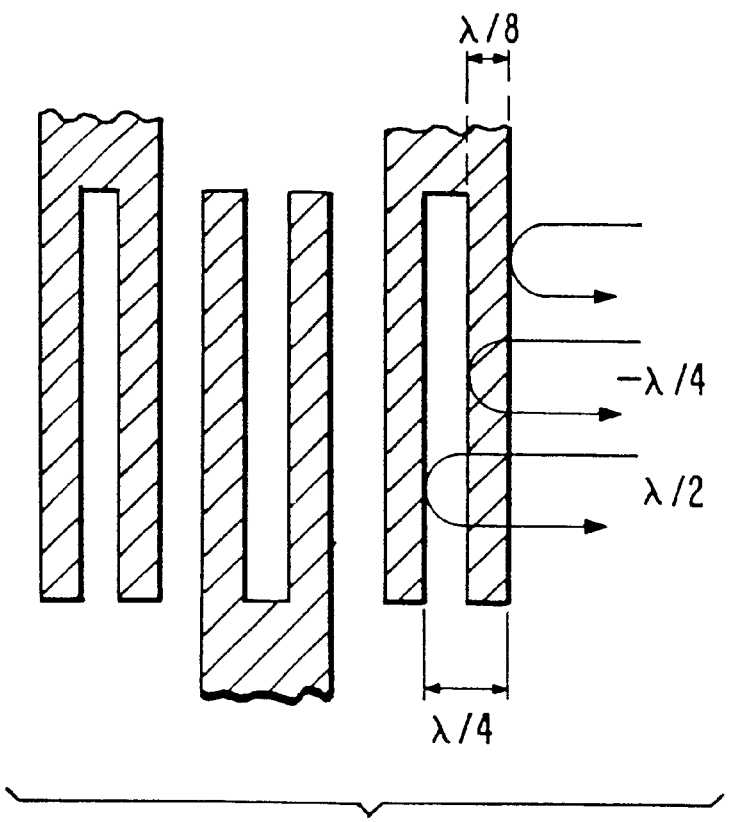
FIG. 18 is a diagram illustrating SAW reflections from split transducer fingers, according to the invention.

The bus bars 122 and 124 are made approximately twice as thick as the other metallized elements on the substrate, as represented in the cross-sectional view of FIG. 16. Specifically, the transducers, delay pads and reflectors are formed by depositing 1000 Angstroms of aluminum on the substrate, whereas the bus bars are formed by depositing 2000 Angstroms of aluminum over 300 Angstroms of chromium. The chromium provides a good bond between the aluminum and the lithium niobate surface.

In practice, the metallization is deposited on the substrate surface using a two-layer photolithographic process. Two separate reticles are used in forcing the photolithographic image: one reticle for the transducers, reflectors and phase pads as well as the alignment marks on the substrate, and a separate reticle for the bus bars.

Figure 25:
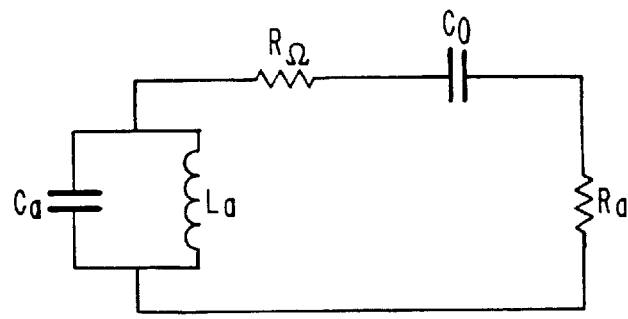
FIG. 25 is an equivalent circuit diagram showing the resistance and capacitance of a SAW transducer.

FIG. 25 illustrates the equivalent circuit of the transponder. Shown at the left of the diagram are the capacitance $C_a$ and inductance $L_a$ of the dipole antenna. This reactive impedance is matched, as closely as possible to the reactive impedance $C_0$ of the four transducers so that only the resistance losses $r_\Omega$ and $r_a$ affect the coupling. Also the oluic resistance $r_\Omega$ is reduced as much as possible by increasing the thickness and width of the bus bars.

Figure 26:
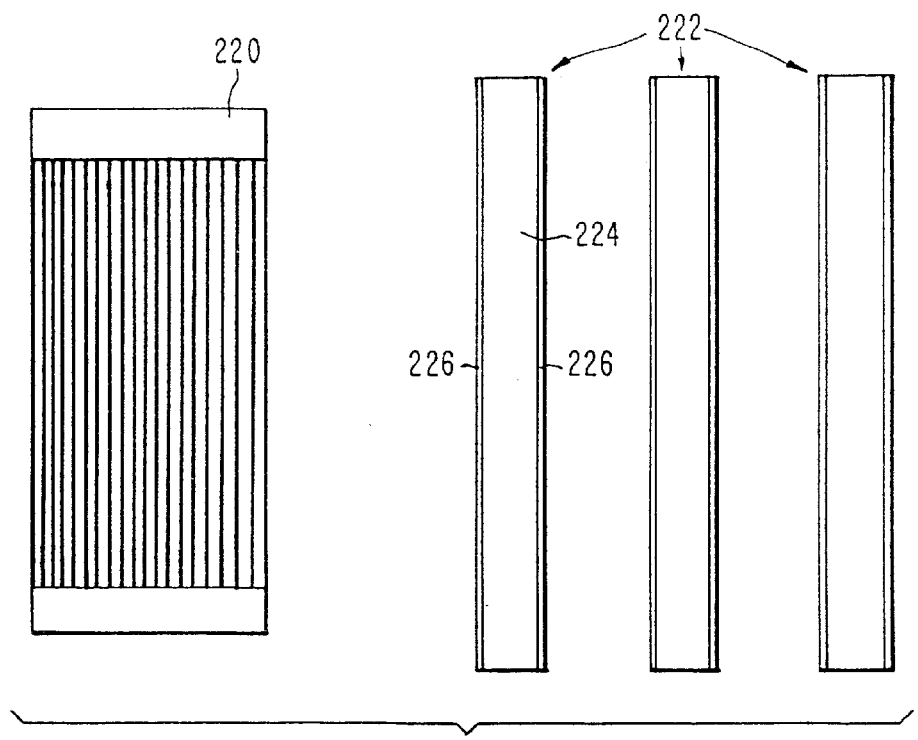
FIG. 26 is a plan view, in greatly enlarged scale, of a reflector and three delay pads in the transducer configuration of FIGS. 6 and 7.

FIG. 26 shows, in enlarged scale, a single reflector 220 and three delay pads 222. Each of the delay pads is illustrated as having a central metallized portion 224 and two edge portions. The edge portions 226 of the delay pads, as well as the lateral edges of the bus bars 122 and 124 (i.e., the edges transverse to the SAW paths of travel) are provided with two levels of serrations to substantially reduce SAW reflections from these edges.

Figure 27:
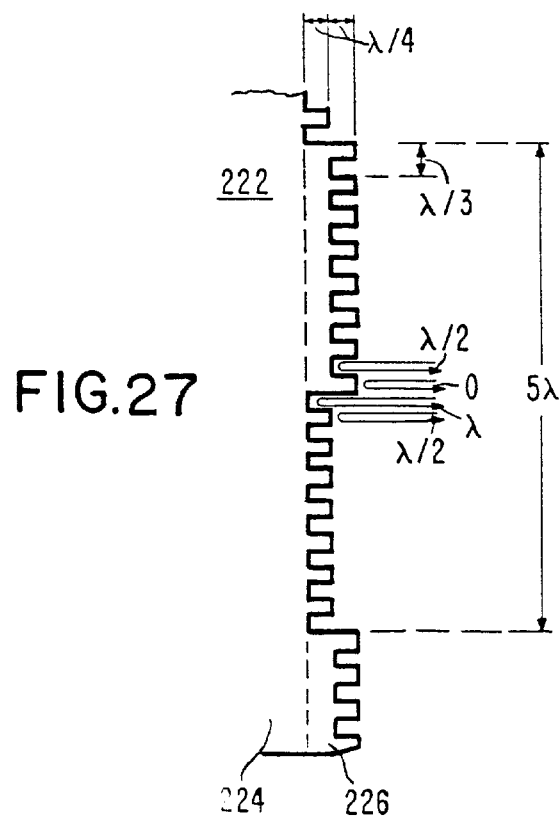
FIG. 27 is a plan view, in greatly enlarged scale, of the edge of a delay pad showing anti-reflection serrations.
Figure 28:
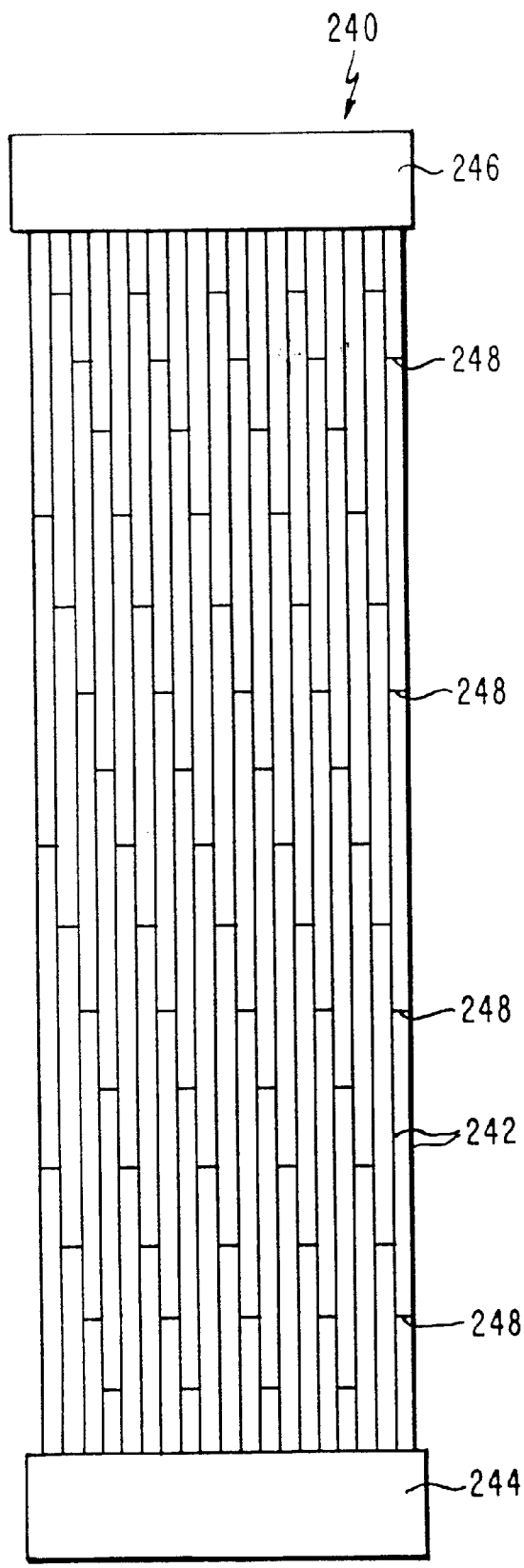
FIG. 28 is a plan view, in greatly enlarged scale, of a reflector having numerous short circuits between the respective reflector fingers.

FIG. 27 illustrates the lower right-hand corner of a delay pad 222 in greatly enlarged scale. As may be seen, the serrations comprise two superimposed "square waves" having the same pulse height but different pulse periods. The pulse height for both square waves is $\lambda/4$. By way of example and not limitation, the pulse period is $\lambda/3$ for one square wave and 6 $\lambda$ for the other, where $\lambda$ is the SAW wavelength at 915 MHz.

Figure 19:
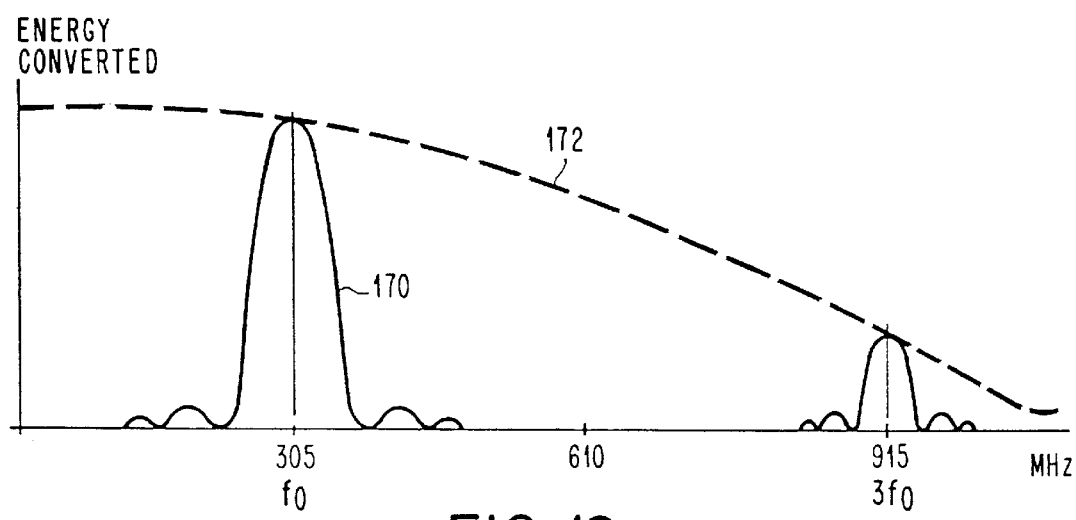
FIG. 19 is a diagram illustrating the energy converted by a SAW transducer at its fundamental (resonant) frequency and at its third harmonic.
Figure 20:
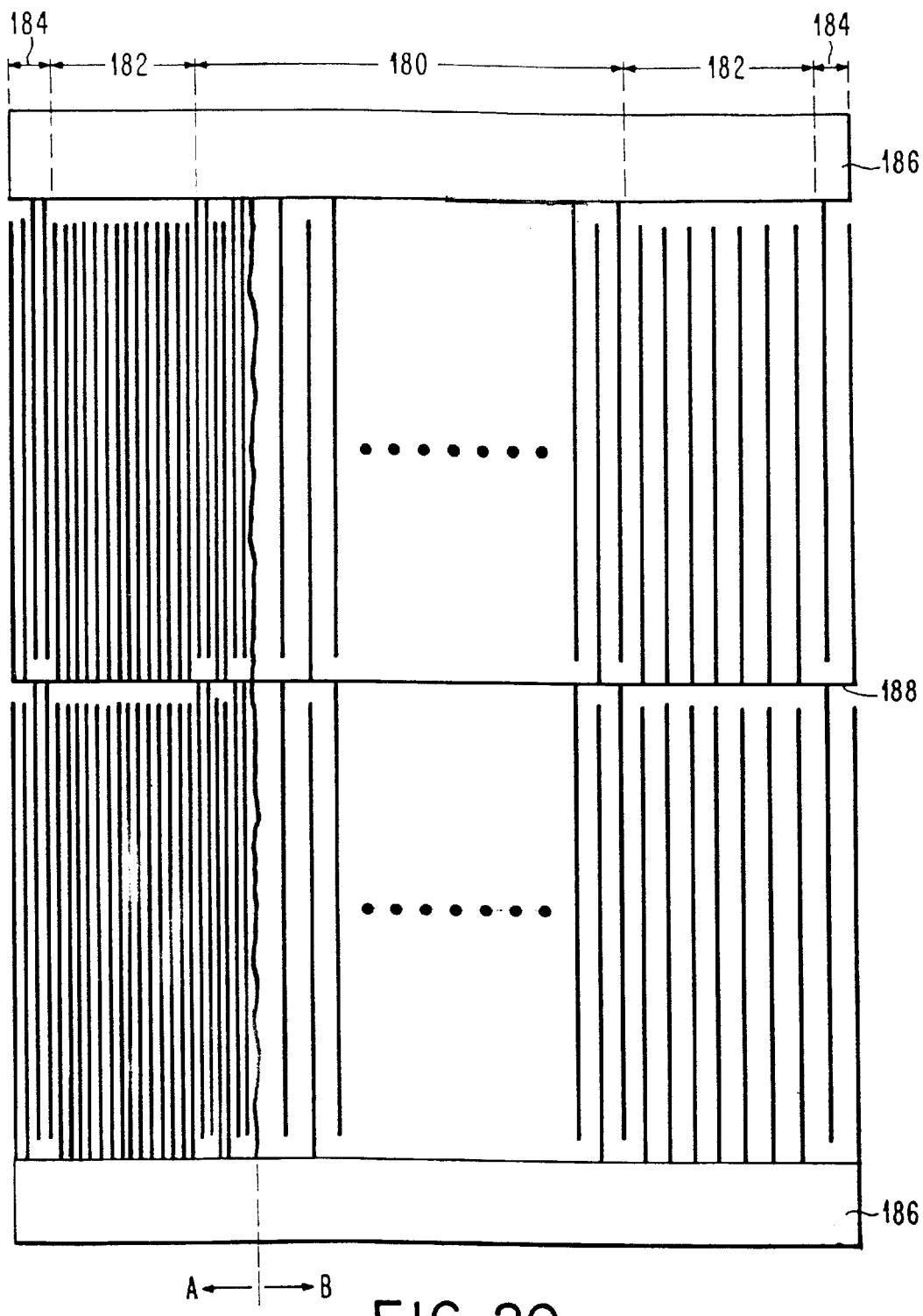
FIG. 20 is a representational diagram, in plan view, of a launch and/or receiving transducer of the type employed in the transponder of FIGS. 5–14.
Figure 21:
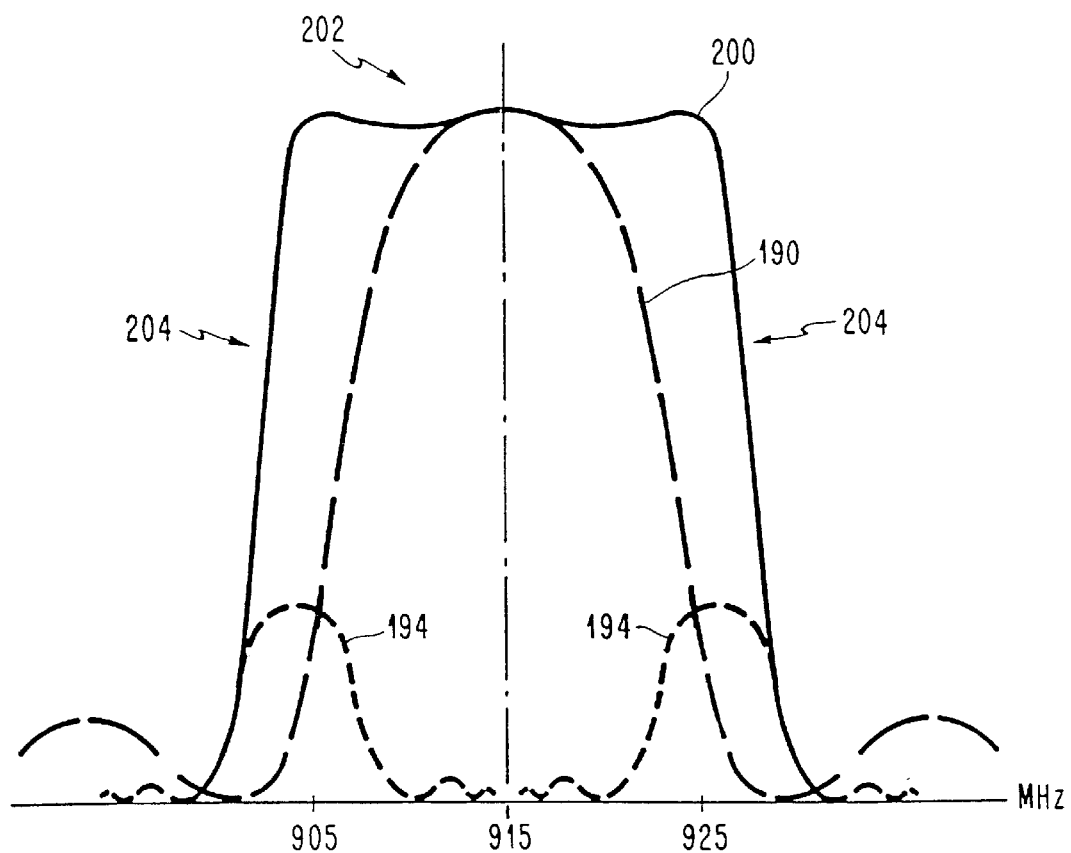
FIG. 21 is a diagram showing the operational bandwidth of the transducer of FIG. 13.

The affect of the serrations in canceling reflections is indicated at the center of FIG. 19. Shown there are the SAW reflections from the various levels of the delay pad edge. It will be understood that the wavefronts of reflections having phases of $\lambda/2$ will be equal and opposite in phase to the reflected wavefronts having phases of 0 and $\lambda$.

The first level of serrations serves to reduce reflections, while the second level serves to break up the average reflection plane.

Unlike the transducers, the reflectors 0, 1, 2 . . . E, F used in the embodiment of FIGS. 8 and 9 are designed for a fundamental frequency of 915 MHz. Therefore, the distance between successive reflector fingers is $\lambda/2$ and the width of each finger is approximately $\lambda/4$, where $\lambda$ is the SAW wavelength at 915 MHz. Each reflector has, for example, a total of 20 fingers.

Figure 14:
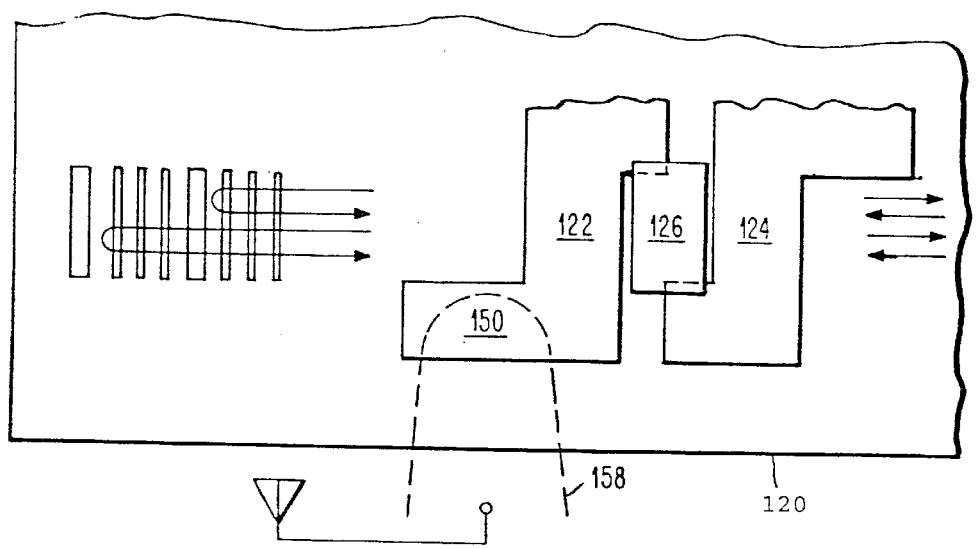
FIG. 14 is a plan view, in greatly enlarged scale, of a portion of the transponder configuration shown in FIG. 13.

FIG. 14 illustrates a particular reflector 240 which may be employed as reflectors 0, 1, 2, . . . , E, F in the embodiment of FIG. 8. The reflector 240 comprises a plurality of fingers 242 (in this case 20) connected between two shorting bus bars 244 and 246. Each two successive fingers are also shorted at one or more locations between the bus bars. Thus, in the embodiment shown, the two fingers 242 on the right-hand side of the reflector are shorted at four locations by interconnecting metallization 248. The shorts between successive fingers reduce energy loss due to ohmic resistance of the fingers and render the reflector less susceptible to fabrication errors.

As noted above, the distance between successive fingers in the reflector must be equal to $\lambda/2$, where $\lambda$ is the SAW wavelength at 915 MHz. Consequently, the width of each finger must be somewhat less than $\lambda/2$: for example, approximately $\lambda/4$ or about 1 micron. Such a finger width nudges the lower boundary of conventional photolithographic fabrication techniques so that one or more fingers of a reflector may, in practice, be interrupted along their length. The short circuit bridges between successive fingers make it possible to retain the functions of all fingers of a reflector, although one or more fingers may not extend the entire distance between the bus bars 244 and 246.

In summary, the present invention provides a number of features in a passive SAW transponder which (1) reduce interference caused by unwanted SAW reflections in the transponder substrate and (2) increase the percentage of energy coupled into and out of the substrate.

Figure 15:
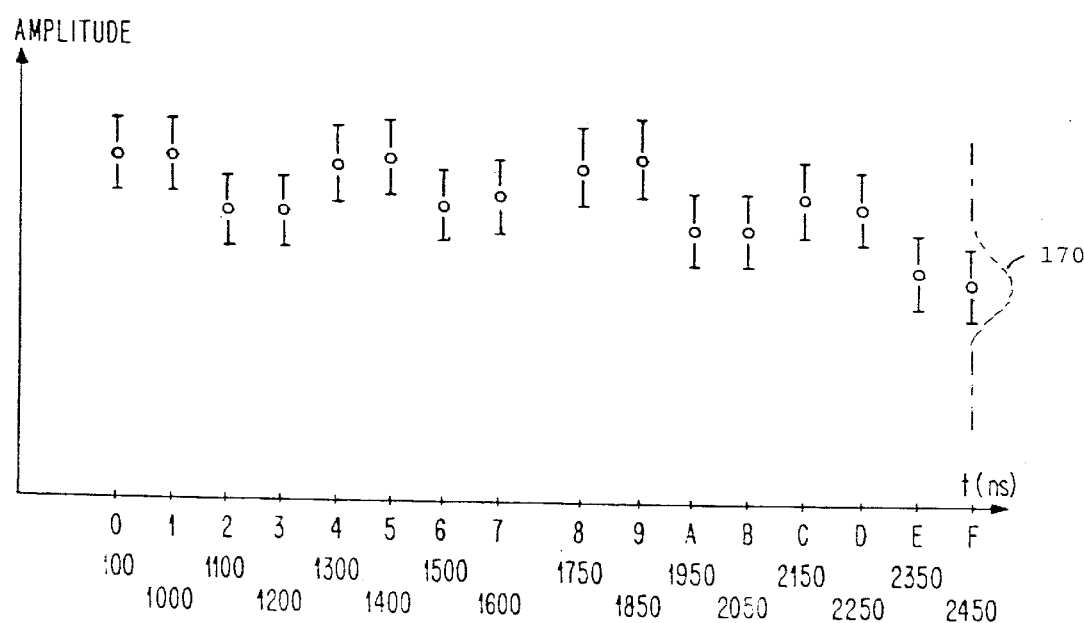
FIG. 15 is a diagram showing the respective time delays of the different SAW pathways in the transponder of FIG. 13.

FIG. 15 is a graph illustrating the ranges of amplitudes which are expected in the F individual components of the second (reply) signal associated with the respective pathways or tap delays 0-F. As may be seen, the greatest signal amplitudes will be received from pathways having reflectors in their front rows; namely, pathways 0, 1, 4, 5, 8, 9, C and D. The signals received from the pathways having reflectors in their back rows are somewhat attenuated due to reflections and interference by the front row reflectors. If any one of the amplitudes $a_i$ at one of the sixteen frequencies $f_i$ in the third signal falls outside its prescribed range, the decoded identification number for that transponder is rejected.

As indicated above, transponders of the type illustrated in FIGS. 6–13 are susceptible to so-called "manufacturing"

variations in response, due to manufacturing differences from transponder to transponder, as well as temperature variations in response due to variations in ambient temperature. Particularly the case where small differences in tap delays in the order of one SAW cycle period are measured to determine the encoded transponder identification number, these manufacturing and/or temperature variations can be in the order of magnitude of the informational signal. It is desirable, therefore, to provide systems for compensating both manufacturing and temperature variations. Such systems will now be described in connection with the embodiment of FIGS. 1 and 13.

As explained above, the transponder identification number contained in the second (reply) signal is determined by the presence or absence of delay pads in the respective SAW pathways. These delay pads make a slight adjustment to the propagation time in each pathway, thereby determining the phase of the surface acoustic wave at the instant of its reconversion into electrical energy at the end of its pathway. Accordingly, a fixed code phase) is imparted to at least two pathways in the SAW device, and the propagation times for these pathways are used as a standard for the propagation times of all other pathways. Likewise, in a reflector-based acoustic device, a reflector may be provided at a predetermined location to produce a reference signal.

The mask variation $\Delta M_i$ for a given pathway, i.e., a variation in tap delay due to imperfections in the mask—will be the same for all transponders made from the same mask.

The time variations $\Delta O_i$ is the so-called "offset" variation which is primarily due to variations in the interdigital finger line widths of a reflector in the front row through which the surface acoustic waves must pass to reach a reflector i in the back row. Variations in transducer finger line widths are already reflected in the initial pathway propagation time $T_0$.

Since the time variations $\Delta R_i$ are completely random from pathway to pathway and from transponder to transponder, it is not possible to compensate for these. If a random variation $\Delta R_i$ becomes too large, however, the transponder identification number reading will be rejected, since one of the amplitudes $a_i$ or phases $\phi_i$ will fall outside of the acceptable limits.

It may be seen, there are primarily three types of variations which must be compensated:
(1) Variations due to temperature which are reflected in large changes in the propagation times $T_0$ and $\Delta T$. These temperature variations are substantially (but not exactly) the same for each pathway.
(2) Mask variations $\Delta M$ which are different for each pathway but the same for all transponders manufactured from a given mask.
(3) Offset variations $\Delta O$ which are primarily due to the effect of variations in the one widths offprint row reflectors on the pathways to back row reflectors. These variations are traceable to the manufacturing process (such as the mask exposure time) and are normally the same for all parallel front row reflectors on one side of a transponder substrate. The line widths may vary from one side of the substrate to the other due to lack of orthogonality in the mask exposure.

The three types of variations identified above—namely, temperature, mask and offset variations—are compensated as follows:
(1) Temperature variations are compensated by determining the times $T_0$ and $\Delta T$ from two successive pathways i and j to provide a first temperature estimate, and then compensating small, second order variations by averaging the propagation times of the four front row pathway pairs (pathways 0 and 1, 4 and 5, 8 and 9 and C and D).

(2) The variation $\Delta M$, which relates to the mask, will be the same for all transponders made from the same mask. Consequently, this variation may be isolated and compensated for by determining the amplitudes $a_i$ and phases $\phi_i$ for a large number of transponders, and thereafter determining statistically the acceptable limits for these parameters. By way of illustration, the amplitudes $a_i$ from different transponders made from the same mask for each frequency $f_i$ may be plotted on a graph such as that shown in FIG. 15 to determine their statistical distribution. The acceptable limits of amplitude may then be determined for each frequency from this statistical distribution. FIG. 15 shows one such distribution curve 170 of amplitudes for the frequency 2.45 kHz (pathway F).

Variations in the phases $\phi_i$ of different transponders traceable to the mask are compensated in a similar manner by adjusting the center phases (nominally 0°, 90°, 180° and 270°) and the phase tolerances (nominally +/−30° about each center phase) for each "phase bin".

After the initial compensation for mask variations $\Delta M$, all subsequent masks used to manufacture transponders may be adjusted so as to match the imperfections in the original mask. The mask variations $\Delta M$ are therefore caused to remain identical for all transponders used in a given system.
(3) Finally, offset variations $\Delta O$, which are traceable to manufacturing process variations, are compensated by determining $\Delta O_F$ and using this value as a standard to eliminate the effect of offset in all the "back row" pathways; i.e., pathways 2, 3, 6, 7, 4, B and E.

The entire process of compensation is illustrated in the flow chart of FIG. 16. As is indicated there, the first step is to calculate the amplitude $a_i$ and phase $\phi_i$ for each audio frequency $\phi_i$ (block 180). Thereafter, the sixteen amplitudes are compared against their acceptable limits (block 182). As shown in FIG. 15, these limits may be different for each amplitude. If one or more amplitudes fall outside the acceptable limits, the transponder reading is immediately rejected.

If the amplitudes are acceptable, the phase differences $\phi_{ij}$ are calculated (block 184) and the temperature compensation calculation is performed to determine the best value for $\Delta T$ (block 186). Thereafter, the offset compensation calculation is performed (block 188) and the phases for the pathways 2, 3, 6, 7, A, B and E are adjusted.

Finally an attempt is made to place each of the pre-encoded phases into one of the four phase bins (block 190). If all such phases fall within a bin, the transponder identification number is determined, if not, the transponder reading is rejected.

ACTIVE TRANSPONDER—FIRST EMBODIMENT

Typical semiconductor memory active tag system are described in U.S. Pat. Nos. 4,739,328; 4,782,345; 5,030,807; 4,999,636; 5 479,160; 3,914,762; 5,485,520; 4,123,754; 5,086,389; 5,310,999; 4,864,158; 4,853,705; 4,816,839; 5,055,659; 4,835,377; 4,912,471; 4,358,765; 4,075,632; and 3,984,835 incorporated herein by reference.

U.S. Pat. No. 4,739,328 provides a system which interrogates an active semiconductor memory tag, as shown in FIGS. 30 and 39–43. The system produces pluralities of cycles of signals at first and second harmonic frequencies. The cycles of the signals identifying a binary "1" are symmetrical to the signals identifying a binary "0". In other words, the cycles at the second frequency occur before a cycle at the first frequency to represent a binary "1" and the cycle at the first frequency occurs before the cycles at the second frequency to identify a binary "0". A code is also provided, different from a "1" or a "0", indicating the end of the transmission of signal cycles. The system also provides a generation of clock signals on a self-synchronizing basis regardless of the patterns of binary 1's and binary 0's transmitted to the reader. This facilitates the detection by the reader on a straightforward and reliable basis of the sequence of binary 1's and binary 0's identifying the object. In other words, the data transmission format supports an efficient clock recovery system.

The reader receives the signal cycles identifying the object and delays these signal cycles by (a) a first time such as one fourth (¼) of the period of a cycle at the second frequency, (b) a second time such as one half (½) of such period and (c) a third time such as such one (1) such period. The reader compares the received signal cycles and the first delayed signal cycles to produce first phase-locked signals for generating the clock signals. The reader compares the received signal cycles and the second delayed signal cycles to produce additional phase-locked signals at the times that the first phase-locked signals for generating the clock signals are not produced. The reader then produces clock signals from the first and additional phase-locked signals. The reader also produces information signals from a comparison of the received signal cycles and the third delayed signal cycles.

A source 410 of interrogating RF signals is connected to an antenna 412 at a reader generally indicated at 414. The interrogating RF signals from the source 410 may have a suitable frequency such as 915 MHz. When the source 410 of interrogating RF signals is energized, the antenna 412 transmits activating signals to a suitable antenna 416 (such as a dipole antenna) at a transponder generally indicated at 418. The transponder 418 is located at an object (not shown) to identify the object. The transponder includes a data source such as a read-only memory 422 which provides a sequence of binary 1's and binary 0's in an individual pattern.

A binary "1" in the read-only memory 422 causes a modulator 420 to produce a first plurality of signal cycles and a binary "0" in the read-only memory 422 causes the modulator 420 to produce a second plurality of signal cycles different and distinguishable from the first plurality of signals. The pluralities of signal cycles sequentially produced by the modulator 420 to represent the pattern of binary 1's and binary 0's identifying the object are introduced to the dipole 416 for transmission to the antenna 412 at the reader.

The antenna 412 introduces the received signals to a mixer 426 for comparison in the mixer with the interrogating RF signals from the source 410. The mixed signals are introduced to an amplifier 428 and are demodulated in a demodulator 430. The demodulator produces signals in a sequence having a pattern identifying the pattern of 1's and 0's in the read-only memory 422 at the transponder.

A reader, generally indicated at 424, is shown in detail in FIGS. 39a, 39b, 39c and 39d and may be considered to be similar in some details to that shown in FIG. 30 and described above. The signals are transmitted by the dipole 416 in FIG. 30 to an antenna 426 (FIG. 39a) and are introduced to mixers 432 and 434. The interrogating RF signals from a source 430 (corresponding to the source 410 in FIG. 30) are also introduced to the mixer 432 and are shifted in phase by 90° at 436 and are then introduced to the mixer 434. The signals from the mixers 432 and 434 are respectively amplified linearly at 440 and 442 and are then introduced to a mixer or third channel combiner 444, The signals from the amplifiers 440 and 442 and from the mixer 444 are respectively introduced to amplifiers 446, 448 and 450, each of which provides a high gain and then a limitation in amplitude after providing such high gain.

The signals from the limiting amplifiers 446, 448 and 450 respectively pass to shift registers (FIGS. 39b) 454 and 456 in series, 458 and 460 in series and 462 and 464 in series. The signals at mid points in the shift registers 454, 458 and 462 respectively pass to exclusive OR gates 466, 468 and 470. Signals are also respectively introduced to the input terminals of the exclusive OR gates 466, 468 and 470 from the output terminals of the limiting amplifiers 446, 448 and 450.

Figure 39A:
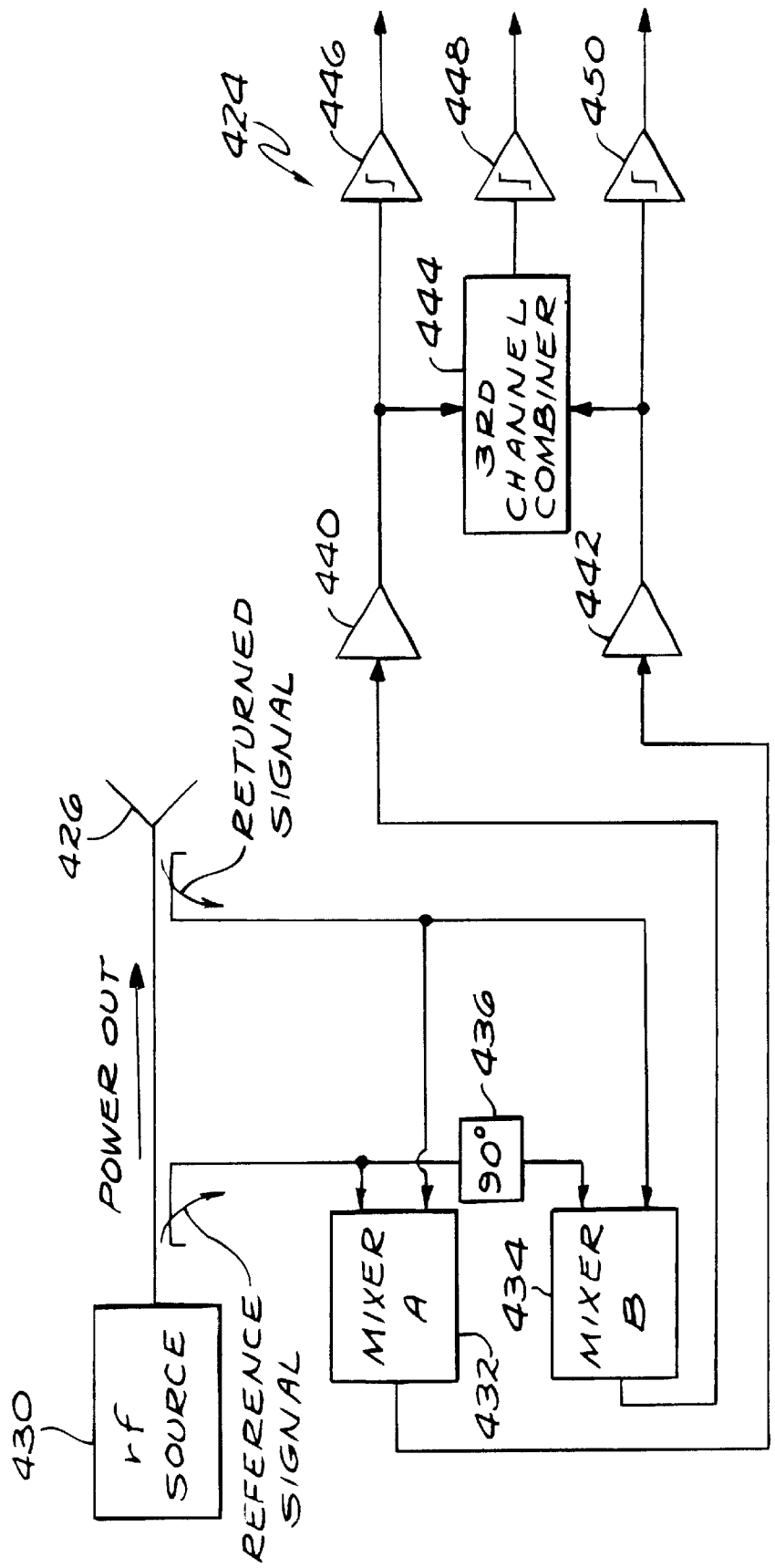
Figure 39B:
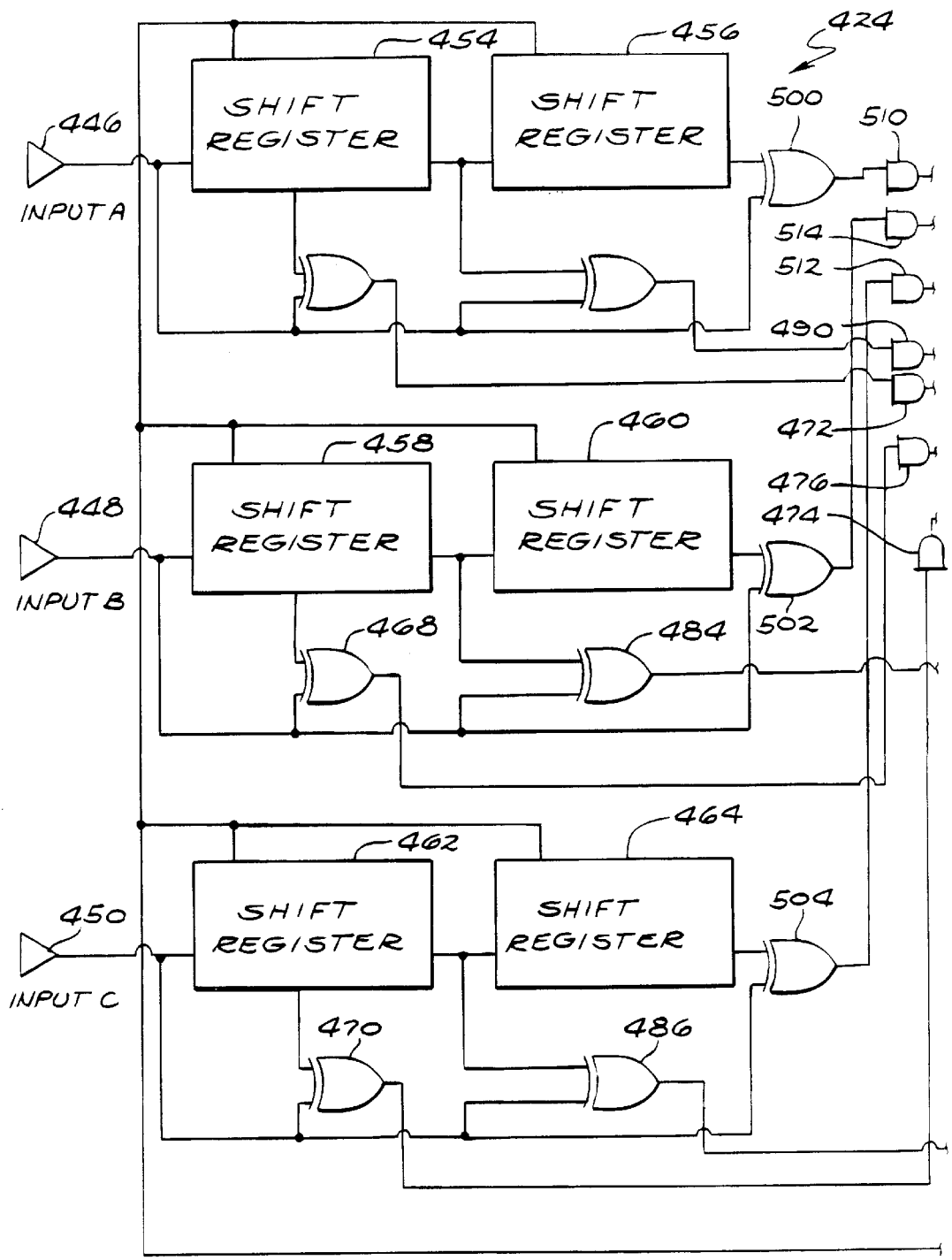
Figure 39C:
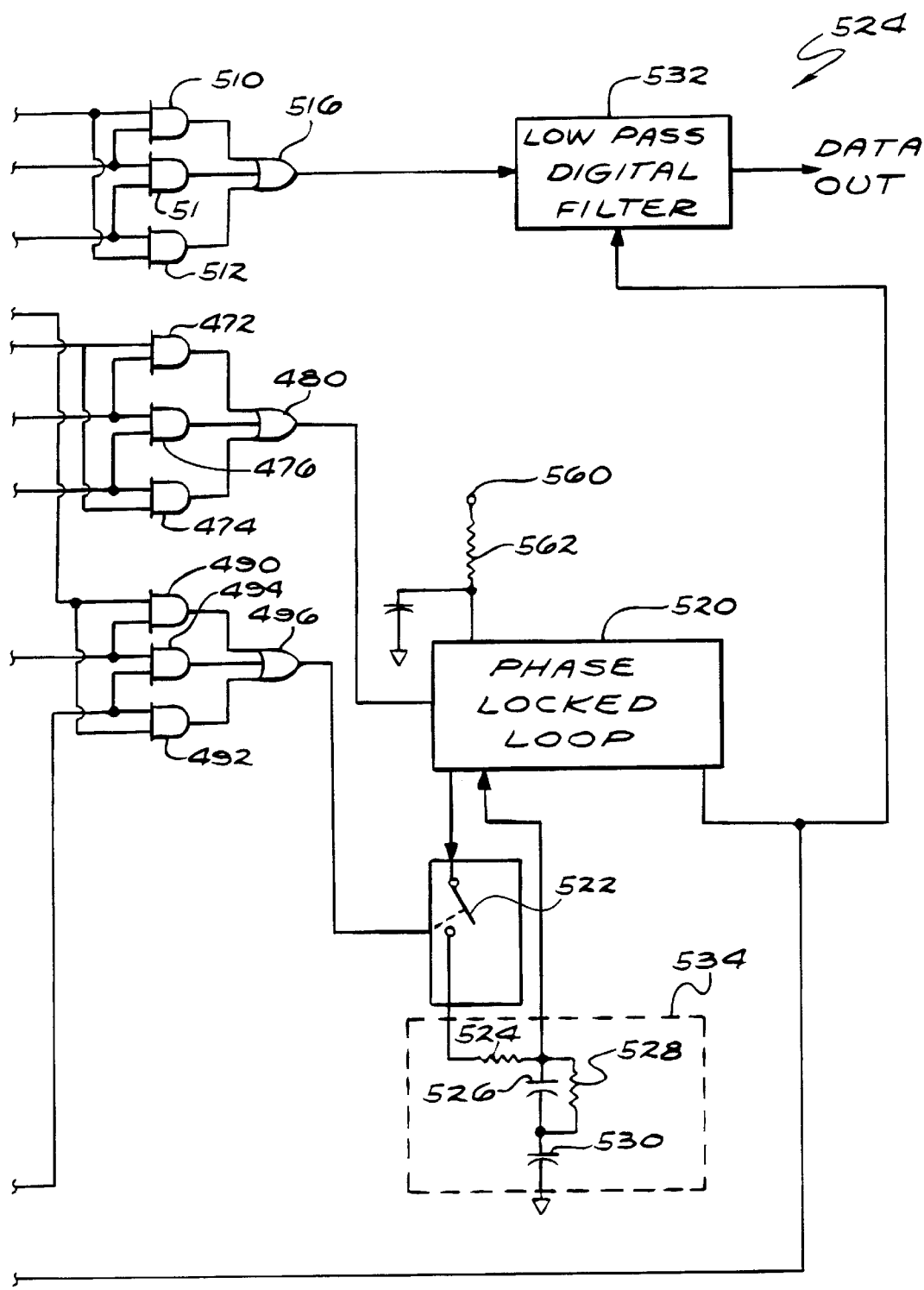

Connections are made from the output terminal of the exclusive OR gate 466 to input terminals of AND gates 472 and 474, from the output terminal of the OR gate 468 to input terminals of the AND gate 472 and an AND gate 476 and from the output terminal of the OR gate 470 to input terminals of the AND gates 474 and 476. The output terminals of the AND gates 472, 474 and 476 are connected to input terminals of an OR ate 480. (FIG. 39c). The AND gates 472, 474 and 476 are shown in FIGS. 39b and 39c.

In like manner, the signals from the limiting amplifiers 446, 448 and 450 (FIG. 39b) are respectively introduced to exclusive OR gates 482, 484 and 486. Second input terminals of the exclusive OR gates 482, 484 and 486 respectively receive signals from the output terminals of the shift registers 454, 458 and 462. Signals are introduced from the output terminal of the exclusive OR gate 482 to input terminals of AND gates 490 and 492, from the output terminal of the exclusive OR gate 484 to input terminals of the AND gate 490 and an AND gate 494 and from the output terminal of the exclusive OR gate 486 to input terminals of the AND gates 492 and 494. The output terminals of the AND gates 490, 492 and 494 are connected to input terminals of an OR gate 496. (FIG. 39c). The AND gates 490, 492 and 494 are shown in FIGS. 39b and 39c.

Correspondingly, the output terminals of the shift registers 456, 460 and 464 (FIG. 39b) respectively pass to input terminals of exclusive OR gates 500, 502 and 504. The exclusive OR gates 500, 502 and 504 also have input terminals respectively connected to the output terminals of the limiting amplifiers 446, 448 and 450. Connections are respectively made from the output terminals of the exclusive OR gates 500, 502 and 504 to input terminals of AND gates 510 and 512, input terminals of the AD gate 510 and an AND gate 514 and input terminals of the AND gates 512 and 514. The signals passing through the AND gates 510, 512 and 514 are introduced to input terminals of an OR gate 116. (FIG. 39c). The AND gates 510, 512 and 514 are shown in FIGS. 39b and 39c.

The signals from the OR gate 480 pass to a phase-locked loop 520 which may be constructed in a conventional manner. The phase-locked loop may include a phase detector and a voltage-controlled oscillator. An output terminal of the phase detector of the phase-locked loop 520 is connected through a switch 522, controlled by the signal from the OR gate 496, to selectively provide feedback to the voltage controlled oscillator. The signals from the voltage-controlled oscillator of the phase-locked loop 520 are introduced to the clock terminal of a low-pass digital filter 532.

When the dipole 416 at the transponder 418 in FIG. 30 receives the interrogating RF signals from the reader 424, it generates pluralities of signal cycles in a code dependent upon the pattern of 1's and 0's provided in the data source such as the read-only memory 422 to identify the object associated with the transponder. For example, a binary "0"

may be represented by a first signal cycle at a suitable frequency such as twenty kilohertz (20 kHz) and then by additional signal cycles at a suitable frequency which is a harmonic of the first frequency. For example, the second frequency is forty kilohertz (40 kHz) when the first frequency is twenty kilohertz (20 kHz). This is illustrated at 540 in FIG. 40. Similarly, a binary "1" may be represented by two (2) cycles at the second frequency such as forty kilohertz (40 kHz) and then by an additional cycle at the first frequency such as twenty kilohertz (20 kHz). This is illustrated at 542 in FIG. 40.

The read-only memory 422 causes the modulator 420 to produce the pluralities of signal cycles respectively coding for the sequences of binary 1's and binary 0's in the individual pattern. The modulator 420 introduces these signals to the dipole 416 (FIG. 30) for transmission to the reader 424. These signals are received by the antenna 426 (FIG. 39a) and are introduced to the mixers 432 and 434 (FIG. 39a). The mixer 432 also receives the interrogating RF signals from the source 430 and the mixer 434 receives the interrogating RF signals from the source 430 after the signals have been shifted in phase by 900 by the stage 436. The mixed signals from the mixers 432 and 434 respectively pass through the amplifiers 440 and 442 to the limiting amplifiers 446 and 450. The signals from the amplifiers 440 and 442 are also mixed in the stage 4A41 and these mixed signals are introduced to the limiting amplifier 448.

If only one mixer such as the mixer 432 were used, the output from the mixer could disappear or become null if the received signal happened to be in quadrature phase (90° or 270°) with respect to the interrogating RF signal. By providing the mixers 432 and 434 and by providing an 90° shift in phase in the interrogating signal introduced to the mixer 434, a null cannot simultaneously occur at both of the mixers. As a result, an output signal will pass from at least one of the mixers under all of the different phase relationships possible between the received signal and the interrogating RF signal.

There is s ill one possibility of a null in the output. This may occur when the outputs of the mixers 432 and 434 have opposite polarities. That is, the output of one of the mixers 432 and 434 may be the inverse of the output of the other mixer. To prevent a null from occurring under such circumstances, the combiner 444 is included to combine the outputs of the signals from the linear amplifiers 440 and 442. The signals from the combiner 444 are introduced to the limiting amplifier 448. Since outputs are obtained from the three limiting amplifiers and since the outputs of these amplifiers are paired (e.g., in the AND gates 472, 474 and 476), an output is obtained from at least two (2) of these three (3) AND networks under all possible circumstances.

Figure 29B:
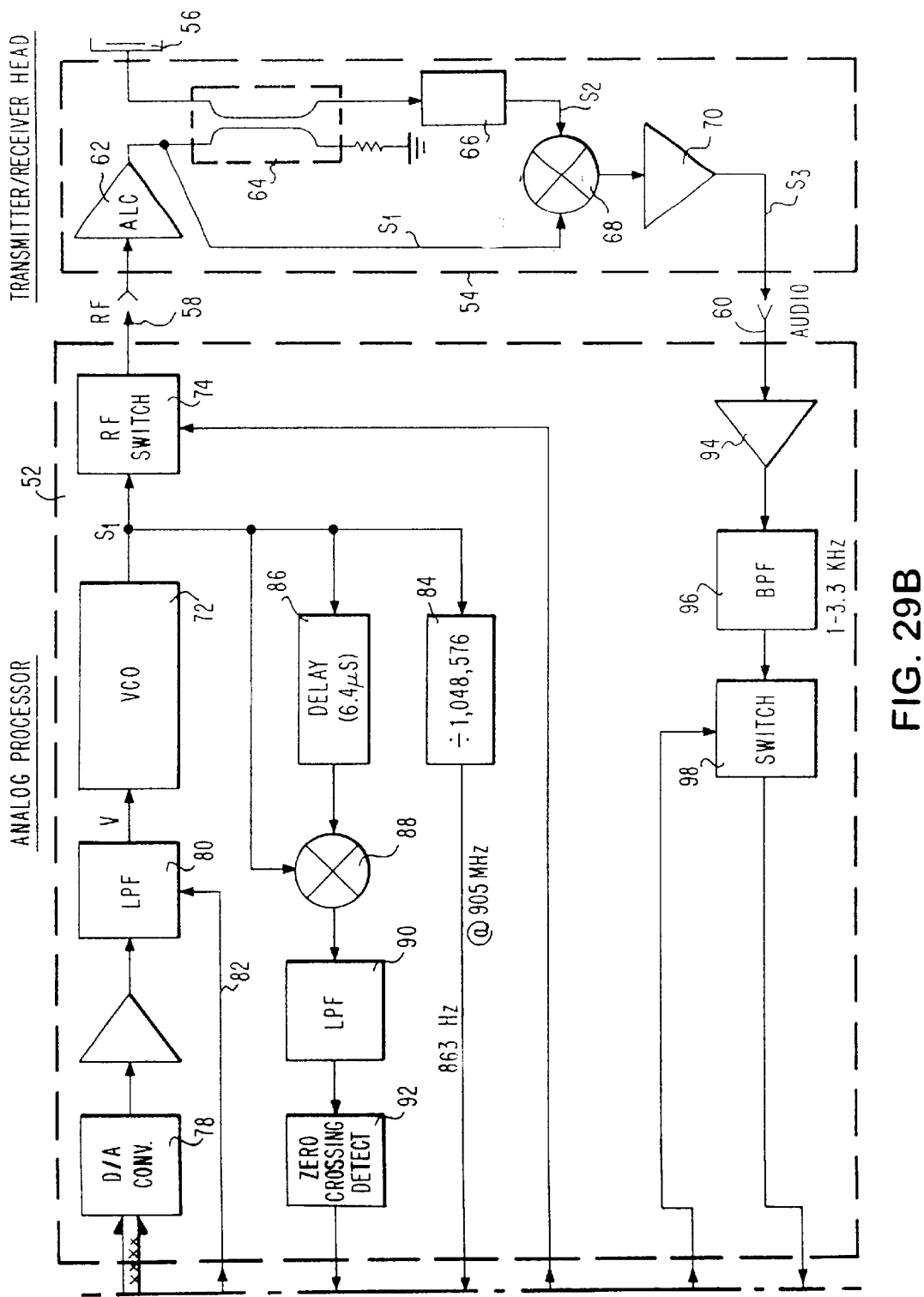
FIG. 29 is a schematic drawing of a processor circuit for analyzing a passive transponder signal.

The shift registers 454 and 456 (FIG. 39b) delay the signals from the amplifier 546. The delay provided by the shift register 454 corresponds to one-half of the period of a signal cycle at the second frequency such as forty kilohertz (40 kHz). This signal cycle is introduced to the exclusive OR network 482. (FIG. 29b). Similarly, the exclusive OR network 466 receives from the shift register 454 the signal cycles delayed by a quarter of the second of a signal at the second frequency such as forty kilohertz (40 kHz). The shift register 456 provides the same delay as the shift register 454 so that the signal cycle introduced to the exclusive OR network 500 has a phase shift corresponding to a complete period of a signal cycle at the second frequency such as forty kilohertz (40 kHz). The exclusive OR networks 468, 484 and 502 receive signal cycles respectively delayed by the same time period as the signal cycles received by the exclusive OR networks 466, 482 and 500. This same phase relationship is also present in the signal cycles introduced to the exclusive OR networks 470, 486 and 504.

The exclusive OR gate 466 compares the amplitude of the signal cycles from the amplifier 446 with the amplitude of Lie delayed signal cycles from the shift register 454. When the amplitudes of the signal cycles are both simultaneously high or are both simultaneously low, the exclusive OR gate 466 produces a signal with a high amplitude. At all other times, the signals from the exclusive OR gate 466 have a low amplitude. The exclusive OR gates 468 and 470 respectively provide a similar comparison of the signal cycles from the amplifier 448 and the delayed signals from the shift register 458 and with the signal cycles from the amplifier 450 and the delayed signals from the shift register 462. The signals passing through the exclusive OR gates 466, 468 and 470 are introduced in individually paired relationships to the AND gates 472, 474 and 476 (FIGS. 39b and 39c). The AND gates 472, 474 and 476 in turn pass signals to the OR gate 480 which operates to provide an output signal when it simultaneously receives signals of high amplitudes from two of the AND gates 472, 474 and 476.

In effect, the exclusive OR gates 466, 468 and 470 and the AND gates 472, 474, 476 and 480 operate to provide a comparison of the amplitudes of the received signal cycles and the received signal cycles delayed by one quarter of a time period of a signal cycle at the second frequency such as forty kilohertz (40 kHz). This comparison is indicated in FIG. 42. In FIG. 42, the received signal cycles arc indicated at 546 and the delayed signal cycles are indicated at 548. The output from the OR gate 80 is indicated at 550 in FIG. 42. This output has a frequency which constitutes the fourth harmonic (e.g. 80 kHz) of the first frequency such as twenty kilohertz (20 kHz). The signals 550 occur in most cycles at the third frequency (e.g. 80 kHz) but, as will be seen at 552, do not occur in all cycles. The signals 550 have a high amplitude when the amplitudes of the signal cycles 546 and 548 are simultaneously high or simultaneously low.

The exclusive OR gates 482, 484 and 486 respectively compare the amplitudes of the signals from the limiting amplifiers 446, 448 and 450 with the amplitudes of the output signals from the shift registers 454, 458 and 462. This comparison is indicated in FIG. 43. As will be seen in FIG. 43, the signal cycles from the amplifiers 446, 458 and 450 are indicated at 546 and the signal cycles from the phase shifters 454, 453 and 462 are indicated at 554. As a result of the comparison signals are produced as indicated at 556 in FIG. 43. The signals 556 have a high amplitude when both the signals 544 and 554 simultaneously have a low amplitude or simultaneously have a high amplitude. The signals 556 are produced at the third frequency (e.g. 80 kHz) at the times that the signals 550 in FIG. 43 are not produced at this frequency. As a result, when the signals 550 and 556 are combined the combination occurs at a periodic rate corresponding to the third frequency such as eighty kilohertz (80 kHz).

The signals 550 passing through the OR gate 80 (FIG. 39c) are introduced to the phase detector of the phase-locked loop 520 in FIG. 39c to obtain the production by the oscillator of signals at a particular frequency. e.g., 1.28 MHz, which is a harmonic of both the first frequency of twenty kilohertz (20 Hz) and the second frequency of forty kilohertz (40 kHz) and is also a harmonic of the phase-locked signals at the third frequency of eighty kilohertz (80 kHz) from the OR gate 480 and 496. As a result, the signals from the OR gate 480 and 496 constitute phase-locked signals to obtain the generation by the voltage-controlled oscillator in the phase-locked loop 520 of the clock signals at the frequency of 1.28 MHz.

The clock signals at the frequency of 1.28 MHz from the voltage-controlled oscillator in the phase-locked loop 520 are introduced to the low pass digital filter 532. The filter 532 also receives the signals passing through the OR gate 516. The operation of the OR gate 516 may be seen from FIG. 41. In FIG. 41, the received signal cycles are indicated at 546 and the delayed signal cycles (delayed by one full cycle at 40 KHz); from the shift registers 456, 460 and 464 are indicated at 568. The results of the comparison between the signal cycles are indicated at 570. The signal cycles 570 represent the demodulated signals identifying the object associated with the transponder 418. The filter 532 filters the demodulated signals 570 to pass only the low frequencies represented by the demodulated signals and to prevent the passage of short pulses representing noise.

Figure 39D:
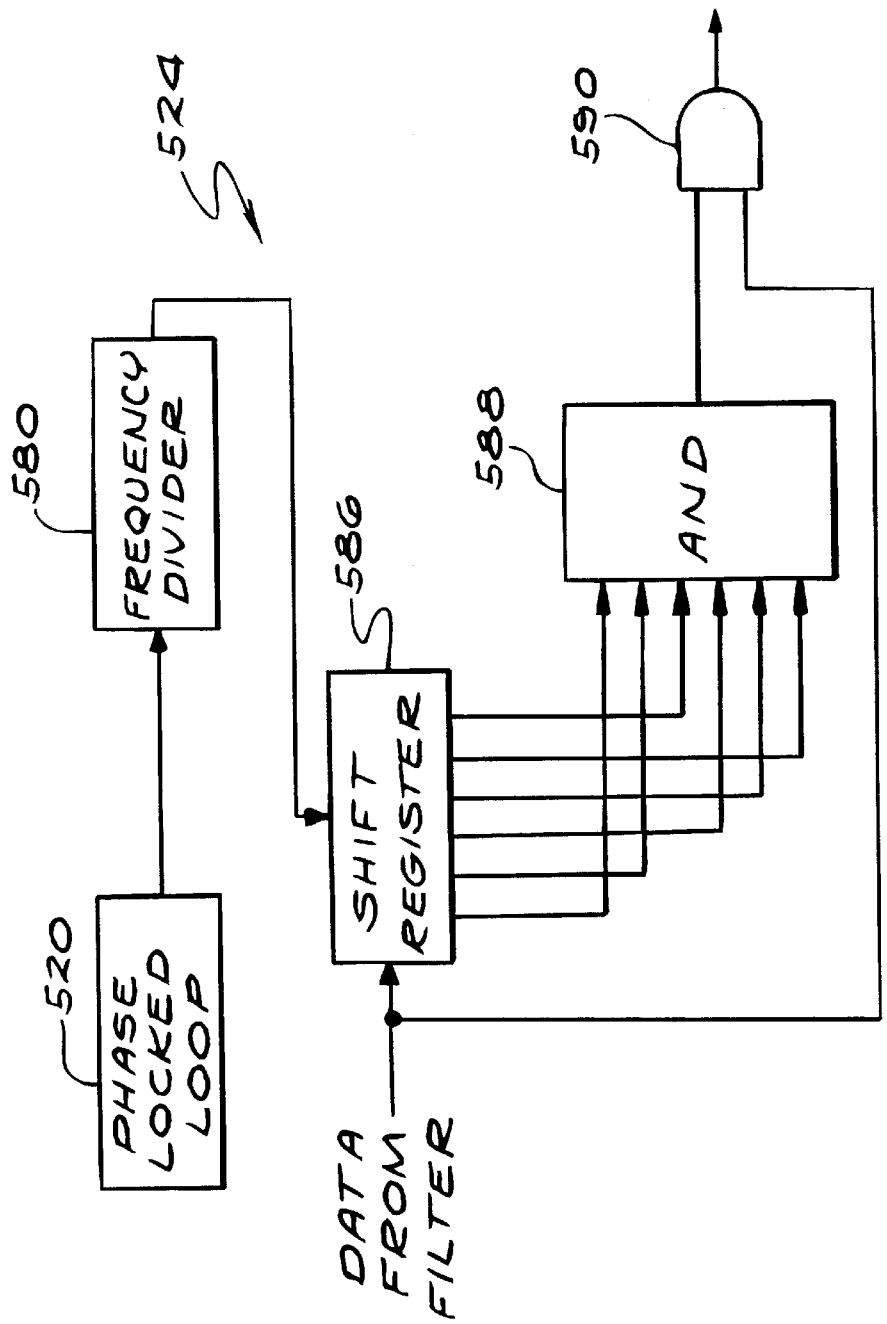

FIG. 39d illustrates on a somewhat simplified schematic basis a system for utilizing a sequence of signals 578 (FIG. 40) coding for the end of the sequence of binary 1's and binary 0's identifying the object associated with the transponder 418 and also coding for the beginning of the next such sequence. The system shown in FIG. 39d includes the voltage-controlled oscillator in the phase-locked loop 520 and a frequency divider 580. The frequency divider 580 receives the signals from the voltage-controlled oscillator 520 and divides these signals to produce clock signals at the second frequency such as forty kilohertz (40 kHz). These signals are introduced to a terminal of a shift register 586, another input terminal of which is connected to receive the demodulated signals 570. (FIG. 41).

The shift register 586 has six output terminals each of which is connected to the shift register to produce an output upon a successive occurrence of one of the signals from the frequency divider 580. When the six output terminals from the shift register 586 simultaneously have signals of high amplitude, a signal passes through an AND gate 588. This signal indicates that the transmission of the pluralities of signal cycles from the transponder 418 has been completed and that a new sequence of such transmission is being initiated. The signal from the AND gate 588 is introduced to an AND gate 590, another terminal of the AND gate being connected to receive the demodulated signals 570. The output from the AND gate 590 accordingly synchronizes the start of a new transmission of the pluralities of signal cycles identifying the object.

U.S. Pat. No. 4,888,591, incorporated herein by reference, and explained with respect to FIGS. 31–38, discloses the use of the active tag system with a spread spectrum interrogation signal, in order to obtain spatial selectivity.

The spread spectrum transmitter includes a 915 MHz oscillator which provides the carrier signal. The carrier signal from oscillator is passed to phase modulator to modulate it with a modulating signal having characteristics which provide unity output when correlated with itself with zero time shift, and a substantially lower output level when correlated with itself with significant time shift. For example, random and pseudo-random modulating signals have these characteristics. Such a signal could be generated, for example, by a stationary stochastic process. In this embodiment, the modulating signal is binary, employing a pseudo-random pulse sequence. As will be described in more detail later, this pulse sequence is supplied by sequence a generator through driver-shaper. Driver-shaper rounds the edges of the pulses to improve their shape for easier modulation onto the carrier. The sequence generator is timed by a shift clock generator.

The modulated output signal from phase modulator is sometimes referred to as a direct spread spectrum signal. The phase modulator produces a double-sideband, suppressed carrier signal which is passed to a bandpass filter, which limits the spectrum to that permitted by regulation. An amplifier amplifies the signal to be transmitted to raise it to the desired power level needed for transmission.

Where the modulation signal produced by the sequence generator is a pseudo-random signal, a shift register type generator may be employed. The pseudo-random output code sequence is connected to a driver/shaper. Three register stages provides a sufficiently high repeat cycle frequency, repeating every seven clock cycles. If clocked at a rate of 10 MHz, this frequency is usually sufficiently high so as to be free of conflict with the backscatter-modulated return signals, which usually have a much lower frequency, for example, 20 and 40 kHz. In this system, it is important to bear in mind that there is only a slight delay introduced by the transponder, with the information code generated by a modulator.

Using additional shift register stages, which produce a longer repeat sequence of the pseudo-random modulation signal, provides even better correlation differentiation. This means that the amplitude differences between correlated return signals, which are closer to the reference, and less correlated ones, which are usually the ones to be eliminated, are greater, potentially enabling distinction of unwanted signals. Usable shift register sequences are described in Shift Register Sequences, Solomon W. Golomb, Holden-Day, Inc. (1957), Ch. 3.

As disclosed in U.S. Pat. No. 4,888,951, a conventional, high frequency circulator is provided, which passes signals only in one direction, from one of ports to the next. Thus signals from a directional coupler are thus passed out onto an antenna. Backscatter-modulated signals received by antenna from the tag are passed into the circulator and are then circulated to a mixer. The mixer compares a reference signal from the directional coupler with the returned signal from the antenna. The mixer is, for example, a double-balanced mixer used as a phase comparator. The mixer compares the phases (typically 0 degrees or 180 degrees) of its two input signals. The output signal from mixer is passed through a lowpass filter to a preamplifier, whose output then is ported to a receiver/detector. The mixer is switched by a reference signal. When the reference signal is one polarity, the modulated backscattered signal passes directly through the mixer. When the reference signal is of the opposite polarity, the modulated backscattered signal is inverted. The lowpass filter serves to average the amplitude of the output signals from the mixer. This averaging results in a signal having a relatively low amplitude where the reference and the returned signals are out of macro phase, and a high amplitude where they are in macro phase of the phase modulation signal.

The instantaneous amplitude of the IF output signal from the mixer depends primarily upon two factors: (1) the amplitude of the RF input signal; and (2) the cosine of the relative phase angle between the reference signal and the RF signal.

A pulse sequence is the sequence generated by a sequence generator, pulse shaped, and passed to a phase modulator and through a bandpass filter. The signal sequence is then amplified and transmitted through the antenna to the tag, where it is backscatter-modulated by an active element with an information signal sequence generated in the tag and returned through the antenna to the input of circulator.

Two kinds of phase changes occur to the modulated backscattered signal. There is a micro-phase change which is the shift in the modulated backscattered signal, containing the necessary data These micro-changes are an undesired side effect in signal decoding, and are readily dealt with in systems of the prior art such as those described in U.S. Pat. No. 4,739,328. There is also a macro-phase change wherein the entire envelope of the signal shifts its phase.

Figure 35:
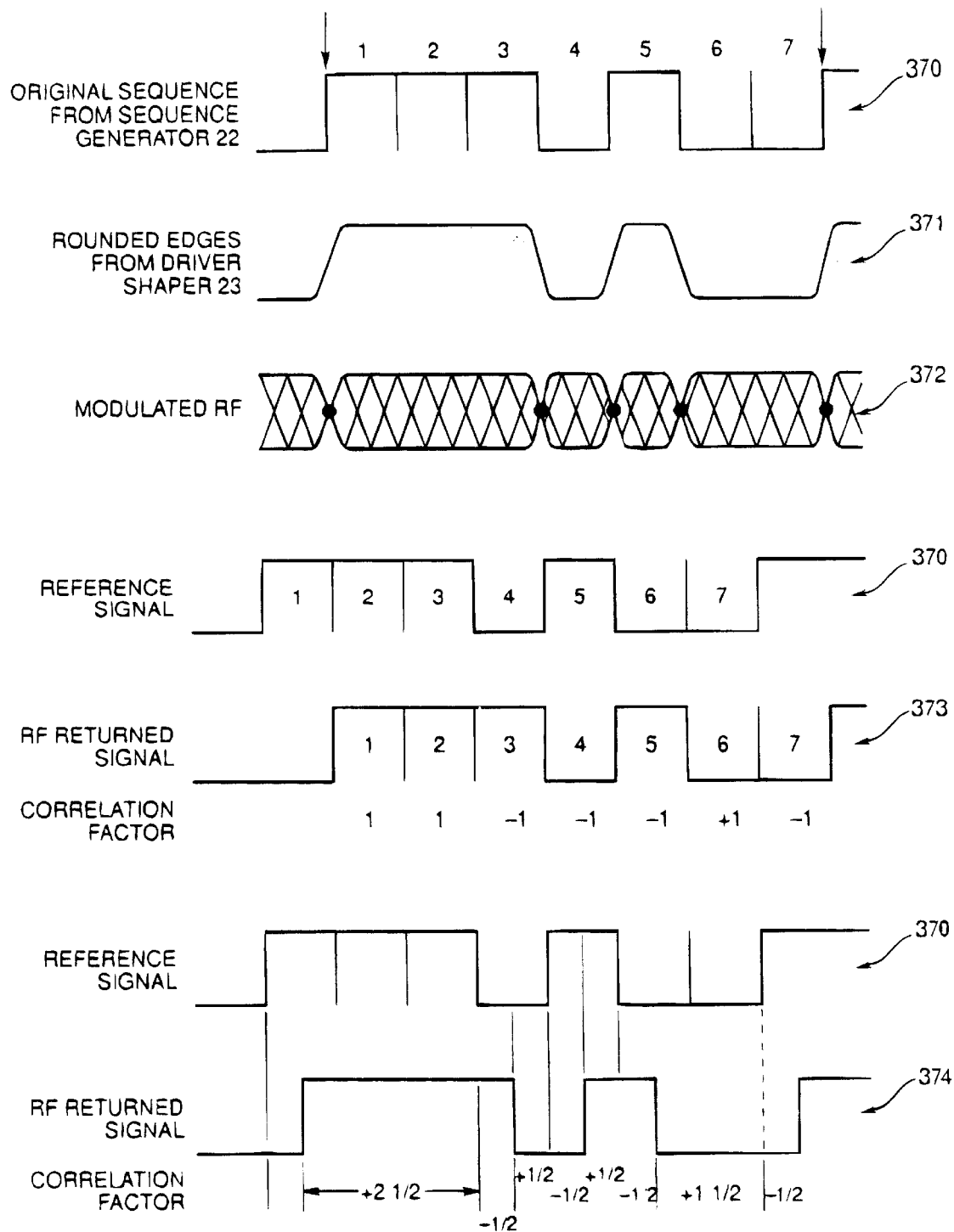
FIG. 35 shows various signals involved in the operation of a direct sequence spread spectrum transponder interrogation system.

The general appearance of the returned signal remains as shown in waveform 372 in FIG. 35, but the amplitude will change slightly in accordance with the backscatter modulation, and the overall macro-phase (the envelope) will shift during the transmission to and from the tag. This phase relationship can best be illustrated using square waves. Comparing the actual reference signal and the illustrative square wave signal 370 shows that the dots at the axis of signal 372 correspond to macro-shifts in phase from high-to-low and low-to-high of the reference signal 370, corresponding to 180 degree phase shifts of the RF signal. For the purposes of illustration, it is assumed that during signal transmission to the tag and return, the frequency of the reference signal was shifted by the width of one pulse of the modulating signial.

The operation of mixer 352 is such that if the reference sample on line 351 and the RF sample on mixer 358 are perfectly in phase-modulating phase, the maximum output signal amplitude from mixer 352 on line 360 will be obtained. Thus if the reference and returned RF signals are both positive, the output signal is positive; if they are both negative, the output signal is also positive; and if one is positive and the other negative, the output signal is negative.

For illustration, let us assume that the returned RF signal 373 is shifted in phase from the reference signal, as shown, by one complete pulse width. The pulses of reference signal 70 have been numbered from 1 to 7. Similarly, the pulses of the returned RF signal 373 have been numbered from 1 to 7. Looling at pulse 1 of returned signal 323, which is a HIGH, and comparing it with the pulse 2, the coincident pulse in time of the reference signal 370, both pulses are high, providing a correlation of +1, shown beneath pulse 1 of waveform 373. Pulse 2 of, waveform 373 also correlates exactly with coincident pulse 3 of the reference stream 370, and a correlation of +1 is shown below for that pulse as well. Pulses 3, 4 and 5 of the returned stream do not correlate, each resulting in correlations of −1, as shown. Pulse 6 of RF return signal 373 does correlate with pulse 374 of the reference signal, producing a correlation of 1, but pulse 7 does not, again producing a correlation of −1. Adding the correlation factors of the seven pulses of the returned signal 373, the sum is −1. Since there were seven pulses, the averaged correlation is −1/7.

Next, assume that the returned signal was shifted by only one-half pulse width rather than a whole one, as illustrated by returned signal 374. It is clear that the first two and one-half pulses of returned RF signal 374 correlate with the coincident pulses of reference signal 370, as shown, providing a correlation factor of +2½. The next one-half pulse of returned stream 374 does not correlate, producing a −½ correlation. The next one-half pulse does correlate; the next one-half does not; the next one-half does; and the next one-half does not, netting for the total of the two full pulse durations a correlation factor of zero. The next one and one-half pulses correspond, for a correlation factor of +1½, and the last one-half pulse does not correspond, for a −½. The sum of these correlation factors is 3 which, averaged for 7 pulses, is an averaged correlation of 3/7.

Figure 34:
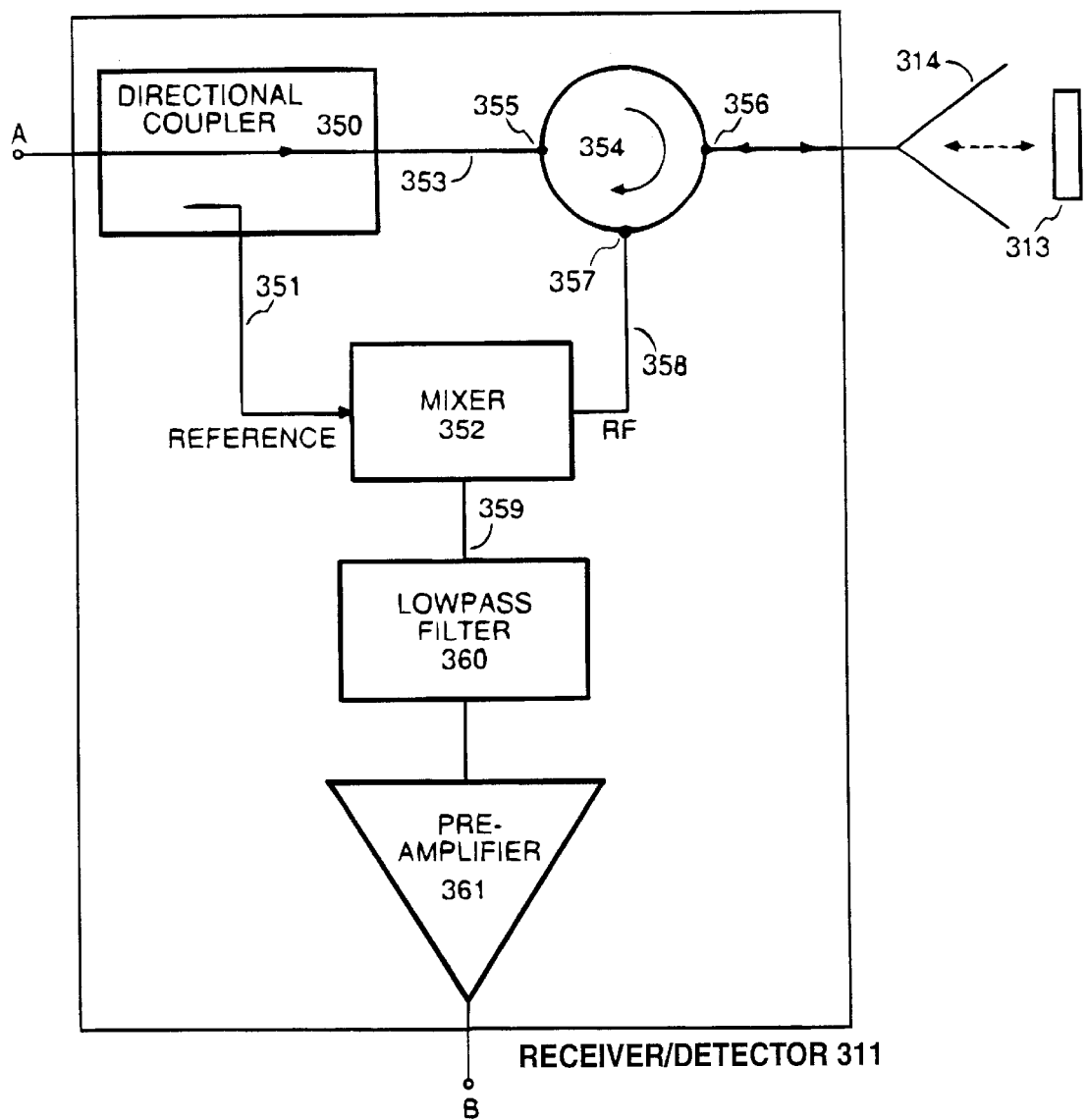

Referring to FIGS. 34 and 35, the correlation between the returned RF signal on line 358 and the reference signal on line 351 controls the averaged amplitude of the signal on line 359 from mixer 352. It will be apparent that a returned signal which correlates as poorly as signal 373 does to reference signal 370 will produce an output signal from mixer 352 having an averaged amplitude 1/7 the averaged amplitude of a signal which correlates 100%. Returned signal 374, which was shifted only by one-half pulse width from reference signal 370, produced an averaged correlation of 1/7, meaning that the output amplitude of that returned signal from mixer 352 on line 359 would be about half the amplitude of a fully correlated signal. Similarly, the output amplitude of signal 373, shifted from the reference signal 370 by a full pulse width, has a level only 1/7 of that of a fully in-phase returned signal.

The output signal from mixer 352 on line 360 is passed to a preamplifier 361, producing a preamplifier signal at node B shown in FIG. 34 whose amplitude is dependent on the phase correlation in mixer 352.

Figure 31:
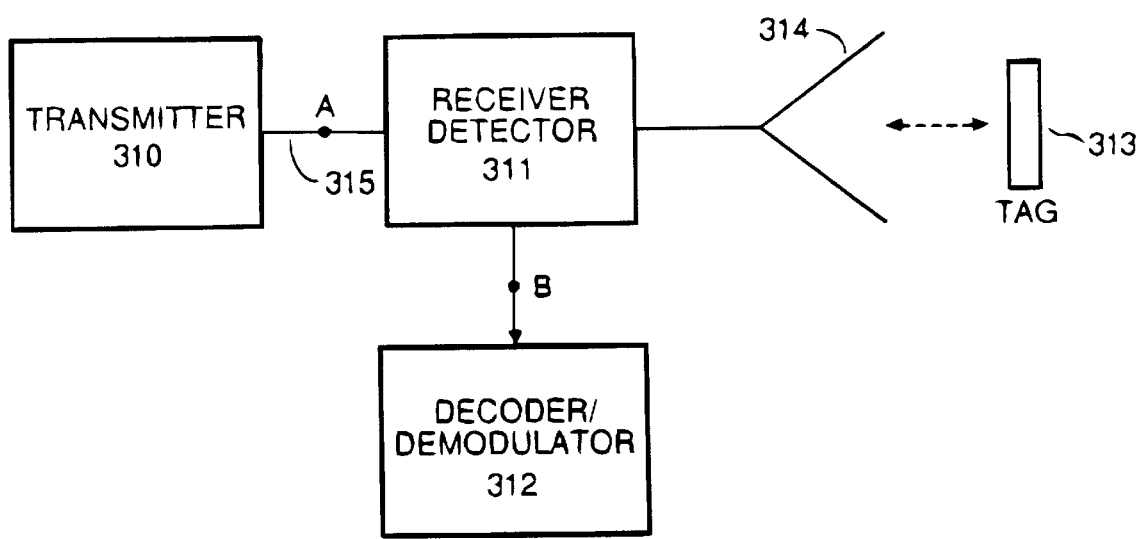
Figure 32:
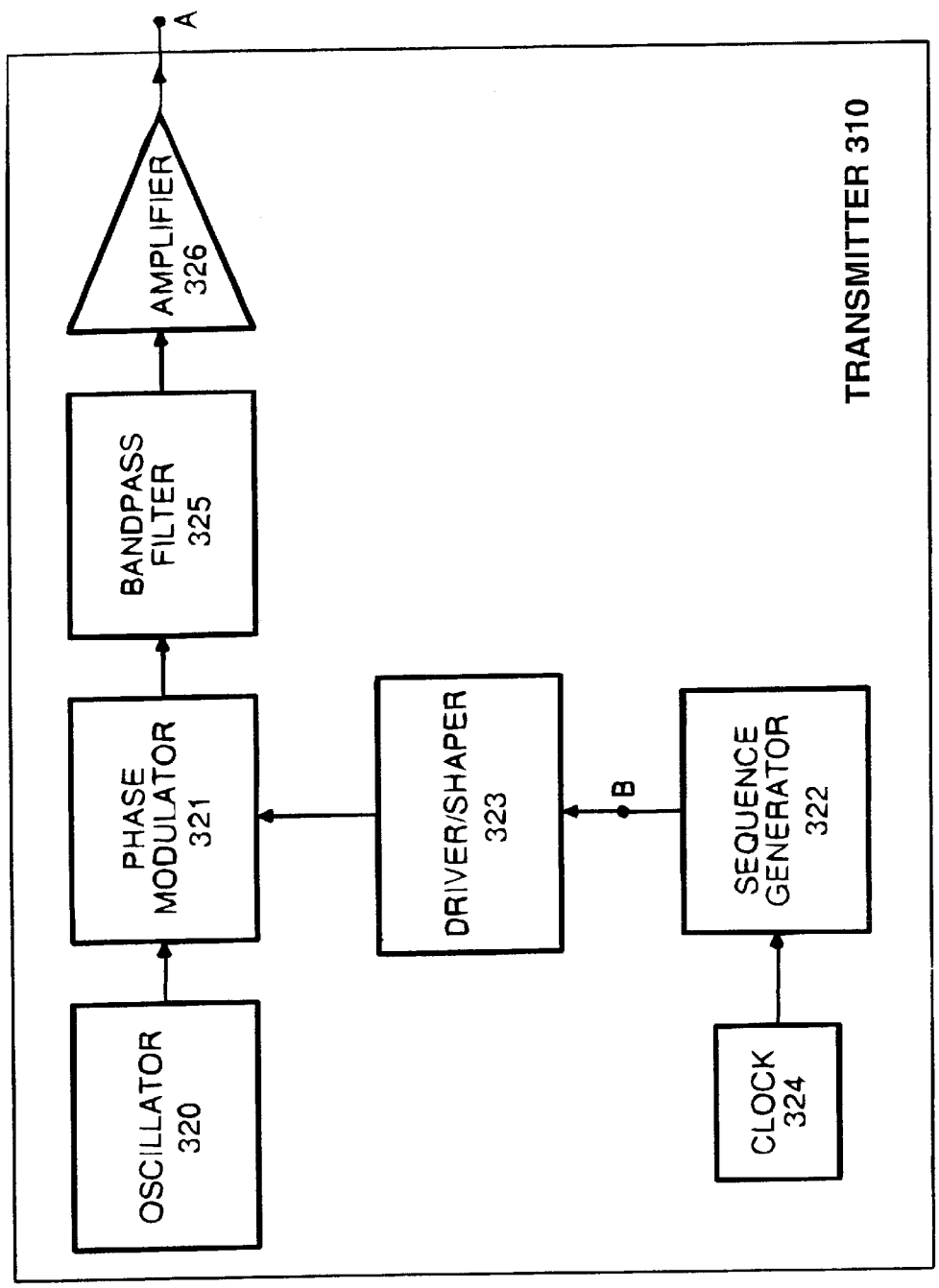
FIG. 32 is a schematic drawing of a transmitter of FIG. 31.
Figure 33:
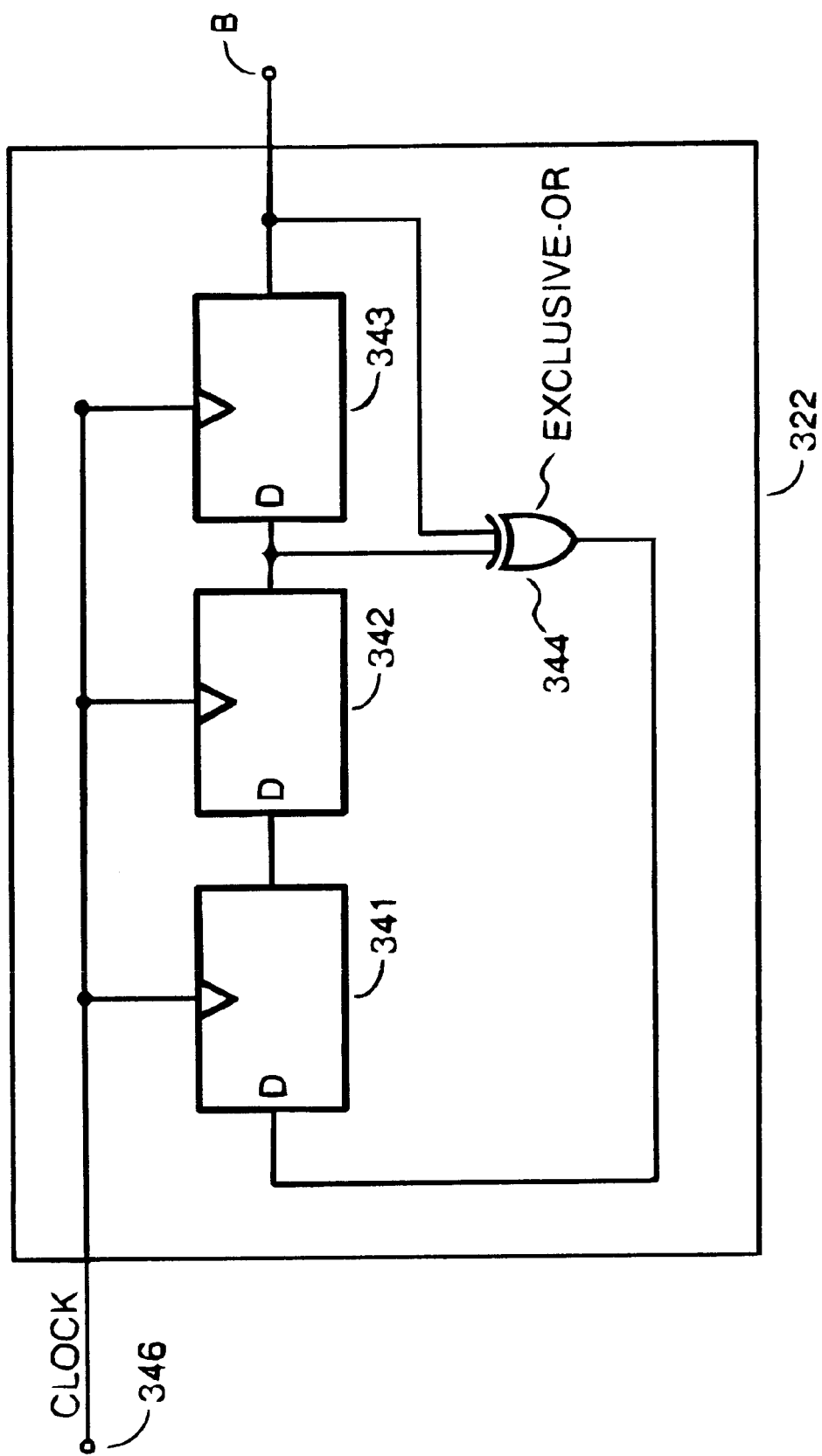
FIG. 33 is a schematic drawing of a sequence generator of FIG. 32.

Referring now to FIG. 31, the demodulated signal at node B passes to decoder/demodulator 312. Decoder/demodulator 312 demodulates and decodes the signal to extract the binary code which was modulated onto the returned, modulated backscattered signal by tag 313.

As a result of the operation of receiver/detector 311 described above, the amplitude of the output signal passing through node B to decoder/demodulator 312 varies significantly depending upon the degree of correlation between the phase modulation pattern on the reference signal from transmitter 310 and the noduled backscattered signal from the tag 313. As explained above in connection with the graphs in FIG. 35, the amplitude of this output signal is substantially lower, by a favor of two or more, if the phase correlation between these two signals is poor, and substantially higher if the correlation is good. Where the correlation is poor, the input signal at node B to decoder/demodulator 312 is of a sufficiently low amplitude below the decoder/demodulator sensitivity, and is thus ignored. Where the correlation is good, the amplitude is sufficiently high so that decoder/demodulator 312 can decode the signal and reproduce the original binary bit pattern modulated onto the returned signal by the tag.

Figure 36:
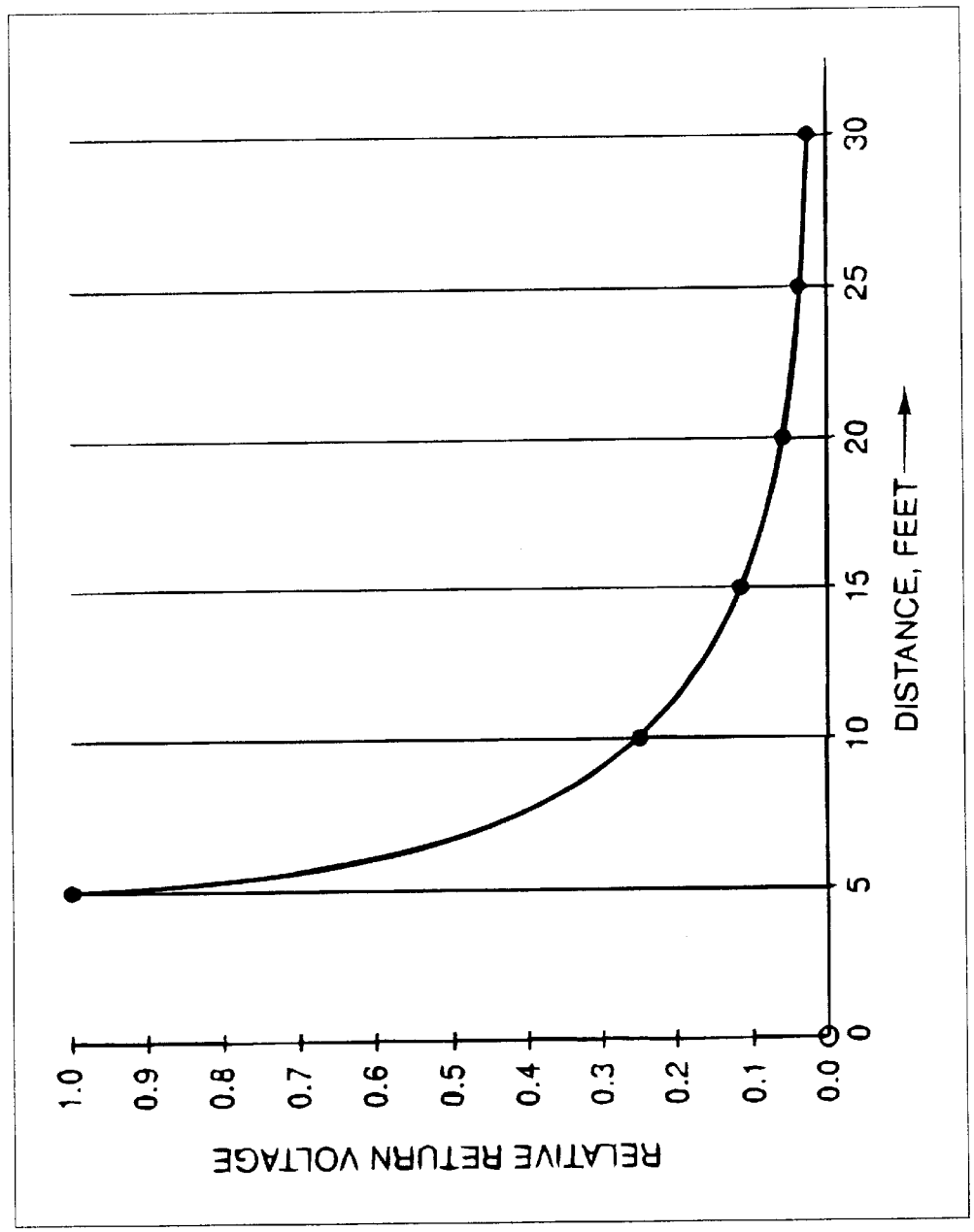
FIGS. 36–38 show distance relationships of the direct sequence spread spectrum transponder interrogation system.
Figure 37:
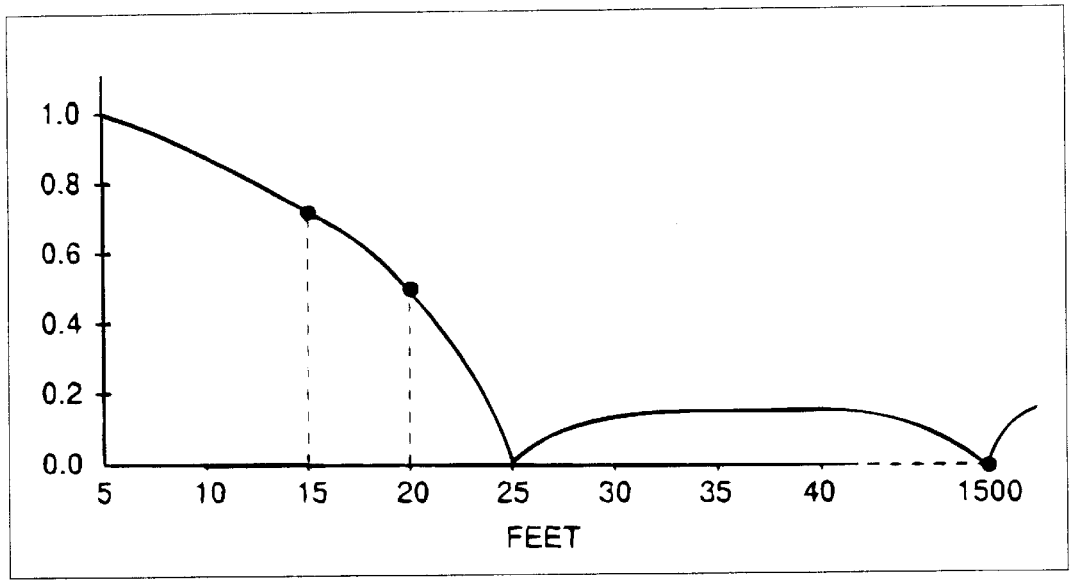

The graphs of FIGS. 36 and 37 illustrate the advantages of the DSSS system. The first portion of the curve on FIG. 37 for a distance between 5 and 25 feet shows the usual falloff of signal strength obtained with a system of the prior art without using the spread spectrum signal modulation according to the invention. The curve has been normalized to show a maximum signal strength of 1.0 at 5 feet from the antenna. Note in this first portion of the curve in FIG. 37 that the falloff in signal strength at 15 feet is about 70%, and the falloff at 25 feet is almost complete. Accordingly, using a stationary frequency system, it would be very difficult to discriminate, based upon this small amplitude differential in signal (30%), between a proper signal generated 15 feet away from the antenna and a spurious one from 25 feet away.

The graph of FIG. 37 ignores the normal signal decay with distance shown in FIG. 36, and only takes into consideration the falloff in signal strength with distance based upon the modulation technique used in the subject invention. At 25 feet, the lack of correlation shown by the significant drop in signal level results from the DSSS technique. The signal strength falls almost to 0. It turns out that there is a null point at 25 feet, but even well beyond 25 feet, up to about 1,500 feet for a 915 Mhz carrier, the signal strength increases only a small amount, well below 10%. At about 37 feet, for example, the signal level is 1/7, or 0.15, as described earlier and shown in FIG. 37, due to lack of correlation. Accordingly, it is very easy to discriminate between a desired signal 15 feet from the reader, and an unwanted signal, such as from an adjacent toll lane, which in most cases will be at least 25 feet away.

It is possible to tailor the distances in actual set up very accurately by locating the antenna at the desired distance from the tag even though the transmitter, receiver/detector and decoder are located somewhere else. They may be connected by shielded cable. The antenna is the only component of the system whose location is critical.

Figure 38:
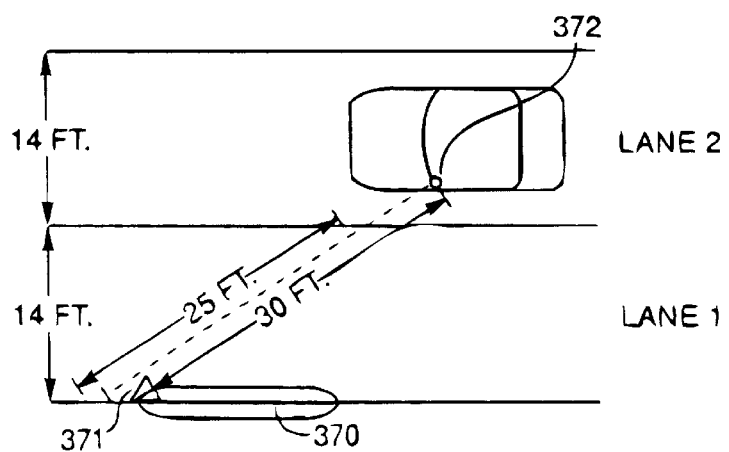

The operation of the apparatus in toll lanes is illustrated in FIG. 38. The apparatus 370 habits antenna 371 located adjacent LANE 1 of the toll lane, as shown. No matter where the automobile being monitored in LANE 1 appears, and no matter where the tag is placed on the automobile, the antenna is directed so the reading of the tag will take place within a maximum of 15 feet of the antenna 371. Assuming the antenna is aimed at the angle shown in FIG. 38, the tag 372 on the automobile in LANE 2 will never be closer than about 25 feet from the antenna. Accordingly, the signal sent back from that tag will be significantly smaller than the signal from any vehicle in LANE 1, as shown in the graph of FIG. 37 for 25 feet and 15 feet, respectively. Therefore, the signal from the adjacent vehicle in LANE 2 will be well below the sensitivity level of the decoder/demodulator in apparatus of this invention used to extract the vehicle identification in accordance with this invention. Vehicles in LANE 1, however, will have almost a maximum signal strength which will be decoded very easily.

ACTIVE TRANSPONDER—SECOND EMBODIMENT

The modulated signal from a backscatter transponder such as described in the first embodiment of the active transponder may also be detected by sensing edges of phase transitions of the received signal, indicative of a change in modulation state. Thus, in the present second embodiment, the description of the interrogation signal transmitter transponder, and symbol analyzer do not change. As in the first embodiment, the signal from the stronger phase is preferably analyzed. These edges may be detected by providing a differentiate or delay line 652, 653 with a time constant τ greater than the edge transition timing and less than the inter symbol timing and a change timeconstant for the interrogation signal, and then detecting a phase transition edge. As noted above, the modulation scheme for typical backscatter RF-ID tags provides, for each symbol, a sequence of transitions. Thus, with each change in modulation state, an accompanying edge is detected, which may be reconstructed into the symbol sequence.

Figure 44A:
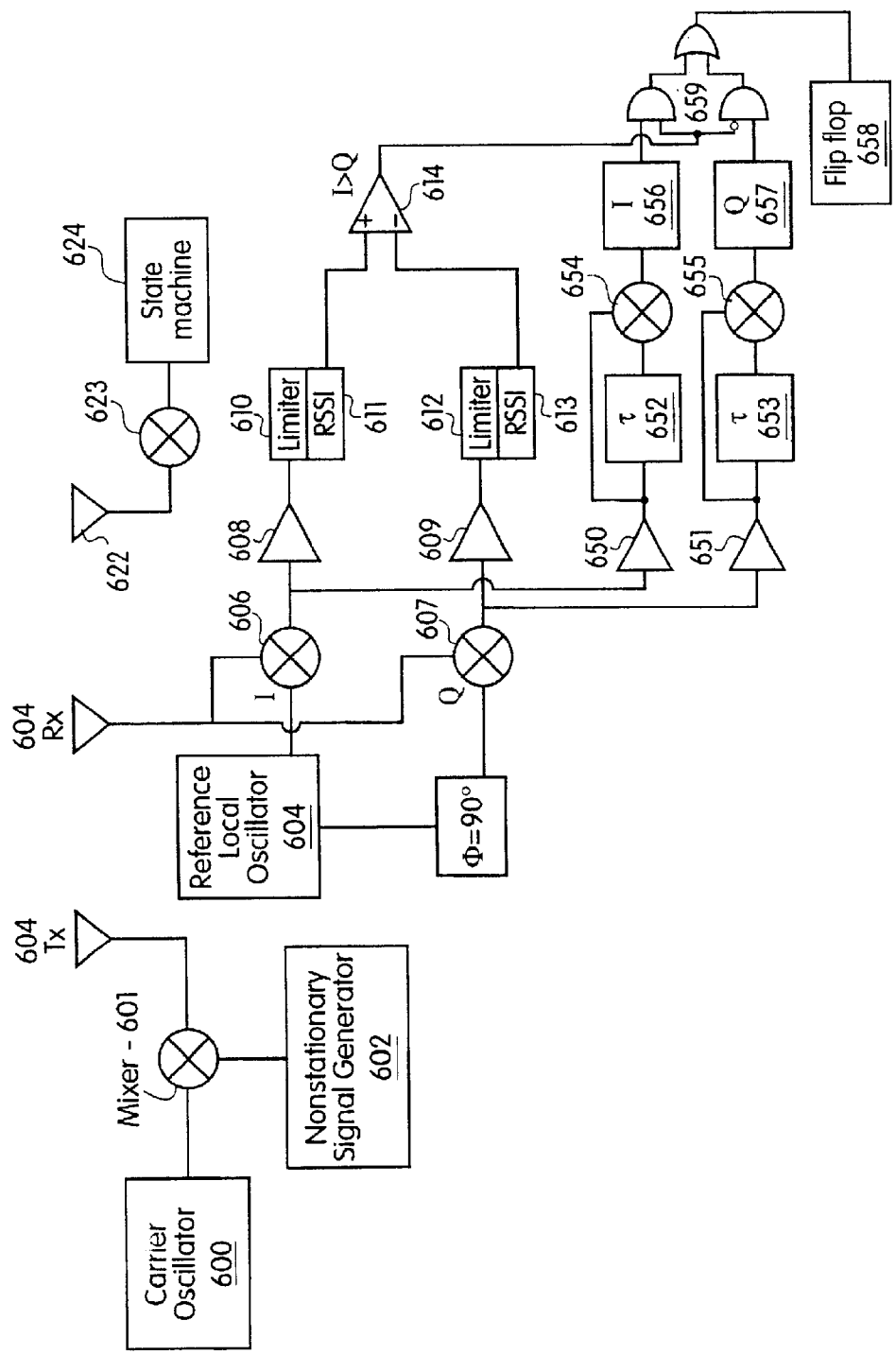

As shown in FIG. 44A, the receiving antenna 604 Rx introduces the received signals to a quadrature mixer 606, 607 for comparison in the mixer 606, 607 with the interrogating RF signals from the source, or a reference local oscillator 634, which, as stated above, may have a non-stationary frequency. The mixed quadrature signals are each introduced to an amplifier 608, 609 and a comparative signal strength detected using received signal strength indicator circuits 611, 613 and comparator 614. In contrast to the first embodiment (and the embodiment described below), these demodulated signals are not amplitude detected for sensing the bit pattern. Rather, the quadrature mixer 606, 607 outputs are then each placed in a delay line 652, 653. Each quadrature mixer 606, 607 output is compared with a delayed representation thereof, with a delay of about 1–2 nS. The comparison may be of the analog signal, using a mixer 654, 655, or as a digital comparison of a limited signal, in which case the delay line is preferably a shift register. When no phase transition is occurring, the output will be stable. During a transition, the delay will produce a disturbance in the output. Because the edge transitions are detected, the analysis is insensitive to signal level. One of the outputs of the mixers 654, 655 is then selected using circuit 659, and the edge transition stream converted to a bit stream with flip flop 658.

Figure 44D:
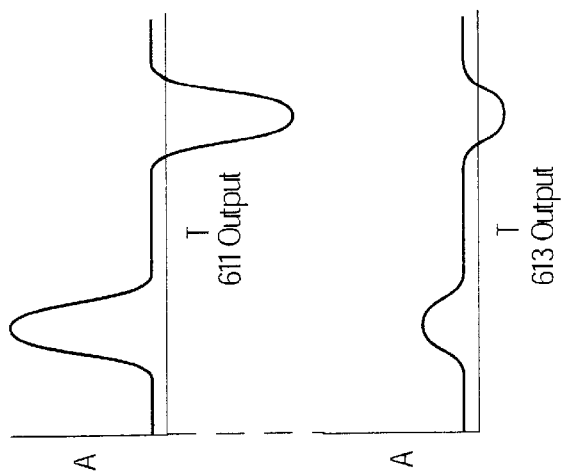
Figure 44C:
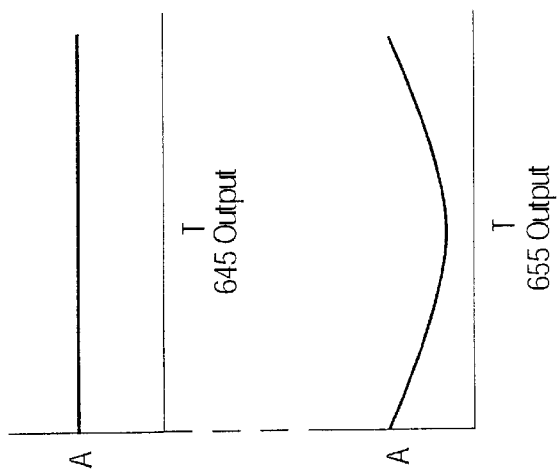
Figure 44E:
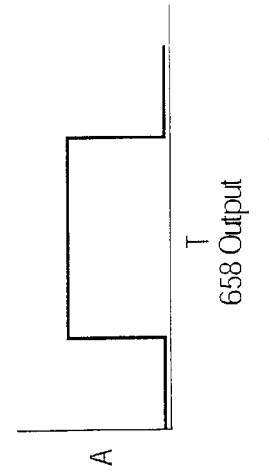
Figure 44B:
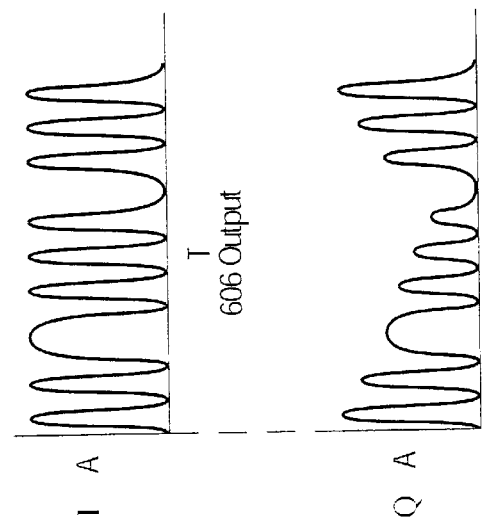

As shown in FIG. 44B, the transitions of the I and Q phase outputs of the mixers 606, 607 will be synchronized, but the respective signal amplitudes may vary, as determined by the RSSI 611, 613, as shown in FIG. 44C. The edge detector outputs 654, 655 therefore also vary in amplitude, as shown in FIG. 44D. The comparator 614 output is used to select the stronger signal, through a selection circuit 659, which is then passed through a flip flop 659 to produce a bit pulse as shown in FIG. 44E.

DUAL MODE TRANSPONDER INTERROGATION SYSTEM—FIRST EMBODIMENT

The system according to the present invention is capable of interrogating and decoding an interrogation response from both passive acoustic tags, active semiconductor tags, hybrids, and potentially other types. This is achieved by providing a non-stationary interrogation signal within an interrogation band, as well as a receiver system capable of decoding both delay encoded characteristics of the received waveform and sequentially modulated symbols of the received waveform. The receiver system therefore makes special accommodation to demodulate sequentially encoded symbols of the non-stationary carrier wave.

In its simplest form, a chirp (staircase frequency change) waveform RF signal is emitted from the interrogation system. This signal is therefore directly compatible with the passive acoustic transponder system, and the essential circuitry remains relatively unchanged from that known in the art, for example as discussed above, using a homodyne type receiver. On the other hand, the chirp waveform poses certain difficulties for interrogation of an active backscatter device. In particular, the phase change rate of the signal is relatively high, and therefore the circuitry disclosed in U.S. Pat. Nos. 4,739,328 or 4,888,591 will be ineffective for decoding sequentially modulated symbols of a non-stationary carrier, the phase of the carrier changing at too rapid a rate for the prior art circuitry to track and decode. The circuitry disclosed in U.S. Pat. No. 4,739,328, for example, while employing a four quadrant mixer 432, 434, provides for a signal polarity comparison only, through limiters 446, 448, 450, XORs 466, 468, 470 and shift registers 454, 458, 462, with a shift register clock rate of four times the frequency (one quarter the time period) of the second frequency (40 kHz), or about 160 kHz. This system does not respond to received signal amplitude, as this information is truncated in the limiters 446, 448, 450. The third channel combiner 444 apparently sums the real and imaginary phases of the mixer output, thus producing a composite signal. This known system however, does not compare the strengths of the various phases, and the combined channel provides only limited information on the relative strengths of the I and Q signals. Therefore, noise in the signal, even if it instantaneously alters the amplitude of any signal component, remains unfiltered and may introduce errors into the data analysis. At the limiter 446, 448, 450 stage, the data is "digital", and the circuitry does not address jitter or other types of artifacts which may appear in the limiter outputs.

The present invention demodulates both real and imaginary phases, and then compares their amplitude to determine which has the greater amplitude, and presumably the greater signal to noise ratio. The amplitude comparison occurs on a rectified and filtered portion of the signal. This filtering allows valorous types of artifacts to be avoided. Further, the preferred embodiment oversamples the selected stronger phase to further allow noise detection and/or compensation.

The preferred system therefore mixes the received signal in a balanced mixer with quadrature phases representing the interrogation pulse, and the mixed outputs low pass filtered to produce a pair of difference signals. The signal strength of the difference signals are then assessed and the signals limited. The stronger signal at any given time is then processed further, to decode the information contained therein. Where the signals are of comparable magnitude, either may be selected. Where both signals are below a threshold amplitude, the data may be ignored or flagged as potentially erroneous. The limited stronger signal is then sampled, for example, every 100 nS (10 MHz).

Due to the frequency change rate of the interrogation signal, as well as Doppler shift and round trip transmission delay of the interrogation pulse, the phase of the signal received from the antenna may change rapidly. With a chirp interrogation pulse, the difference between the emitted interrogation pulse and the reradiated signal will typically be less than about 3 kHz. This, however, is not the only possible type of interrogation signal. For example, a frequency hopping spread spectrum signal may be used, which will have extremely high maximum frequency change rates during hops. Since the hops are asynchronous with the symbol transmission from an active tag, it is important to be able to quickly track the desired signal through a range of hops. In this case, a heterodyne receiver topology is preferred, with an intermediate frequency (IF), for example 900 MHz, mixed with the return signal and a hopping frequency of between 5–25 MHz subsequently mixed with the output of the IF mixer. During frequency hop transitions, it is likely that the demodulator will generate artifacts, which may be identified and/or corrected by appropriate processing according to the present invention.

By comparing the phase signal strength continuously and maintaining data analysis of the stronger phase, the present invention provides distinct advantages.

In other embodiments, both I and Q phases may be analyzed, with consideration of the comparative signal strengths, computer bit error rates (BER), signal to noise ratio, or other metric of signal quality employed to weight any differences or disparities between the outputs. Further, the analysis is not limited to quadrature phases, and two phases having other than quadrature relationship may be analyzed, or multiple phases, for example three phases each 60° apart may be generated and analyzed. In the later case, the stronger one or two phases may be selected for analysis, or all or some of the phase signals analyzed with consideration of the comparative signal strengths, computer bit error rates (BER), signal to noise ratio, or other metric of signal quality employed to weight any differences or disparity between the outputs.

Figure 49:
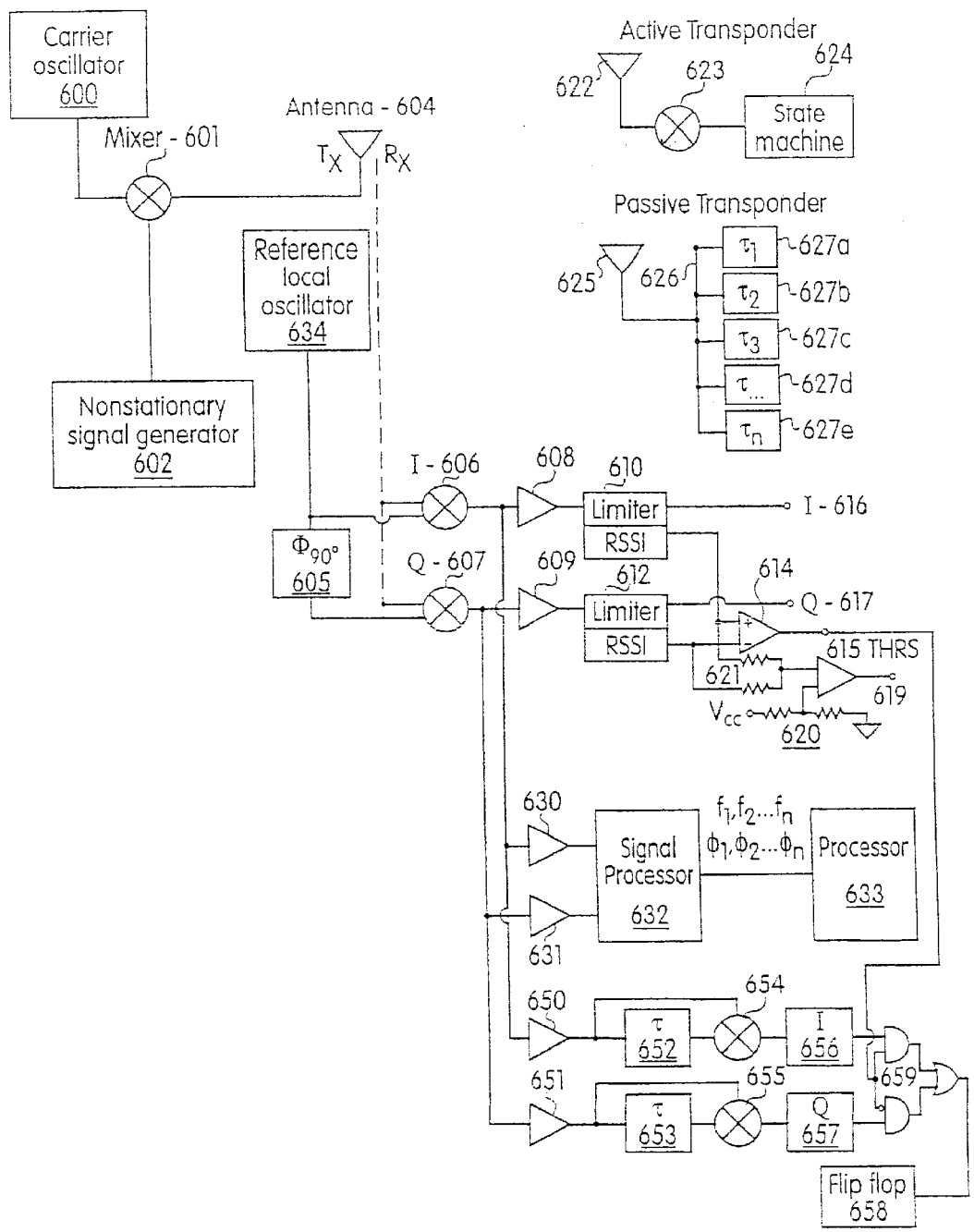

FIG. 49 shows a simplified schematic of a triple mode transponder interrogation system: acoustic transponder, a first embodiment of the backscatter transponder and a second embodiment of the backscatter transponder. A carrier oscillator 600 generates a stable carrier at about 900 MHz. This carrier is mixed with the output of a non-stationary signal generator 602 in a mixer 601. The non-stationary signal generator may be, for example, a chirp generator, frequency hopping generator, direct sequence spread spectrum generator, digitally controlled oscillator, or other type of circuit. The mixed signal from the mixer 601 is transmitted as a 905–925 MHz band signal from an antenna 604-Tx. The transmitted signal potentially interacts with different types of transponders.

A first type includes an active modulator 623, which modulates the interrogation signal received by the antenna 622 based on the output of a state machine 624. A second type of transponder is a passive transponder which subjects the signal received by the antenna 625 to a plurality of differing delays ($\tau$) 627a ... 627e, which are then summed at node 626. In both types of transponder, the interrogation signal is retransmitted as a reradiated signal to an antenna, for example the antenna 604-Rx associated with the transmitting antenna 604-Tx used to emit the interrogation signal.

The received signal is then mixed with a reference local oscillator 634 output and an output of a quadrature phase generator 605, in mixers to produce a set of quadrature "baseband" output signals from mixers 606 and 607. The signals are buffered in buffers 608 and 609, and then processed, for example with an NE624 (Signetics/Philips) integrated circuit, which each include a further 610, 612 producing a limited output 616, 617 and received signal strength indicator (RSSI) circuit 611, 613. The received signal strength indicator signals 611, 613 are compared by comparator 614, to determine which has a greater amplitude 618. The received signal strength indicator signals 611, 613 are also separately summed by network 621 and compared by a comparator 615 with a value determined by another network 620 to produce a threshold signal strength output 619.

The outputs of mixers 606 and 607 are also buffered with buffers 630, 631. The signals are then processed by a signal processor 632 to produce sets of frequency $f_1, f_2, \ldots f_N$ and phase $\phi_1, \phi_2, \ldots \phi_N$ outputs, which are then further processed in a processor 633.

Typically, a system would provide only one backscatter tag processing system, i.e. outputs 616, 617 or output 658; however, both are shown in FIG. 49 for comprehensiveness. The present example thus does not employ the circuitry specifically related to generating the flip flop 658 output.

FIG. 45 shows a typical set of waveforms from a backscatter transponder tag.

Figure 46A:
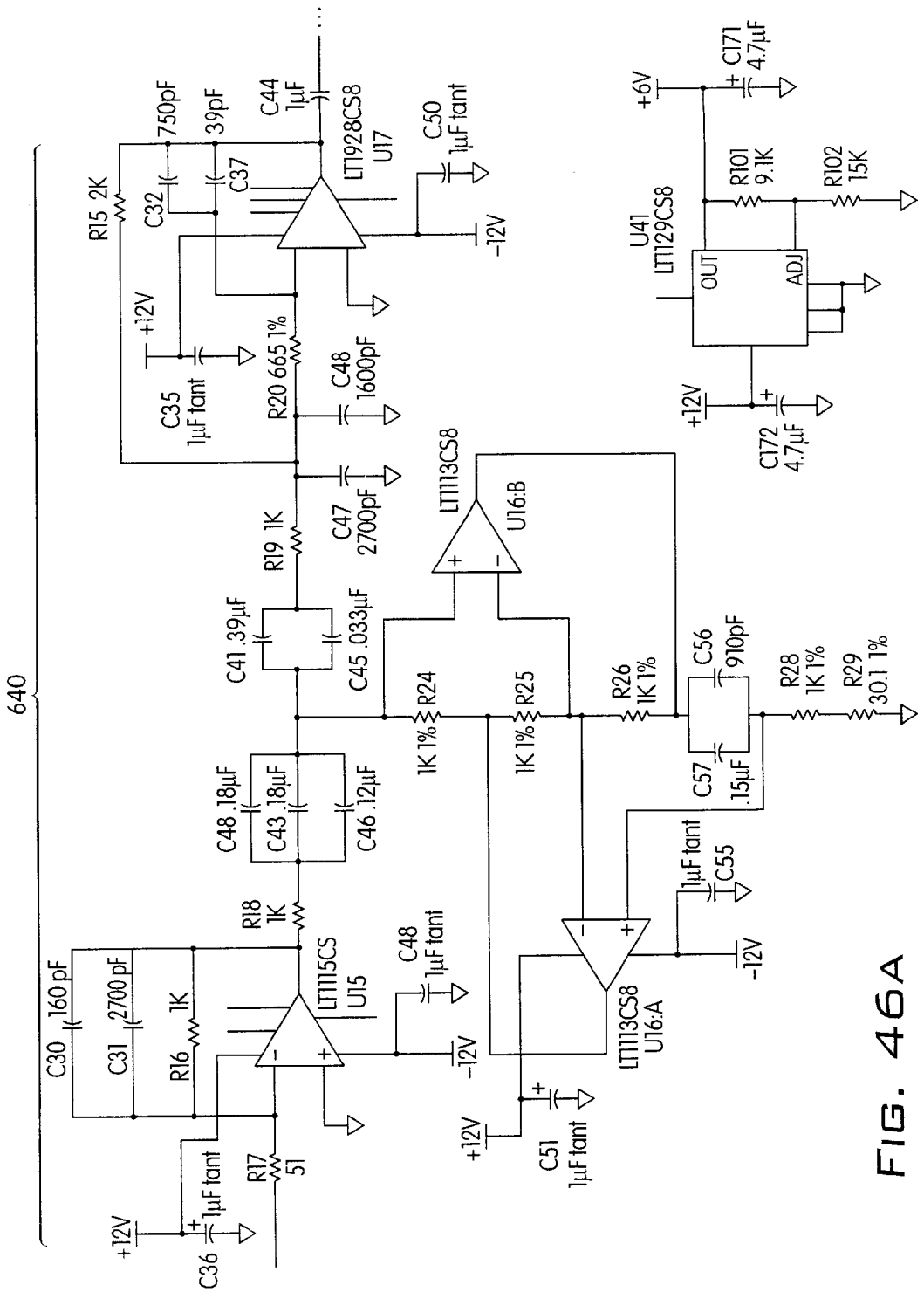
Figure 46B:
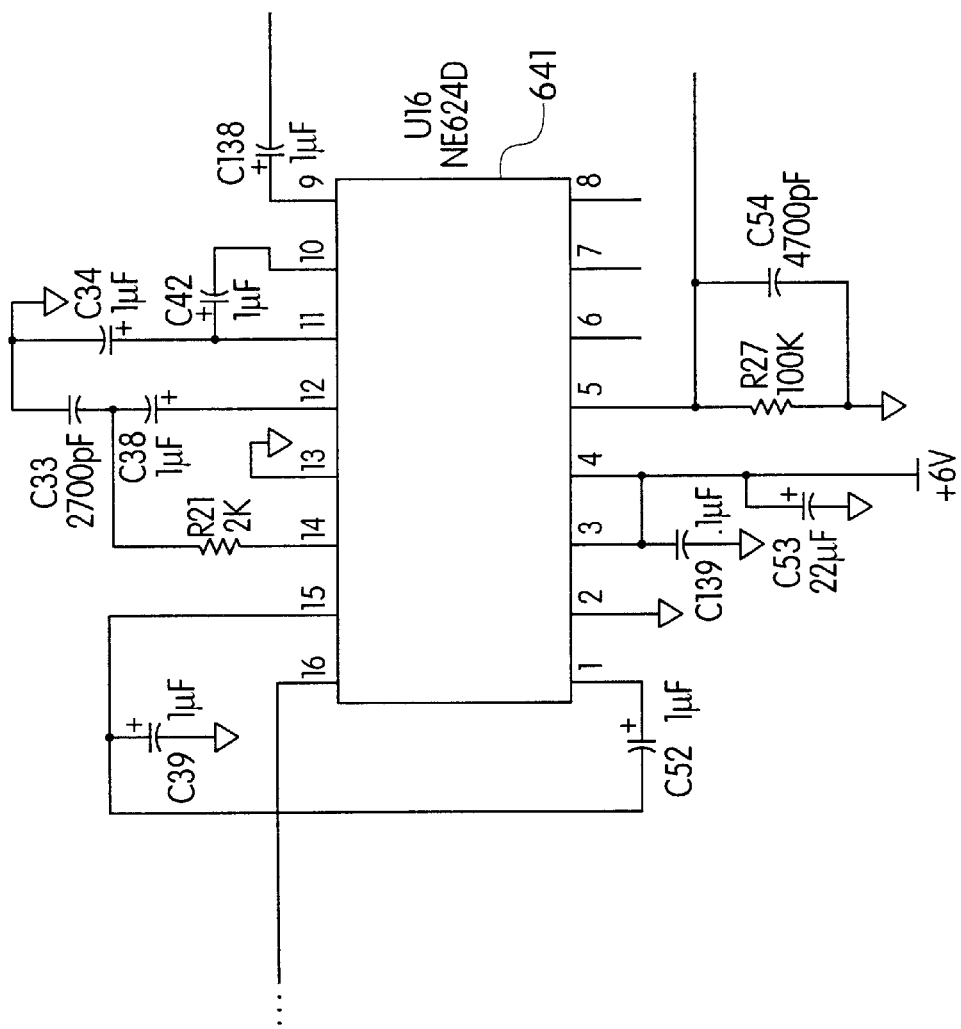
Figure 47A:
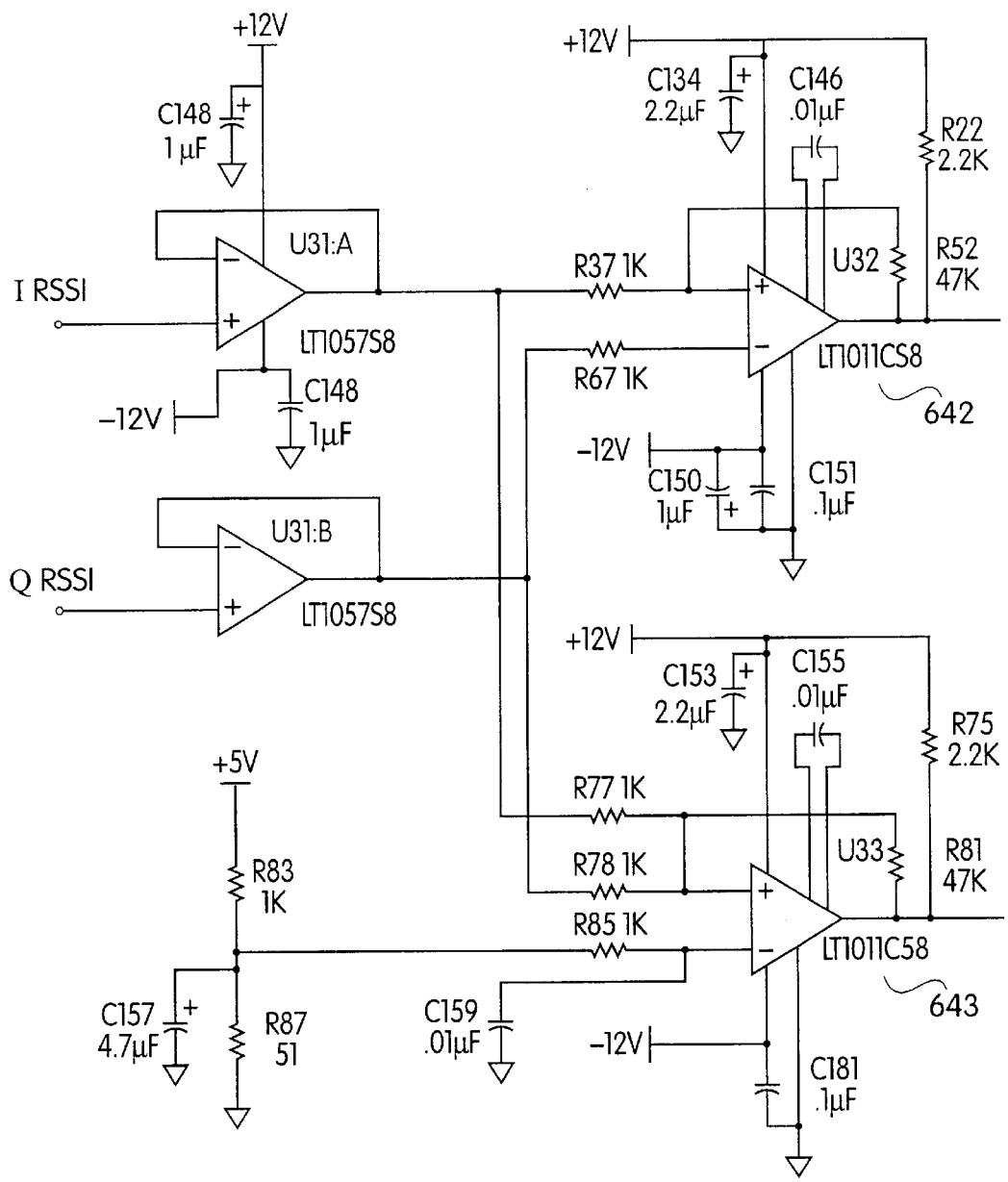
Figure 47B:
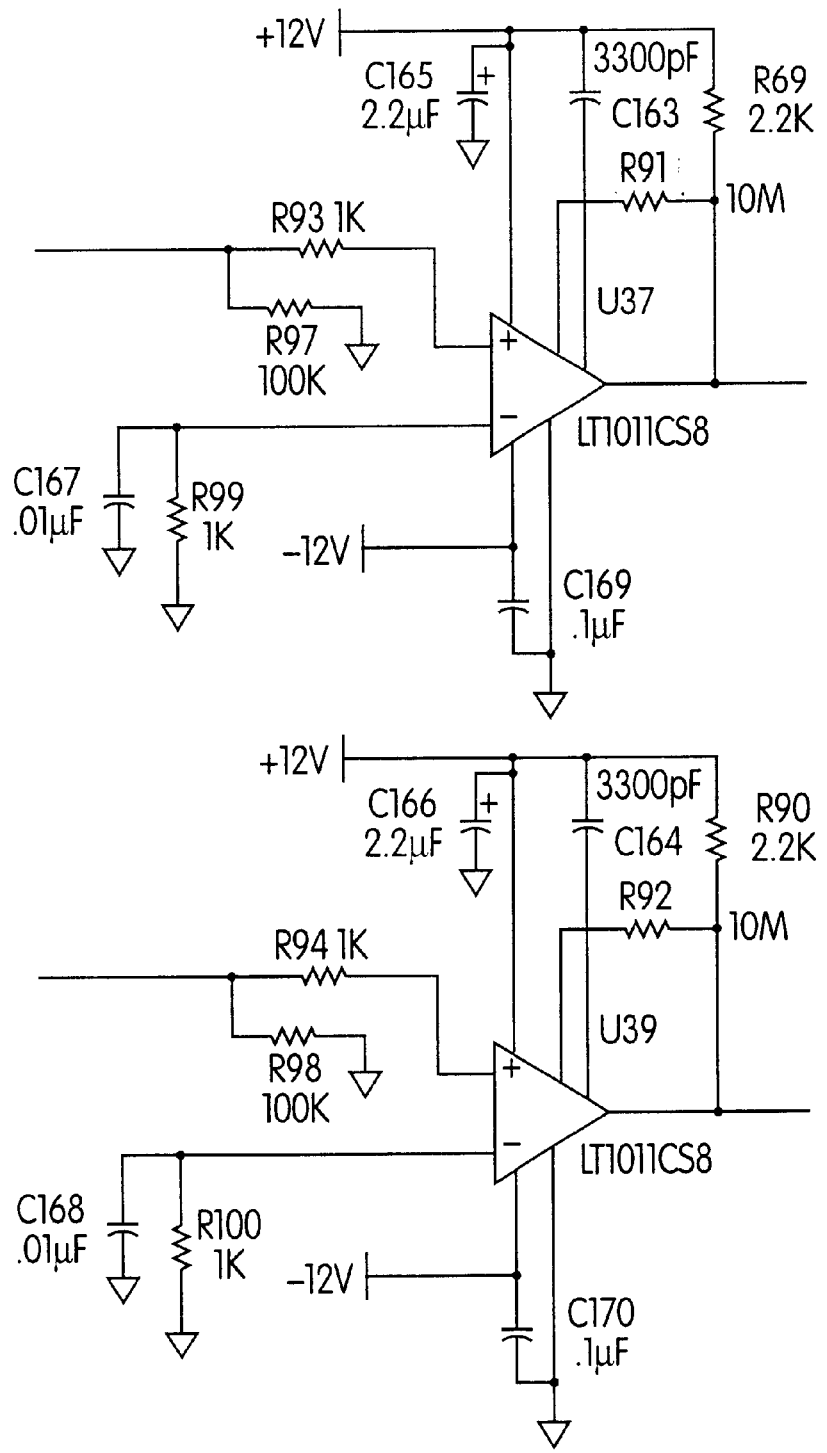

FIGS. 46–48 detail the operation of the reader system for the active transponder in more detail. The received signal from the transponder is mixed in a quadrature mixer to generate I and Q phase signals, as discussed above. As shown in FIG. 46, the structures of which are repeated for each phase, the phase signal is amplified and filtered in a signal processing section 640. The processed signal is then input into a processor 641, which is, in this case, an NE624 integrated circuit. The circuit is configured to produce as an output a limited signal representing the input as well as a received signal strength indicator (RSSI) signal, which is produced by rectifying and filtering (detecting) the phase signal, to produce a signal which corresponds to the amplitude of the received signal.

FIG. 47 shows in more detail a circuit 642 for determining the stronger of the two phases, as well as a circuit for determining the composite signal strength to determine whether it exceeds a threshold 643.

FIG. 48 shows schematically a logical circuit which analyzes the data stream, which includes the limited I and Q signals 650, 652, the comparative magnitude signal 651 and the signal strength threshold signal 653. A 10.24 MHz clock 654 clocks a set of 7-bit counters 655, 656, 657, 658 which act on $\overline{I}$, I, $\overline{Q}$, and Q, respectively. The high order bit of each counter 655, 656. 658 is fed to a $\overline{S}$ input of an R/S latch 659, 660, 662, respectively, with the high order bit of the counter 657 fed to the S input of R/S latch 661. OR gates 663 and 667 receive the high order bit outputs of counters 655 and 656, and 657 and 658, respectively. OR gates 664 and 666 receives the Q outputs of R/S latches 659 and 660, and 661 and 662, respectively. The penultimate order bit of each counter 655, 656, 657, 658 are together ORed in an OR gate 665. The R input of R/S latch 659 and the $\overline{R}$ input of R/S latch 660 receives the I input; while the $\overline{R}$ input of R/S latches 661 and 662 receives the Q input.

The output of quad input OR gate 665 serves as the clock to a D-type latch 678, which receives the comparative magnitude signal 651 as the D input. The Q output of D-type latch 678 serves an a non-inverted input to AND gates 668 and 679, and as an inverted input to AND gates 680 and 681. The outputs of OR gates 663, 664, 666 and 667 serve as non-inverting inputs to AND gates 668, 679, 680 and 681, respectively. The outputs of AND gates 668 and 681 are ORed in OR gate 669, and the outputs of AND gates 679 and 680 are ORed in OR gate 682. The output of OR gate 669 serves as a clock input to shift register 671, which, in turn, provides a parallel output to a P-term matrix 672. The output of OR gate 682 passes through a 1-bit counter 670, whose output serves as a data input to the shift register 671.

The data output is then generated by AND gate 683, OR gate 684, D-type latches 673 and 677, XOR gate 685, and counter 676, based on the P-term matrix 672 output, OR gate 669 output, and the signal strength threshold signal 653, the later of which blocks output when the signal strength is too low through a clear input of D-type latch 673, as shown in FIG. 48. This circuit thus recovers both Data 674 and Data clock 675, for use by a processor.

The P-term matrix is implemented in a PLD, with the following formulas:

Zero's=/(($Q_0 \cdot \overline{Q}_1 \cdot Q_2 \cdot \overline{Q}_3 \cdot Q_4 \cdot \overline{Q}_5$)-($\overline{Q}_0 \cdot Q_1 \cdot \overline{Q}_2 \cdot Q_3 \cdot \overline{Q}_4 \cdot Q_5$))

One's=/(($Q_0 \cdot \overline{Q}_1 \cdot \overline{Q}_2 \cdot Q_3 \cdot Q_4 \cdot \overline{Q}_5$)-($\overline{Q}_0 \cdot Q_1 \cdot Q_2 \cdot \overline{Q}_3 \cdot \overline{Q}_4 \cdot Q_5$))

The detection strategy operates using the P-term matrix to detect "half" bits (1's, 0's), by detecting a 10 pattern, indicative of a zero, a 01 pattern, indicative of a one, or a synchronization pattern 1110 or 0001. The clock is recovered from the data edges in a digital clock recovery system.

Appendix A provides sample assembler and C language code for a routine for collecting the data from the digital processor for analyzing the tag similar to that disclosed in U.S. Pat. No. 4,739,328, and available from Amtech Corp., Santa Fe, New Mex.

DUAL MODE TRANSPONDER INTERROGATION SYSTEM—SECOND EMBODIMENT

The first embodiment of the dual mode transponder interrogation system employs an received signal strength indicator (PSSI)-responsive selection of signal component for detection (e.g., analysis of signal amplitude information) of backscatter transponder information. In contrast, the second embodiment of the dual mode transponder interrogation system employs the modulation state detector of the second embodiment of the active transponder system, a phase change sensitive ("edge") detector. Other vise, the systems are similar. The present example thus employs the circuitry to generate the flip flop output 658, which in turn corresponds to the stronger phase signal of the first embodiment, and may be analyzed to determine the modulation information accordingly.

The preferred system therefore mixes the received signal in a balanced mixer with quadrature phases representing the interrogation pulse, and the mixed outputs low pass filtered to produce a pair of difference signals. The signal strength of the difference signals are then assessed. The stronger signal at any given time then controls the processing of a corresponding data stream which is the output of the quadrature mixers passed through an edge detector, to produce transition information. This transition information then be reconstructed to a bit stream through a flip flop, and processed further, to decode the information contained therein. Where the signals are of comparable magnitude, either edge detection stream may be selected. Where both signals are below a threshold amplitude, the data may be ignored or flagged as potentially erroneous. The limited stronger signal is then sampled, for example, every 100 nS (10 MHz).

As shown in FIG. 49, the signal received by the receiver is mixed with a reference local oscillator 634 output and an output of a quadrature phase generator 605, in mixers to produce a set of quadrature "baseband" output signals from mixers 606 and 607. The signals are buffered in buffers 608 and 609, and then processed, for example with an NE624 (Signetics/Philips) integrated circuit, which each include a limiter 610, 612 producing a limited output 616, 617 and received signal strength indicator (RSSI) circuit 611, 613. The received signal strength indicator signals 611, 613 are compared by comparator 614, to determine which has a greater amplitude 618. The received signal strength indicator signals 611, 613 are also separately summed by network 621 and compared by a comparator 615 with a value determined by another network 620 to produce a threshold signal strength output 619.

The outputs of mixers 606 and 607 are also buffered with buffers 630, 631. The signals are then processed by a signal processor 632 to produce sets of frequency $f_1, f_2, \ldots f_N$ and phase $\phi_1, \phi_2, \ldots \phi_N$ outputs, which are then further processed in a processor 633.

The outputs of mixers 606 and 607 are further buffered with buffers 650, 651. The buffered signals each then pass through an edge detector, having a 2 nS analog delay line 652, 653 and a double balanced mixer 654, 655 comparing the delayed and undelayed representations of each phase signal. The double balanced mixer 654, 655 outputs are then analyzed with circuit 656, 657 for an impulse, indicative of a phase transition. The impulse detection circuit 656, 657 output corresponding to the stronger signal phase is then selected based on the comparator 614 output. The selected impulse detection circuit output is then converted into a bitstream with flip flop 658, and further analyzed by the signal analyzer, as described above and shown in FIG. 48.

There has thus been shown and described a novel RF-ID tag interrogation system, which fulfills all the objects and advantages sought therefor. Many changes, modifications, variations and other uses and applications of the subject invention will, however, become apparent to those skilled in the art after considering this specification and the accompanying drawings which disclose preferred embodiments thereof. All such changes, modifications, variations and other uses and applications which do not depart from the spirit and scope of the invention are deemed to be covered by the invention which is limited only by the claims which follow.

What is claimed is:

1. A multiprotocol backscatter transponder identification system comprising a radio-frequency interrogation signal emitter, a backscatter response receiver, and an analyzer for analyzing the backscatter response to uniquely identify a transponder, said analyzer having separate processing channels for respectively analyzing different transponder protocols, each channel operative to analyze a protocol-specific time-variant sequence of distinct modulation states, wherein one of the protocols is read-only protocol, receiving identifying information from the transponder, and another of the protocols is a read/write protocol, communicating information bidirectional between transponder and transponder identification system, said system producing a common identification output.

2. The system to claim 1, where the analyzer comprises at least two channels selectively responsive to a respective protocol of two different CMOS transponders.

3. The system according to claim 1, wherein a first protocol comprises frequency shift keying of biphase encoded serial data bits identifying the transponder.

4. The system according to claim 1, wherein a second protocol comprises frequency shift keying of serial data bits, transmitted by the transponder in response to a modulation of said radio-frequency interrogation signal emitter.

5. The system according to claim 4, wherein said radio-frequency interrogation signal emitter communicates information to the transponder.

6. The system according to claim 2, where one of the at least two different protocols communicates information from a read-only transponder, and another of the at least two different protocols communicates information with a read/write transponder.

7. A dual protocol transponder identification system comprising a modulated interrogation signal transmitter transmitting a modulated interrogation signal, receiver for a receiving a backscatter signal induced by said interrogation signal, and an analyzer for analyzing the backscatter signal, said analyzer operating in a first mode to determine the transponder's communication protocol, and in second mode to determine the unique identification number of the transponder, and wherein the modulation of the interrogation signal does not interfere with the determination of the unique identification number.

8. The system according to claim 7, where the analyzer's first mode is capable of identifying at least two different protocols of CMOS transponders.

9. The system according to claim 8, where one of the at least two different protocols is employed by a read only transponder, and another of the at least two different protocols is employed by a read/write transponder.

10. A dual protocol transponder identification system, for retrieving identifying information from a population of different types of backscatter transponders, each respective type having a distinct and incompatible protocol for communication, a first protocol employing a multibit digital communication of information from the transponder identification system to the transponder and a second protocol not defining a multibit digital communication of information from the transponder identification system the transponder, comprising: a transmitter for transmitting an interrogation signal, modulated with a signal for communicating with transponders according to the first protocol: a receiver for receiving a backscatter communication from the transponders: a control for controlling a modulation of the interrogation signal, a first set of circuitry for extracting from the backscatter communication a time-sequential series of digital data states: a second set of circuitry for determining from the time-sequential series of digital data states, the identifying information: and a common output, outputting the determined identification regardless of communication protocol, and suppressing spurious outputs nor representing a transponder, wherein the modulated interrogation signal does not interfer with the determination from the time-sequential series of digital data states of the identifying information for either protocol.

11. The system according to claim 10, wherein the second protocol comprises frequency shift keying of biphase encoded serial data bits identifying the transponder.

12. The system according to claim 10, wherein the first protocol comprises frequency shift keying of serial data bits, transmitted by the transponder in response to a modulation of said radio-frequency interrogation signal emitter.

* * * * *